United States Patent
Sawamura et al.

(10) Patent No.: US 12,019,371 B2
(45) Date of Patent: Jun. 25, 2024

(54) PHOTOSENSITIVE COMPOSITION, FILM, COLOR FILTER, SOLID-STATE IMAGING ELEMENT, AND IMAGE DISPLAY DEVICE

(71) Applicant: FUJIFILM Corporation, Tokyo (JP)

(72) Inventors: Yasuhiro Sawamura, Haibara-gun (JP); Masaomi Makino, Haibara-gun (JP); Akio Mizuno, Haibara-gun (JP); Yushi Kaneko, Haibara-gun (JP); Hiroaki Idei, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 642 days.

(21) Appl. No.: 17/110,934

(22) Filed: Dec. 3, 2020

(65) Prior Publication Data

US 2021/0088902 A1  Mar. 25, 2021

Related U.S. Application Data

(63) Continuation of application No. PCT/JP2019/023960, filed on Jun. 17, 2019.

(30) Foreign Application Priority Data

| Jun. 27, 2018 | (JP) | 2018-121432 |
| Oct. 15, 2018 | (JP) | 2018-194481 |
| May 24, 2019 | (JP) | 2019-097287 |

(51) Int. Cl.
| C08F 222/10 | (2006.01) |
| C08K 5/00 | (2006.01) |
| G02B 5/20 | (2006.01) |
| G03F 7/00 | (2006.01) |
| G03F 7/031 | (2006.01) |

(52) U.S. Cl.
CPC ........ *G03F 7/031* (2013.01); *C08F 222/1006* (2013.01); *C08K 5/0041* (2013.01); *G02B 5/20* (2013.01); *G03F 7/0007* (2013.01); *C09K 2323/00* (2020.08); *C09K 2323/03* (2020.08)

(58) Field of Classification Search
CPC .. C08F 222/1006; G03F 7/031; G03F 7/0007; G03F 7/105; G03F 7/085; C08K 5/0041; C09K 2323/00; C09K 2323/03; G02B 5/20
USPC .................................................. 428/1.1, 1.3
See application file for complete search history.

(56) References Cited

U.S. PATENT DOCUMENTS

2017/0363959 A1* 12/2017 Takahashi ................ G02B 5/20

FOREIGN PATENT DOCUMENTS

| CN | 107430340 A | 12/2017 | |
| JP | 2003-081972 A | 3/2003 | |
| JP | 2003081972 A * | 3/2003 | |
| JP | 2012-141429 A | 7/2012 | |
| JP | 2014-134712 A | 7/2014 | |
| JP | 2015-045736 A | 3/2015 | |
| JP | 2015045736 A * | 3/2015 | ............. C09B 1/206 |
| JP | 2015-081932 A | 4/2015 | |
| JP | 2015-200775 A | 11/2015 | |
| TW | 201508416 A | 3/2015 | |
| WO | 2015/060228 A1 | 4/2015 | |

OTHER PUBLICATIONS

Decision of Rejection dated Apr. 14, 2023 from the Taiwan Patent Office in Application No. 108122403.
Office Action dated Jan. 11, 2023, in Taiwanese Application No. 108122403.
Office Action dated Dec. 14, 2021, issued by the Japanese Patent Office in Japanese application No. 2020-527416.
International Search Report dated Aug. 20, 2019, issued by the International Searching Authority in application No. PCT/JP2019/023960.
Written Opinion dated Aug. 20, 2019, issued by the International Searching Authority in application No. PCT/JP2019/023960.
International Preliminary Report on Patentability dated Dec. 29, 2020, issued by the International Bureau in application No. PCT/JP2019/023960.
Chinese Office Action issued Mar. 7, 2024 in Application No. 201980036848.0.

* cited by examiner

*Primary Examiner* — Ruiyun Zhang
(74) *Attorney, Agent, or Firm* — Sughrue Mion, PLLC

(57) ABSTRACT

Provided is a photosensitive composition including a pigment, a compound which is represented by Formula (1) ($A^1$-$L^1$-$Z^1$) and has 3000 L·$mol^{-1}$·$cm^{-1}$ or less of a maximum value of a molar light absorption coefficient in a wavelength range of 400 to 700 nm, a polymerizable compound, and an oxime-based photopolymerization initiator. In Formula (1), $A^1$ represents a group including an aromatic ring, $L^1$ represents a single bond or a divalent linking group, and $Z^1$ represents a group represented by Formula (Z1).

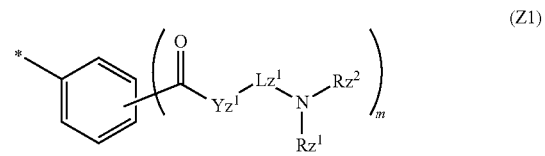

11 Claims, No Drawings

PHOTOSENSITIVE COMPOSITION, FILM, COLOR FILTER, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2019/023960 filed on Jun. 17, 2019, which claims priority under 35 U.S.C § 119(a) to Japanese Patent Application No. 2018-121432 filed on Jun. 27, 2018, Japanese Patent Application No. 2018-194481 filed on Oct. 15, 2018, and Japanese Patent Application No. 2019-097287 filed on May 24, 2019. Each of the above application(s) is hereby expressly incorporated by reference, in its entirety, into the present application.

BACKGROUND OF THE INVENTION

1. Field of the Invention

The present invention relates to a photosensitive composition including a pigment.

The present invention further relates to a film using the photosensitive composition, a color filter, a solid-state imaging element, and an image display device.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element.

The color filter has been produced using a photosensitive composition including a colorant and a polymerizable compound. In addition, in a case where a pigment is used as the colorant, the pigment is generally dispersed in the photosensitive composition using a dispersant or the like.

JP2003-081972A discloses an invention relating to a colored photosensitive composition which includes a pigment dispersion composition prepared by dispersing a predetermined triazine compound and a pigment in an organic solvent, a binder polymer having an acidic group, a polyfunctional monomer having two or more ethylenically unsaturated double bonds, and a photopolymerization initiator.

SUMMARY OF THE INVENTION

Further improvement in adhesiveness with a support is desired for a film formed by using the photosensitive composition. In JP2003-081972A, dispersion stability of the composition after dispersing the pigment is studied, but adhesiveness with the support is not studied at all.

Therefore, an object of the present invention is to provide a photosensitive composition capable of forming a film having excellent adhesiveness with a support. Another object of the present invention is to provide a film using the photosensitive composition, a color filter, a solid-state imaging element, and an image display device.

According to the studies conducted by the present inventors, it has been found that the above-described object can be achieved by adopting the following configuration, thereby leading to the completion of the present invention. Therefore, the present invention provides the following.

<1> A photosensitive composition comprising:

a pigment;

a compound which is a compound represented by Formula (1) and has 3000 L·mol$^{-1}$·cm$^{-1}$ or less of a maximum value of a molar light absorption coefficient in a wavelength range of 400 to 700 nm;

a polymerizable compound; and an oxime-based photopolymerization initiator,

$$A^1\text{-}L^1\text{-}Z^1 \quad (1)$$

in Formula (1), $A^1$ represents a group including an aromatic ring, $L^1$ represents a single bond or a divalent linking group, and $Z^1$ represents a group represented by Formula (Z1),

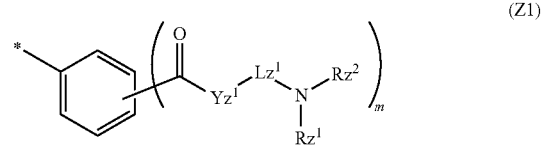

(Z1)

in the formula, * represents a bonding hand, $Yz^1$ represents $-N(Ry^1)-$ or $-O-$, in which $Ry^1$ represents a hydrogen atom, an alkyl group, an alkenyl group, an alkynyl group, or an aryl group, $Lz^1$ represents a divalent linking group, $Rz^1$ and $Rz^2$ each independently represent a hydrogen atom, an alkyl group, an alkenyl group, an alkynyl group, or an aryl group, in which $Rz^1$ and $Rz^2$ may be bonded to each other through a divalent group to form a ring, and m represents an integer of 1 to 5.

<2> The photosensitive composition according to <1>, in which the compound represented by Formula (1) has 1000 L·mol$^{-1}$·cm$^{-1}$ or less of the maximum value of the molar light absorption coefficient in the wavelength range of 400 to 700 nm.

<3> The photosensitive composition according to <1> or <2>, in which the compound represented by Formula (1) is a compound represented by Formula (2),

$$A^1\text{-}X^1\text{-}L^2\text{-}X^2\text{-}Z^1 \quad (2)$$

in Formula (2), $A^1$ represents a group including an aromatic ring, $X^1$ and $X^2$ each independently represent a single bond, $-O-$, $-N(R^1)-$, $-NHCO-$, $-CONH-$, $-OCO-$, $-COO-$, $-CO-$, $-SO_2NH-$, or $-SO_2-$, in which $R^1$ represents a hydrogen atom, an alkyl group, an alkenyl group, an alkynyl group, or an aryl group, $L^2$ represents a single bond or a divalent linking group, and $Z^1$ represents the group represented by Formula (Z1).

<4> The photosensitive composition according to any one of <1> to <3>, in which the group represented by Formula (Z1) is a group represented by Formula (Z2),

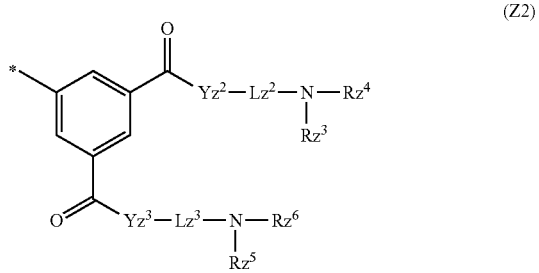

(Z2)

in the formula, * represents a bonding hand, $Yz^2$ and $Yz^3$ each independently represent —N($Ry^2$)— or —O—, in which $Ry^2$ represents a hydrogen atom, an alkyl group, an alkenyl group, an alkynyl group, or an aryl group, $Lz^2$ and $Lz^3$ each independently represent a divalent linking group, and $Rz^3$ to $Rz^6$ each independently represent a hydrogen atom, an alkyl group, an alkenyl group, an alkynyl group, or an aryl group, and $Rz^3$ and $Rz^4$, and $Rz^5$ and $Rz^6$ may be respectively bonded to each other through a divalent group to form a ring.

<5> The photosensitive composition according to any one of <1> to <4>, in which $A^1$ is a group represented by Formula (A1),

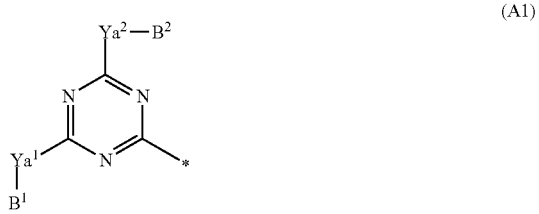

(A1)

in the formula, * represents a bonding hand, $Ya^1$ and $Ya^2$ each independently represent —N($Ra^1$)— or —O—, in which $Ra^1$ represents a hydrogen atom, an alkyl group, an alkenyl group, an alkynyl group, or an aryl group, and $B^1$ and $B^2$ each independently represent a hydrogen atom or a substituent.

<6> The photosensitive composition according to any one of <1> to <5>, in which the pigment is a chromatic pigment.

<7> The photosensitive composition according to any one of <1> to <5>, in which the pigment is at least one selected from a red pigment, a yellow pigment, a green pigment, and a blue pigment.

<8> The photosensitive composition according to any one of <1> to <7>, further comprising:

a resin having an acid group.

<9> A film obtained from the photosensitive composition according to any one of <1> to <8>.

<10> A color filter obtained from the photosensitive composition according to any one of <1> to <8>.

<11> A solid-state imaging element comprising the film according to <9>.

<12> An image display device comprising the film according to <9>.

According to the present invention, it is possible to provide a photosensitive composition capable of forming a film having excellent adhesiveness with a support. It is also possible is to provide a film using the photosensitive composition, a color filter, a solid-state imaging element, and an image display device.

DESCRIPTION OF THE PREFERRED EMBODIMENTS

Hereinafter, the contents of the present invention will be described in detail.

In the present specification, "to" is used to refer to a meaning including numerical values denoted before and after "to" as a lower limit value and an upper limit value.

In the present specification, unless specified as a substituted group or as an unsubstituted group, a group (atomic group) denotes not only a group (atomic group) having no substituent but also a group (atomic group) having a substituent. For example, an "alkyl group" includes not only an alkyl group having no substituent (unsubstituted alkyl group), but also an alkyl group having a substituent (substituted alkyl group).

In the present specification, unless specified otherwise, "exposure" denotes not only exposure using light but also drawing using a corpuscular beam such as an electron beam or an ion beam. In addition, examples of light used for the exposure include actinic rays or radiation such as a bright line spectrum of a mercury lamp, far ultraviolet rays typified by an excimer laser, extreme ultraviolet rays (EUV light), X-rays, or electron beams.

In the present specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In the present specification, in a structural formula, Me represents a methyl group, Et represents an ethyl group, Bu represents a butyl group, and Ph represents a phenyl group.

In the present specification, a weight-average molecular weight and a number-average molecular weight are values in terms of polystyrene through measurement by a gel permeation chromatography (GPC) method.

In the present specification, near-infrared rays denote light having a wavelength in a range of 700 to 2500 nm.

In the present specification, the total solid content refers to a total mass of components other than a solvent from all the components of a composition.

In the present specification, a pigment means a compound which is hardly soluble in a solvent. For example, as the pigment, both of the solubility in 100 g of water at 23° C. and 100 g of propylene glycol monomethyl ether acetate at 23° C. is preferably 0.1 g or less and more preferably 0.01 g or less.

In the present specification, the term "step" is not only an independent step, but also includes a step which is not clearly distinguished from other steps in a case where an intended action of the step is obtained.

<Photosensitive Composition>

The photosensitive composition according to an embodiment of the present invention includes a pigment, a compound which is a compound (hereinafter, also referred to as a compound (1)) represented by Formula (1) described later and has 3000 L·mol$^{-1}$·cm$^{-1}$ or less of a maximum value of a molar light absorption coefficient in a wavelength range of 400 to 700 nm, a polymerizable compound, and an oxime-based photopolymerization initiator.

According to the photosensitive composition according to the embodiment of the present invention, it is possible to provide a photosensitive composition capable of forming a film having excellent adhesiveness with a support. The reason for obtaining such an effect is assumed as follows.

The photosensitive composition according to the embodiment of the present invention includes an oxime-based photopolymerization initiator as a photopolymerization initiator. The oxime-based photopolymerization initiator efficiently generates active radicals by light irradiation, and efficiently polymerizes the polymerizable compound. However, since the oxime-based photopolymerization initiator is generally a highly photodegradable compound, it is assumed that, even in a case where the photosensitive composition is stored or the like, decomposition reaction of the oxime-based photopolymerization initiator proceeds and the performance of the oxime-based photopolymerization initiator is deactivated. In particular, in a case where the photosensitive composition includes, in addition to a pigment, a compound having absorption in a wavelength range of 400 to 700 nm, it is assumed that such a compound acts as a sensitizer, and the performance of the oxime-based photopolymerization initiator is more easily deactivated. By using, as the compound (1), a compound which has 3000 L·mol$^{-1}$·cm$^{-1}$ or less of a maximum value of a molar light absorption coefficient in a wavelength range of 400 to 700 nm, it is assumed that the photosensitive composition according to the embodiment of the present invention can suppress the performance deactivation of the oxime-based photopolymerization initiator. In addition, since the compound (1) has a group represented by Formula (Z1) described later, it is assumed that the inhibition of the polymerization reaction of the polymerizable compound due to influence of oxygen or the like can be suppressed. The detailed mechanism is not clear, but is assumed as follows. Radical active species generated from the photopolymerization initiator by exposure may be quenched by oxygen to be a polymerization-inactive peroxy radical, but even in a case where the peroxy radical is generated, a hydrogen atom on a carbon at the α-position of a nitrogen atom of Formula (Z1) described later is abstracted by the peroxy radical so that the peroxy radical is to be the radical active species. Accordingly, by including the compound (1), it is assumed that the inhibition of the polymerization reaction of the polymerizable compound due to influence of oxygen or the like can be suppressed. Therefore, a film can be sufficiently cured to a deep portion (support side of the film) of the film by exposure, and a film having excellent adhesiveness can be formed.

In addition, in the photosensitive composition according to the embodiment of the present invention, by including the compound (1), dispersibility of the pigment in the photosensitive composition can be improved, and the photosensitive composition can have excellent storage stability. Furthermore, the photosensitive composition according to the embodiment of the present invention has excellent curability, and in a case where a plurality of pixels are formed by using the photosensitive composition according to the embodiment of the present invention, color mixing between adjacent pixels can be suppressed.

The photosensitive composition according to the embodiment of the present invention can be used for a color filter, a near-infrared transmission filter, a near-infrared cut filter, a black matrix, a light-shielding film, a refractive index adjusting film, a microlens, and the like.

examples of the color filter include a filter having a colored pixel which transmits light having a specific wavelength, and a filter having at least one colored pixel selected from a red pixel, a blue pixel, a green pixel, a yellow pixel, a cyan pixel, and a magenta pixel is preferable. The color filter can be formed using a photosensitive composition including a chromatic pigment.

Examples of the near-infrared cut filter include a filter having a maximum absorption wavelength in a wavelength range of 700 to 1800 nm. As the near-infrared cut filter, a filter having a maximum absorption wavelength in a wavelength range of 700 to 1300 nm is preferable, and a filter having a maximum absorption wavelength in a wavelength range of 700 to 1000 nm is more preferable. In addition, in the near-infrared cut filter, a transmittance of in the entire wavelength range of 400 to 650 nm is preferably 70% or more, more preferably 80% or more, and still more preferably 90% or more. In addition, the transmittance at at least one point in a wavelength range of 700 to 1800 nm is preferably 20% or less. In addition, in the near-infrared cut filter, absorbance Amax/absorbance A550, which is a ratio of an absorbance Amax at a maximum absorption wavelength to an absorbance A550 at a wavelength of 550 nm, is preferably 20 to 500, more preferably 50 to 500, still more preferably 70 to 450, and particularly preferably 100 to 400. The near-infrared cut filter can be formed using a photosensitive composition including a near-infrared absorbing pigment.

The near-infrared transmission filter is a filter which transmits at least a part of near-infrared rays. The near-infrared transmission filter may be a filter (transparent film) which transmits both visible light and near-infrared ray, or may be a filter which shields at least a part of visible light and transmits at least a part of near-infrared rays. Examples of the near-infrared transmission filter include filters satisfying spectral characteristics in which the maximum value of a transmittance in a wavelength range of 400 to 640 nm is 20% or less (preferably 15% or less and more preferably 10% or less) and the minimum value of a transmittance in a wavelength range of 1100 to 1300 nm is 70% or more (preferably 75% or more and more preferably 80% or more). The near-infrared transmission filter is preferably a filter which satisfies any one of the following spectral characteristics (1) to (4).

(1): filter in which the maximum value of a transmittance in a wavelength range of 400 to 640 nm is 20% or less (preferably 15% or less and more preferably 10% or less) and the minimum value of a transmittance in a wavelength range of 800 to 1300 nm is 70% or more (preferably 75% or more and more preferably 80% or more).

(2): filter in which the maximum value of a transmittance in a wavelength range of 400 to 750 nm is 20% or less (preferably 15% or less and more preferably 10% or less) and the minimum value of a transmittance in a wavelength range of 900 to 1300 nm is 70% or more (preferably 75% or more and more preferably 80% or more).

(3): filter in which the maximum value of a transmittance in a wavelength range of 400 to 830 nm is 20% or less (preferably 15% or less and more preferably 10% or less) and the minimum value of a transmittance in a wavelength range of 1000 to 1300 nm is 70% or more (preferably 75% or more and more preferably 80% or more).

(4): filter in which the maximum value of a transmittance in a wavelength range of 400 to 950 nm is 20% or less (preferably 15% or less and more preferably 10% or less) and the minimum value of a transmittance in a wavelength range of 1100 to 1300 nm is 70% or more (preferably 75% or more and more preferably 80% or more).

The photosensitive composition according to the embodiment of the present invention can be preferably used as a photosensitive composition for a color filter. Specifically, the photosensitive composition according to the embodiment of the present invention can be preferably used as a photosensitive composition for forming a pixel of a color filter, and can be more preferably used as a photosensitive composition for forming a pixel of a color filter used in a solid-state imaging element.

In addition, the photosensitive composition according to the embodiment of the present invention can also be used as a composition for forming a color microlens. Examples of a method for manufacturing the color microlens include the method described in JP2018-010162A.

Hereinafter, the respective components used in the photosensitive composition according to the embodiment of the present invention will be described.

<<Pigment>>

The photosensitive composition according to the embodiment of the present invention contains a pigment. Examples of the pigment include a white pigment, a black pigment, a chromatic pigment, and a near-infrared absorbing pigment. In the present invention, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, as the pigment, a pigment having a maximum absorption wavelength in a wavelength range of 400 to 2000 nm is preferable, and a pigment having a maximum absorption wavelength in a wavelength range of 400 to 700 nm is more preferable. In addition, in a case of using a pigment (preferably a chromatic pigment) having a maximum absorption wavelength in a wavelength range of 400 to 700 nm, the photosensitive composition according to the embodiment of the present invention can be preferably used as a photosensitive composition for forming a colored layer in a color filter. Examples of the colored layer include a red-colored layer, a green-colored layer, a blue-colored layer, a magenta-colored layer, a cyan-colored layer, and a yellow-colored layer.

The average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the photosensitive composition is good. In the present invention, the primary particle diameter of the pigment can be determined from an image obtained by observing primary particles of the pigment using a transmission electron microscope. Specifically, a projected area of the primary particles of the pigment is determined, and the corresponding circle diameter is calculated as the primary particle diameter of the pigment. In addition, the average primary particle diameter in the present invention is the arithmetic average of the primary particle diameters with respect to 400 primary particles of the pigment. In addition, the primary particle of the pigment refers to a particle which is independent without aggregation.

(Chromatic Pigment)

The chromatic pigment is not particularly limited, and a known chromatic pigment can be used. Examples of the chromatic pigment include a pigment having a maximum absorption wavelength in a wavelength range of 400 to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and 231 (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C. I. Pigment Green 7, 10, 36, 37, 58, 59, 62, and 63 (all of which are green pigments);

C. I. Pigment Violet 1, 19, 23, 27, 32, 37, and 42 (all of which are violet pigments); and C. I. Pigment Blue 1, 2, 15, 15:1, 15:2, 15:3, 15:4, 15:6, 16, 22, 60, 64, 66, 79, and 80 (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A. In addition, a compound described in CN2010-6909027A, a phthalocyanine compound having phosphoric acid ester as a ligand, a compound described in JP2019-038958A, and the like can also be used as the green pigment.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

In addition, a pigment described in JP2017-201003A and a pigment described in JP2017-197719A can be used as the yellow pigment. In addition, as the yellow pigment, a metal azo pigment which includes at least one kind of an anion selected from an azo compound represented by Formula (I) or an azo compound having a tautomeric structure of the azo compound represented by Formula (I), two or more kinds of metal ions, and a melamine compound can be used.

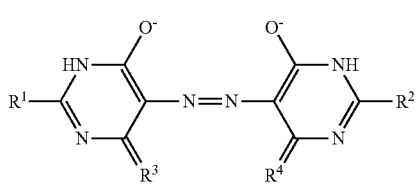

(I)

In the formula, $R^1$ and $R^2$ each independently represent —OH or —NR$^5$R$^6$, $R^3$ and $R^4$ each independently represent =O or =NR$^7$, and $R^5$ to $R^7$ each independently represent a hydrogen atom or an alkyl group. The alkyl group represented by $R^5$ to $R^7$ preferably has 1 to 10 carbon atoms, more preferably has 1 to 6 carbon atoms, and still more preferably has 1 to 4 carbon atoms. The alkyl group may be any of linear, branched, and cyclic forms, and is preferably linear or branched and more preferably linear. The alkyl group may have a substituent. The substituent is preferably a halogen atom, a hydroxy group, an alkoxy group, a cyano group, or an amino group.

The details of the metal azo pigment can be found in paragraph Nos. 0011 to 0062 and 0137 to 0276 of JP2017-171912A, paragraph Nos. 0010 to 0062 and 0138 to 0295 of JP2017-171913A, paragraph Nos. 0011 to 0062 and 0139 to 0190 of JP2017-171914A, and paragraph Nos. 0010 to 0065 and 0142 to 0222 of JP2017-171915A, the contents of which are incorporated herein by reference.

A diketopyrrolopyrrole-based pigment described in JP2017-201384A, in which the structure has at least one substituted bromine atom, a diketopyrrolopyrrole-based pigment described in paragraph Nos. 0016 to 0022 of JP6248838, and the like can also be used as the red pigment. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

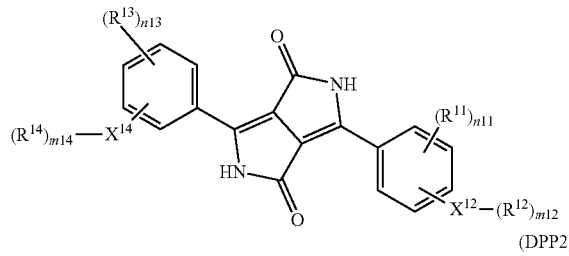

(DPP1)

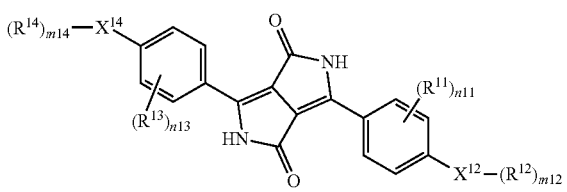

(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Examples of the substituent represented by $R^{11}$ and $R^{13}$ include the groups in a substituent T described later, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present invention, the chromatic pigment may be used in combination of two or more kinds thereof. In addition, in a case where the chromatic pigment is used in combination of two or more kinds thereof, the combination of two or more chromatic pigments may form black. Examples of such a combination include the following aspects (1) to (7). In a case where two or more chromatic pigments are included in the photosensitive composition and the combination of two or more chromatic pigments forms black, the photosensitive composition according to the embodiment of the present invention can be preferably used as the near-infrared transmission filter.

(1) aspect in which a red pigment and a blue pigment are contained.
(2) aspect in which a red pigment, a blue pigment, and a yellow pigment are contained.
(3) aspect in which a red pigment, a blue pigment, a yellow pigment, and a violet pigment are contained.
(4) aspect in which a red pigment, a blue pigment, a yellow pigment, a violet pigment, and a green pigment are contained.
(5) aspect in which a red pigment, a blue pigment, a yellow pigment, and a green pigment are contained.
(6) aspect in which a red pigment, a blue pigment, and a green pigment are contained.
(7) aspect in which a yellow pigment and a violet pigment are contained.

(White Pigment)

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published in Jun. 25, 1991, published by Shuppan Co., Ltd." can also be used.

The white pigment is not limited to a compound formed of a single inorganic substance, and may be particles combined with other materials. For example, it is preferable to use a particle having a pore or other materials therein, a particle having a number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

(Black Pigment)

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the contents of which are incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

(Near-Infrared Absorbing Pigment)

The near-infrared absorbing pigment is preferably an organic pigment. In addition, the near-infrared absorbing pigment preferably has a maximum absorption wavelength in a wavelength range of more than 700 nm and 1400 nm or less. In addition, the maximum absorption wavelength of the near-infrared absorbing pigment is preferably 1200 nm or less, more preferably 1000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximum absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared rays shielding property can be obtained. In the present invention, the maximum absorption wavelength of the near-infrared absorbing pigment and values of absorbance at each wavelength are values obtained from an absorption spectrum of a film formed by using a photosensitive composition including the near-infrared absorbing pigment.

The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from a pyrrolopyrrole compound, a squarylium compound, a cyanine compound, a phthalocyanine compound, or a naphthalocyanine compound is preferable, and a pyrrolopyrrole compound or a squarylium compound is more preferable, and a pyrrolopyrrole compound is particularly preferable.

The content of the pigment in the total solid content of the photosensitive composition is preferably 5% by mass or more, more preferably 10% by mass or more, still more preferably 20% by mass or more, and even more preferably 30% by mass or more, and particularly preferably 40% by mass or more. The upper limit is preferably 80% by mass or less, more preferably 70% by mass or less, and still more preferably 60% by mass or less.

<<Dye>>

The photosensitive composition according to the embodiment of the present invention can contain a dye. The dye is not particularly limited and a known dye can be used. The dye may be a chromatic dye or may be a near-infrared absorbing dye. Examples of the chromatic dye include a pyrazoleazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. In addition, the thiazole compound described in JP2012-158649A, the azo compound described in JP2011-184493A, or the azo compound described in JP2011-145540A can also be used. In addition, as yellow dyes, the quinophthalone compounds described in paragraph Nos. 0011 to 0034 of JP2013-054339A, or the quinophthalone compounds described in paragraph Nos. 0013 to 0058 of JP2014-026228A can be used. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. In addition, the squarylium compounds described in JP2017-197437A, the squarylium compounds described in paragraph Nos. 0090 to 0107 of WO2017/213047A, the pyrrole ring-containing compounds described in paragraph Nos. 0019 to 0075 of JP2018-054760A, the pyrrole ring-containing compounds described in paragraph Nos. 0078 to 0082 of JP2018-040955A, the pyrrole ring-containing compounds described in paragraph Nos. 0043 to 0069 of JP2018-002773A, the squarylium compounds having an aromatic ring at the α-amide position described in paragraph Nos. 0024 to 0086 of JP2018-041047A, the amide-linked squarylium compounds described in JP2017-179131A, the compounds having a pyrrole bis-type squarylium skeleton or a croconium skeleton described in JP2017-141215A, the dihydrocarbazole bis-type squarylium compounds described in JP2017-082029, the asymmetric compounds described in paragraph Nos. 0027 to 0114 of JP2017-068120A, the pyrrole ring-containing compounds (carbazole type) described in JP2017-067963A, the phthalocyanine compounds described in JP6251530B, and the like can be used.

The content of the dye in the total solid content of the photosensitive composition is preferably 1% by mass or more, more preferably 5% by mass or more, and particularly preferably 10% by mass or more. The upper limit is not particularly limited, but is preferably 70% by mass or less, more preferably 65% by mass or less, and still more preferably 60% by mass or less.

In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the photosensitive composition according to the embodiment of the present invention does not substantially contain the dye. The case where the photosensitive composition according to the embodiment of the present invention does not substantially include the dye means that the content of the dye in the total solid content of the photosensitive composition according to the embodiment of the present invention is preferably 0.1% by mass or less, more preferably 0.05% by mass or less, and particularly preferably 0% by mass.

<<Compound (1)>>

The photosensitive composition according to the embodiment of the present invention contains a compound which is a compound (hereinafter, also referred to as a compound (1)) represented by Formula (1) described later and has 3000 L·mol$^{-1}$·cm$^{-1}$ or less of a maximum value of a molar light absorption coefficient in a wavelength range of 400 to 700 nm.

$$A^1-L^1-Z^1 \quad (1)$$

In Formula (1), $A^1$ represents a group including an aromatic ring, $L^1$ represents a single bond or a divalent linking group, and $Z^1$ represents a group represented by Formula (Z1).

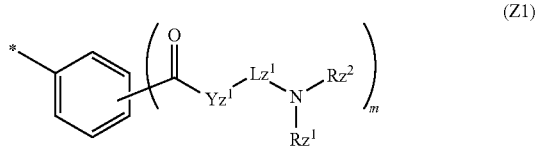

In the formula, * represents a bonding hand, $Yz^1$ represents $-N(Ry^1)-$ or $-O-$, in which $Ry^1$ represents a hydrogen atom, an alkyl group, an alkenyl group, an alkynyl group, or an aryl group, $Lz^1$ represents a divalent linking group, $Rz^1$ and $Rz^2$ each independently represent a hydrogen atom, an alkyl group, an alkenyl group, an alkynyl group, or an aryl group, in which $Rz^1$ and $Rz^2$ may be bonded to each other through a divalent group to form a ring, and m represents an integer of 1 to 5.

In Formula (1), $A^1$ represents a group including an aromatic ring. The aromatic ring may be an aromatic hydrocarbon ring or an aromatic heterocyclic ring. In addition, the aromatic ring may be monocyclic or a fused ring.

Examples of the group represented by $A^1$ include a group including an aromatic ring selected from a benzene ring, a naphthalene ring, a fluorene ring, a perylene ring, an imidazole ring, a pyrazole ring, an oxazole ring, a thiazole ring, an imidazoline ring, a pyridine ring, a triazole ring, an imidazoline ring, a pyrazine ring, a pyrimidine ring, a pyridazine ring, a quinoline ring, an isoquinoline ring, a quinoxaline ring, a quinazoline ring, a benzimidazole ring, a benzopyrazole ring, a benzoxazole ring, a benzothiazole ring, a benzotriazole ring, an indole ring, an isoindole ring, a triazine ring, a pyrrole ring, a carbazole ring, a benzimidazolinone ring, a phthalimide ring, a phthalocyanine ring, an anthraquinone ring, a diketopyrrolopyrrole ring, an isoindolinone ring, an isoindoline ring, and a quinacridone ring; and a group including a fused ring which includes these aromatic rings. The above-described fused ring may be an aromatic ring or a non-aromatic ring, but is preferably an aromatic ring.

In addition, the group represented by $A^1$ may be a group having only one aromatic ring or fused ring described above, but for the reason that, as the number of aromatic rings increases, pigment adsorbability is improved and storage stability of the composition is easily improved by π-π interaction, it is preferable to have two or more of these rings.

The group represented by $A^1$ may further have a substituent. Examples of the substituent include the substituent T described later.

The group represented by $A^1$ is preferably a group having a structure which easily interacts with the pigment included in the photosensitive composition or a structure similar to the pigment. According to this aspect, dispersibility of the pigment in the photosensitive composition can be enhanced, and storage stability of the photosensitive composition can be further enhanced. In addition, from the reason that the effects of the present invention are more easily obtained, the group represented by $A^1$ is preferably a group including an aromatic heterocyclic ring, more preferably a group including a nitrogen-containing aromatic heterocyclic ring, still more preferably a group including a triazine ring, and particularly preferably a group represented by Formula (A1).

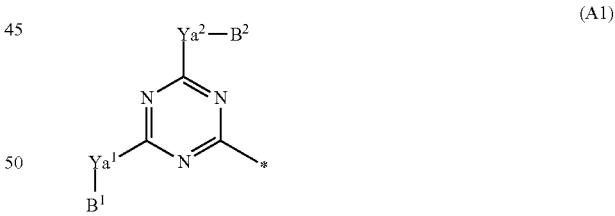

In the formula, * represents a bonding hand, $Ya^1$ and $Ya^2$ each independently represent $-N(Ra^1)-$ or $-O-$, in which Ra represents a hydrogen atom, an alkyl group, an alkenyl group, an alkynyl group, or an aryl group, and $B^1$ and $B^2$ each independently represent a hydrogen atom or a substituent.

In Formula (A1), $Ya^1$ and $Ya^2$ each independently represent $-N(Ra)-$ or $-O-$, and from the reason that the effects of the present invention are more easily obtained remarkably, $-N(Ra^1)-$ is more preferable.

$Ra^1$ represents a hydrogen atom, an alkyl group, an alkenyl group, an alkynyl group, or an aryl group, and a hydrogen atom or an alkyl group is preferable and a hydrogen atom is more preferable.

The alkyl group represented by $Ra^1$ preferably has 1 to 20 carbon atoms, more preferably has 1 to 15 carbon atoms, and still more preferably has 1 to 8 carbon atoms. The alkyl group may be any of linear, branched, and cyclic forms, and is preferably linear or branched and more preferably linear. The alkyl group represented by $Ra^1$ may further have a substituent. Examples of the substituent include the substituent T described later.

The alkenyl group represented by $Ra^1$ preferably has 2 to 20 carbon atoms, more preferably has 2 to 12 carbon atoms, and still more preferably has 2 to 8 carbon atoms. The alkenyl group may be any of linear, branched, and cyclic forms, and is preferably linear or branched and more preferably linear. The alkenyl group represented by $Ra^1$ may further have a substituent. Examples of the substituent include the substituent T described later.

The alkynyl group represented by $Ra^1$ preferably has 2 to 40 carbon atoms, more preferably has 2 to 30 carbon atoms, and still more preferably has 2 to 25 carbon atoms. The alkynyl group may be any of linear, branched, and cyclic forms, and is preferably linear or branched and more preferably linear. The alkynyl group represented by $Ra^1$ may further have a substituent. Examples of the substituent include the substituent T described later.

The aryl group represented by $Ra^1$ preferably has 6 to 30 carbon atoms, more preferably has 6 to 20 carbon atoms, and still more preferably has 6 to 12 carbon atoms. The aryl group represented by $Ra^1$ may further have a substituent. Examples of the substituent include the substituent T described later.

In Formula (A1), $B^1$ and $B^2$ each independently represent a hydrogen atom or a substituent. Examples of the substituent include the substituent T described later, and an alkyl group, an aryl group, or a heterocyclic group is preferable, an aryl group or a heterocyclic group is more preferable, and an aryl group is still more preferable from the reason that pigment adsorbability is enhanced and storage stability of the composition is easily improved. In addition, from the reason that color unevenness can be more easily suppressed, at least one of $B^1$ and $B^2$ is also preferably a heterocyclic group. The heterocyclic group is preferably a nitrogen-containing heterocyclic group and more preferably a benzimidazolone group.

The alkyl group, aryl group, and heterocyclic group represented by $B^1$ and $B^2$ may further have a substituent. Examples of the further substituent include an alkyl group (preferably an alkyl group having 1 to 30 carbon atoms), a fluoroalkyl group (preferably a fluoroalkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably an acyl group having 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfonyl group (preferably an alkylsulfonyl group having 1 to 30 carbon atoms), an arylsulfonyl group (preferably an arylsulfonyl group having 6 to 30 carbon atoms), a heteroarylsulfonyl group (preferably a heteroarylsulfonyl group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a heteroarylsulfinyl group (preferably a heteroarylsulfinyl group having 1 to 30 carbon atoms), a ureido group (preferably a ureido group having 1 to 30 carbon atoms), a phosphoric acid amide group (preferably a phosphoric acid amide group having 1 to 30 carbon atoms), a hydroxy group, a carboxyl group, a sulfo group, a phosphoric acid group, a mercapto group, a halogen atom, a cyano group, an alkylsulfino group, an arylsulfino group, a hydrazino group, and an imino group, and an alkyl group, a fluoroalkyl group, an alkoxy group, an amino group, a halogen atom, an alkenyl group, a hydroxy group, an alkoxycarbonyl group, an acyloxy group, an acylamino group, or a nitro group is preferable.

It is also preferable that the alkyl group, aryl group, and heterocyclic group represented by $B^1$ and $B^2$ do not have the above-described further substituent.

(Substituent T)

Examples of a substituent T include a halogen atom, a cyano group, a nitro group, an alkyl group, an alkenyl group, an alkynyl group, an aryl group, a heterocyclic group, $-ORt^1$, $-CORt^1$, $-COORt^1$, $-OCORt^1$, $-NRt^1Rt^2$, $-NHCORt^1$, $-CONRtRt^2$, $-NHCONRt^1Rt^2$, $-NHCOORt^1$, $-SRt^1$, $-SO_2Rt^1$, $-SO_2ORt^1$, $-NHSO_2Rt^1$, and $-SO_2NRt^1Rt^2$. $Rt^1$ and $Rt^2$ each independently represent a hydrogen atom, an alkyl group, an alkenyl group, an alkynyl group, an aryl group, or a heteroaryl group. $Rt^1$ and $Rt^2$ may be bonded to each other to form a ring.

Examples of the halogen atom include a fluorine atom, a chlorine atom, a bromine atom, and an iodine atom.

The alkyl group preferably has 1 to 30 carbon atoms, more preferably has 1 to 15 carbon atoms, and still more preferably has 1 to 8 carbon atoms. The alkyl group may be any of linear, branched, and cyclic forms, and is preferably linear or branched and more preferably linear.

The alkenyl group preferably has 2 to 30 carbon atoms, more preferably has 2 to 12 carbon atoms, and particularly preferably has 2 to 8 carbon atoms. The alkenyl group may be any of linear, branched, and cyclic forms, and is preferably linear or branched and more preferably linear.

The alkynyl group preferably has 2 to 30 carbon atoms and more preferably has 2 to 25 carbon atoms. The alkynyl group may be any of linear, branched, and cyclic forms, and is preferably linear or branched and more preferably linear.

The aryl group preferably has 6 to 30 carbon atoms, more preferably has 6 to 20 carbon atoms, and still more preferably has 6 to 12 carbon atoms.

The heterocyclic group may be monocyclic or a fused ring. The heterocyclic group is preferably monocyclic or a fused ring having 2 to 4 fused rings. The number of heteroatoms constituting a ring of the heterocyclic group is preferably 1 to 3. The heteroatom constituting the ring of the heterocyclic group is preferably a nitrogen atom, an oxygen atom, or a sulfur atom. The number of carbon atoms constituting the ring of the heterocyclic group is preferably 3 to 30, more preferably 3 to 18, and more preferably 3 to 12.

The alkyl group, the alkenyl group, the alkynyl group, the aryl group, and the heterocyclic group may have a substituent or may be unsubstituted. Examples of the substituent include the substituents described in the substituent T.

Specific examples of $A^1$ include groups having the following structures. In the following structural formulae, Me represents a methyl group.

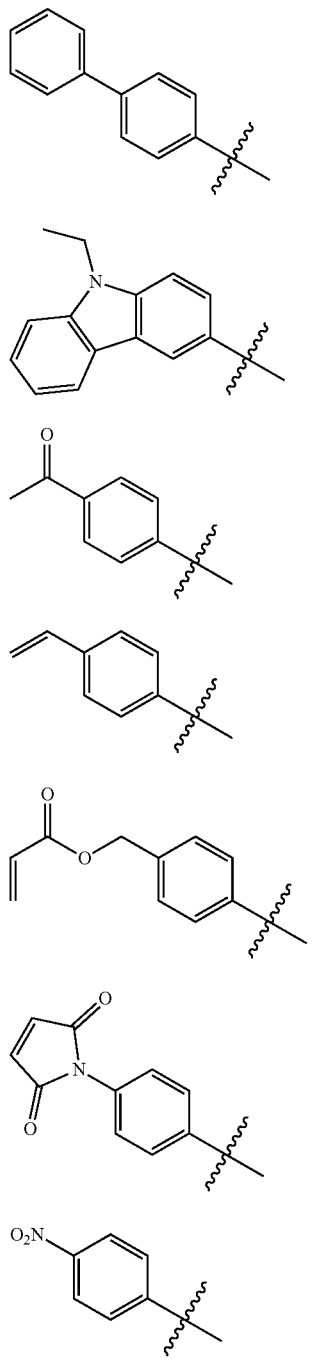

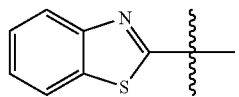

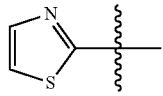

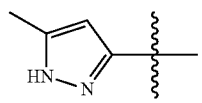

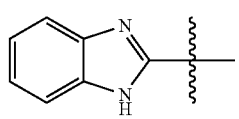

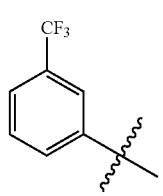

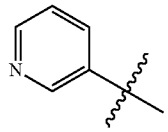

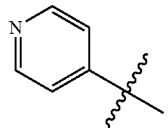

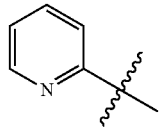

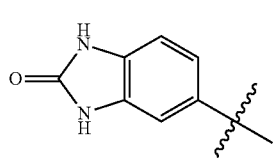

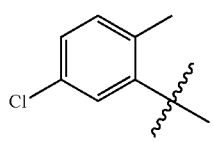

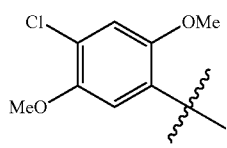

-continued
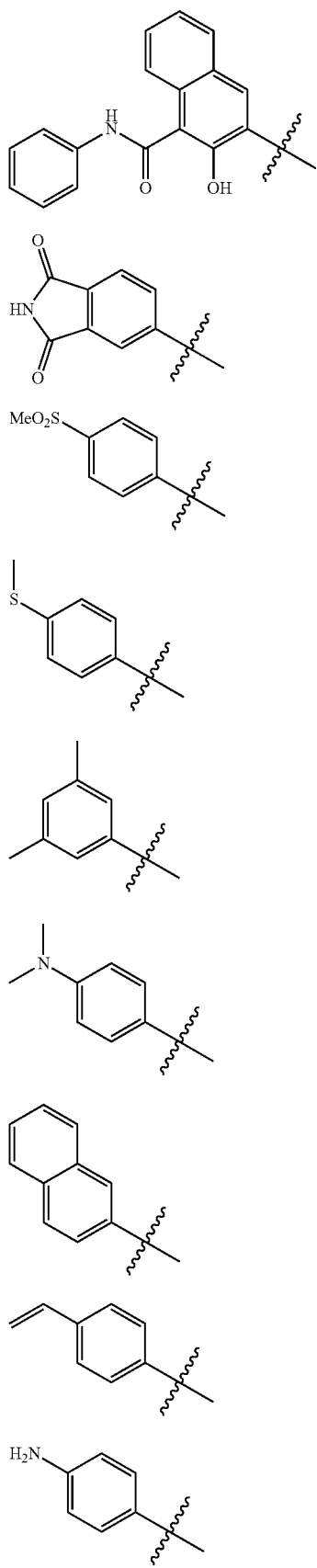
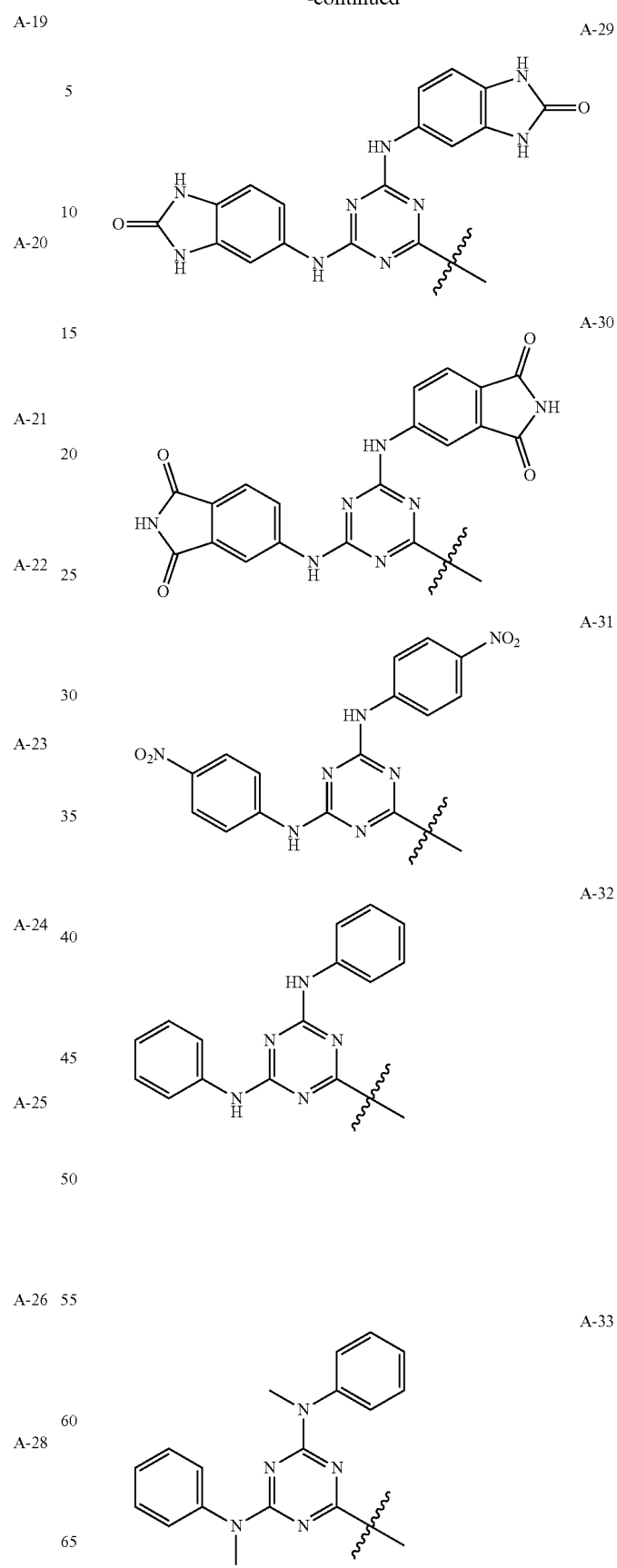

A-34
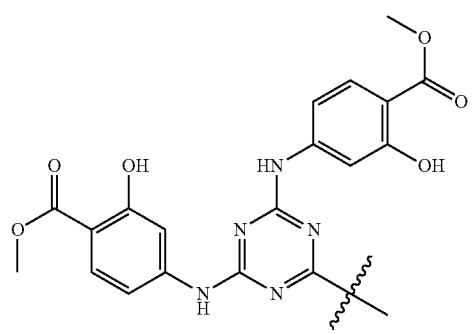
A-35
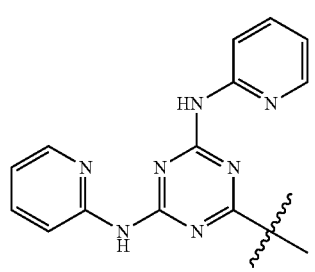
A-36
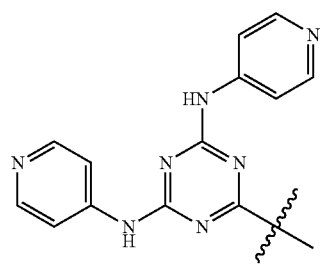
A-37
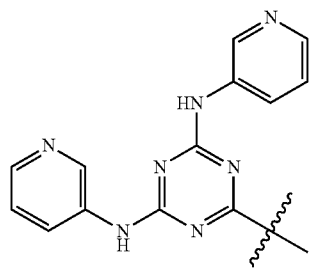
A-38
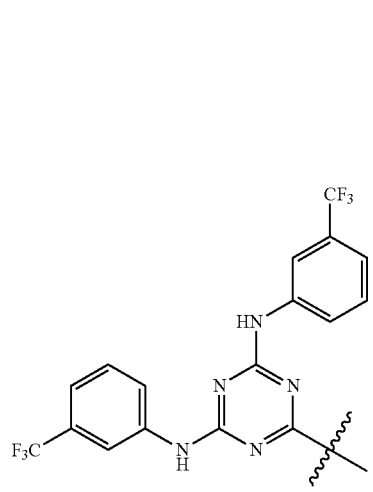
A-39
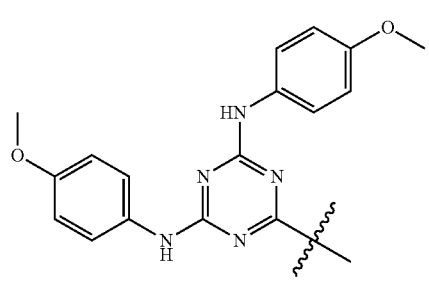
A-40
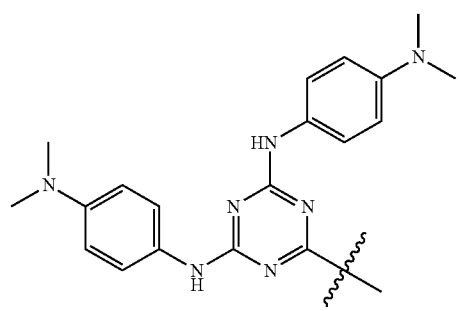
A-41
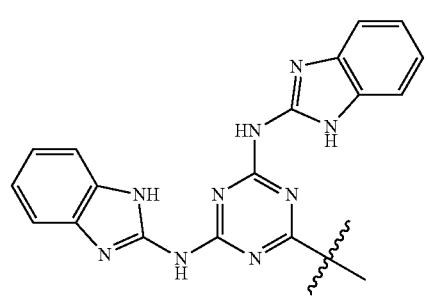
A-42
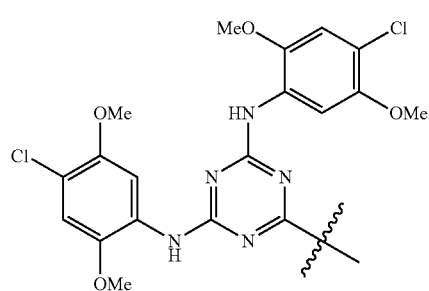
A-43
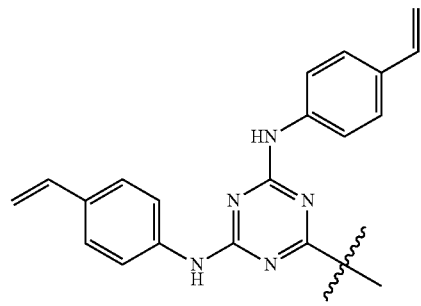

A-44
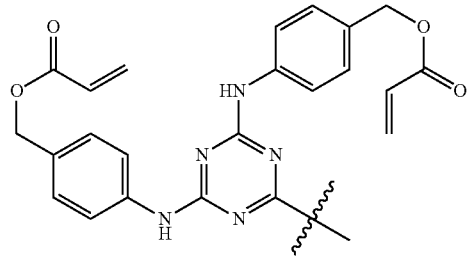
A-45
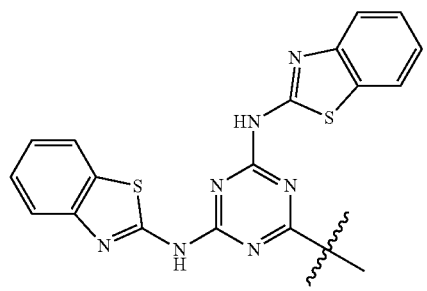
A-46
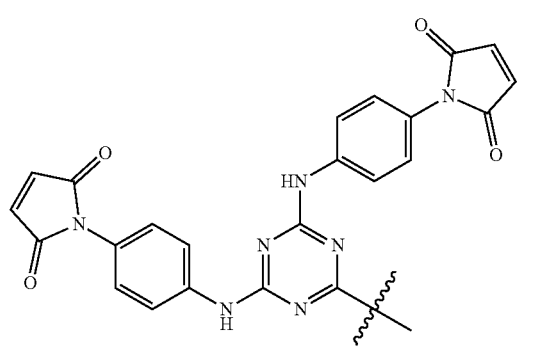
A-47
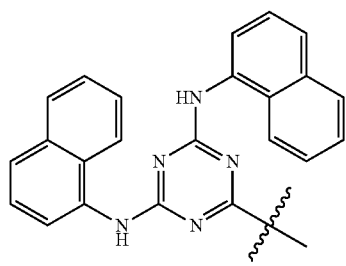
A-48
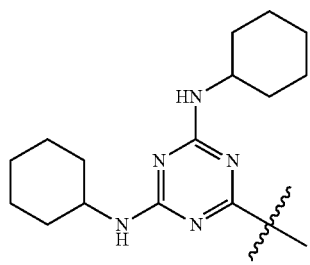
A-49
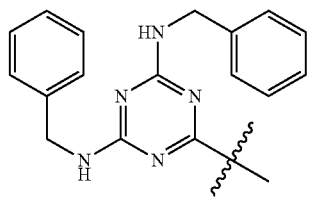
A-50
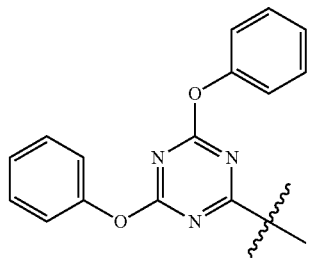
A-51
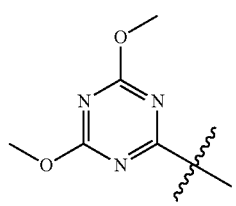
A-52
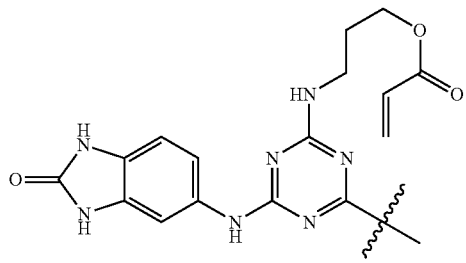
A-53
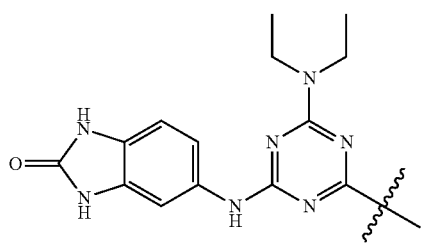
A-54
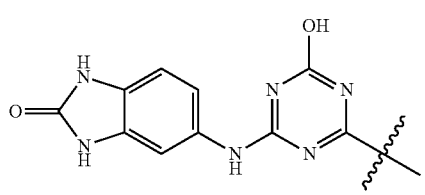

A-55
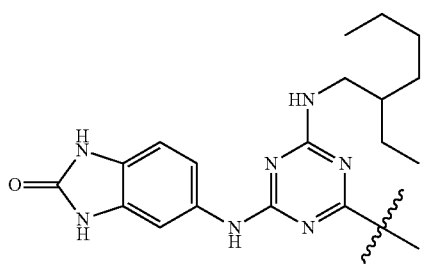
A-56
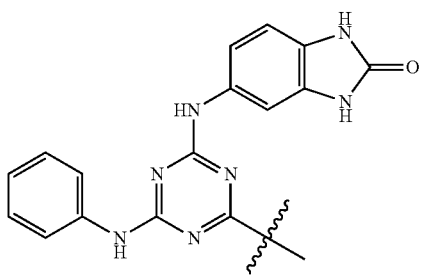
A-57
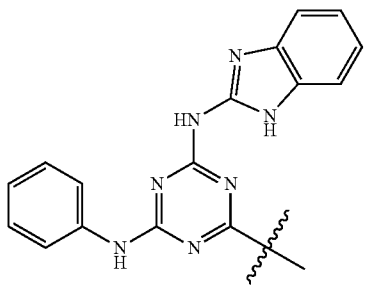
A-58
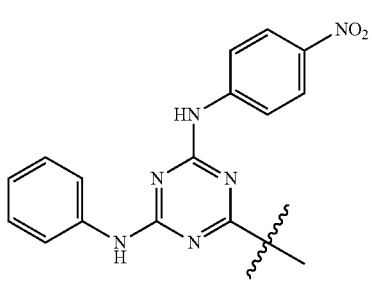
A-59
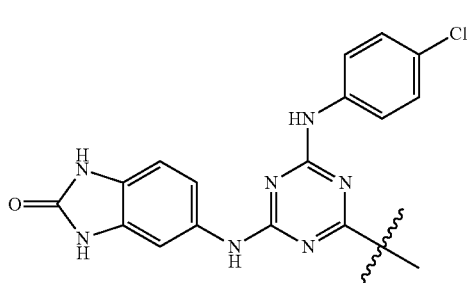
A-60
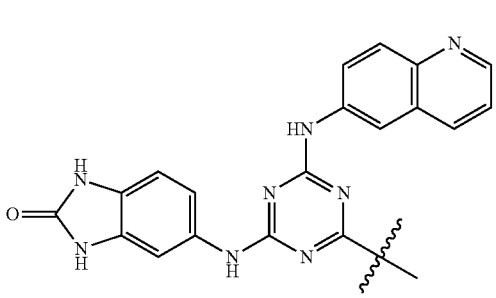
A-61
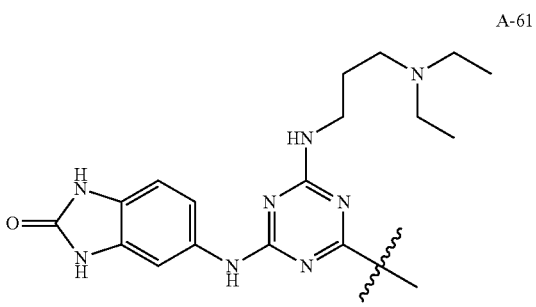
A-62
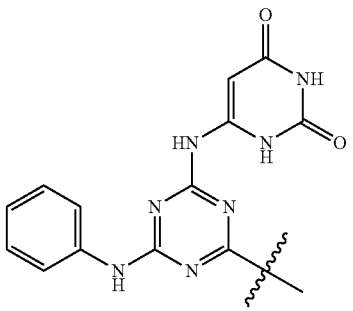
A-63
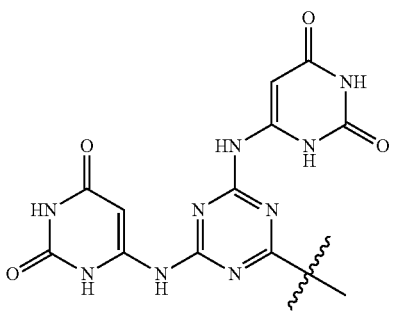

-continued

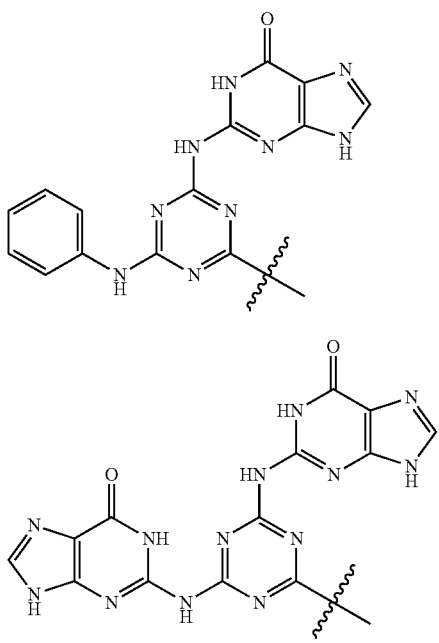

A-64

A-65

In Formula (1), L¹ represents a single bond or a divalent linking group, and a divalent linking group is preferable. Examples of the divalent linking group represented by L¹ include an alkylene group, an arylene group, a heterocyclic group, —O—, —N($R^{L1}$)—, —NHCO—, —CONH—, —OCO—, —COO—, —CO—, —SO₂NH—, —SO₂—, and a group formed by a combination of these groups. The alkylene group preferably has 1 to 30 carbon atoms, more preferably has 1 to 15 carbon atoms, still more preferably has 1 to 8 carbon atoms, and particularly preferably has 1 to 5 carbon atoms. The alkylene group may be any of linear, branched, and cyclic forms, and is preferably linear or branched and particularly preferably linear. The arylene group preferably has 6 to 30 carbon atoms and more preferably has 6 to 15 carbon atoms. The arylene group is preferably a phenylene group. $R^{L1}$ represents a hydrogen atom, an alkyl group, an alkenyl group, an alkynyl group, or an aryl group, and a hydrogen atom or an alkyl group is preferable and a hydrogen atom is more preferable. The preferred ranges of the alkyl group, alkenyl group, alkynyl group, and aryl group represented by $R^{L1}$ are the same as the ranges described as the preferred ranges of the alkyl group, alkenyl group, alkynyl group, and aryl group of Ra.

The divalent linking group represented by L¹ is preferably a group represented by Formula (L¹).

$$-L^{1A}-L^{1B}-L^{1C} \qquad (L1)$$

In the formula, $L^{1A}$ and $L^{1C}$ each independently represent —O—, —N($R^{L1}$)—, —NHCO—, —CONH—, —OCO—, —COO—, —CO—, —SO₂NH—, or —SO₂—, and $L^{1B}$ represents a single bond or a divalent linking group.

Examples of the divalent linking group represented by $L^{1B}$ include an alkylene group, an arylene group, a group in which an alkylene group and an arylene group are bonded to each other through a single bond, —O—, —N(R')—, —NHCO—, —CONH—, —OCO—, —COO—, —CO—, —SO₂NH—, —SO₂—, or a group formed by a combination of these groups, and a group in which alkylene groups or arylene groups are bonded to each other through —O—, —N($R^{L1}$)—, —NHCO—, —CONH—, —OCO—, —COO—, —CO—, —SO₂NH—, —SO₂—, or a group formed by a combination of these groups.

Specific examples of L include groups having the following structures.

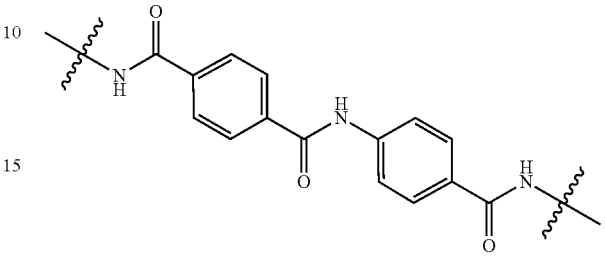

L-1

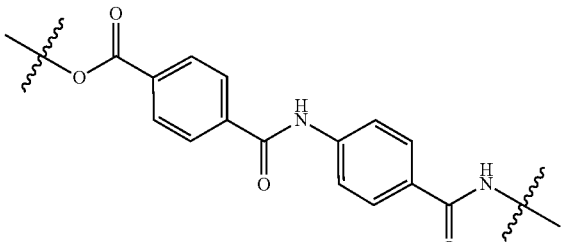

L-2

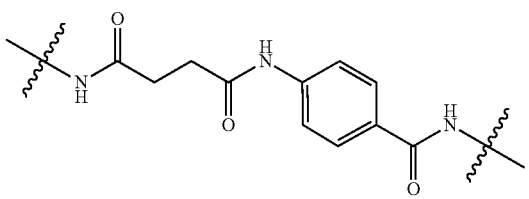

L-3

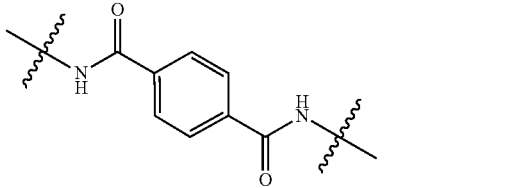

L-4

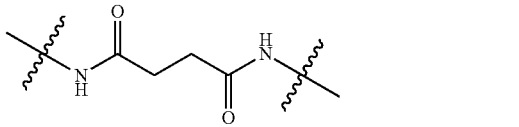

L-5

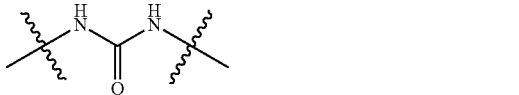

L-6

L-7

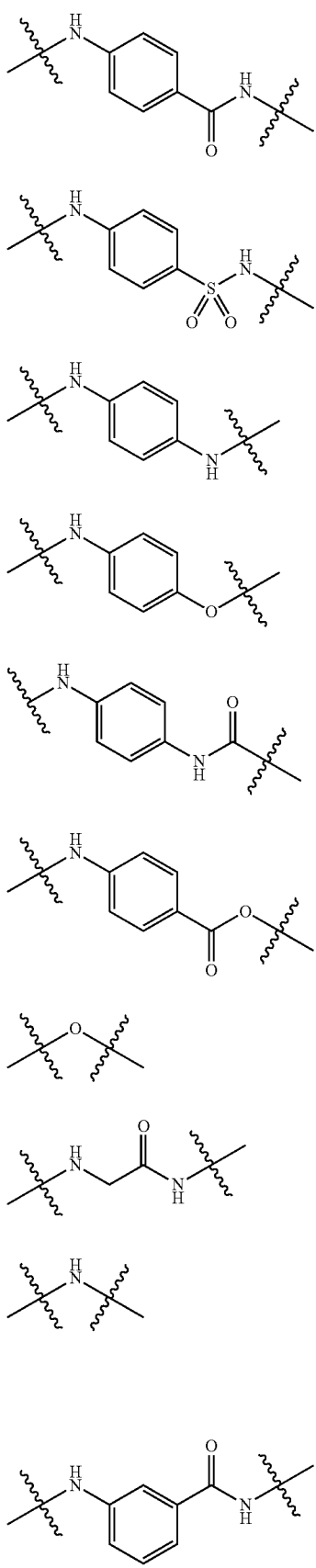

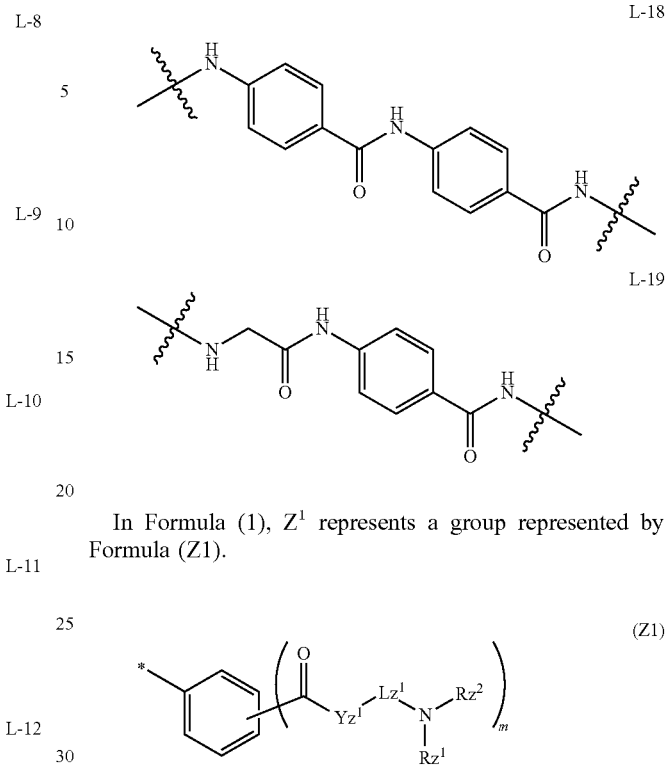

In Formula (1), $Z^1$ represents a group represented by Formula (Z1).

In the formula, * represents a bonding hand, $Yz^1$ represents —$N(Ry^1)$— or —O—, in which $Ry^1$ represents a hydrogen atom, an alkyl group, an alkenyl group, an alkynyl group, or an aryl group, $Lz^1$ represents a divalent linking group, $Rz^1$ and $Rz^2$ each independently represent a hydrogen atom, an alkyl group, an alkenyl group, an alkynyl group, or an aryl group, in which $Rz^1$ and $Rz^2$ may be bonded to each other through a divalent group to form a ring, and m represents an integer of 1 to 5.

In Formula (Z1), $Yz^1$ represents —$N(Ry^1)$— or —O—, and from the reason that durability is easily improved, —$N(Ry^1)$— is preferable.

$Ry^1$ represents a hydrogen atom, an alkyl group, an alkenyl group, an alkynyl group, or an aryl group, and a hydrogen atom or an alkyl group is preferable and a hydrogen atom is more preferable. The preferred ranges of the alkyl group, alkenyl group, alkynyl group, and aryl group represented by $Ry^1$ are the same as the ranges described as the preferred ranges of the alkyl group, alkenyl group, alkynyl group, and aryl group of $Ra^1$.

In Formula (Z1), examples of the divalent linking group represented by $Lz^1$ include an alkylene group, an arylene group, a heterocyclic group, —O—, —$N(R^{Z1})$—, —NHCO—, —CONH—, —OCO—, —COO—, —CO—, —$SO_2NH$—, —$SO_2$—, and a group formed by a combination of these groups, and an alkylene group is preferable. The alkylene group preferably has 1 to 30 carbon atoms, more preferably has 1 to 15 carbon atoms, still more preferably has 1 to 8 carbon atoms, and particularly preferably has 1 to 5 carbon atoms. The alkylene group may be any of linear, branched, and cyclic forms, and is preferably linear or branched and particularly preferably linear.

In Formula (Z1), $Rz^1$ and $Rz^2$ each independently represent a hydrogen atom, an alkyl group, an alkenyl group, an alkynyl group, or an aryl group, and an alkyl group or an aryl group is preferable and an alkyl group is more preferable. The alkyl group preferably has 1 to 10 carbon atoms, more preferably has 1 to 5 carbon atoms, still more preferably has 1 to 3 carbon atoms, and particularly preferably has 1 or 2 carbon atoms. The alkyl group may be any of linear, branched, and cyclic forms, and is preferably linear or branched and more preferably linear. The alkenyl group preferably has 2 to 10 carbon atoms, more preferably has 2 to 8 carbon atoms, and particularly preferably has 2 to 5 carbon atoms. The alkenyl group may be any of linear, branched, and cyclic forms, and is preferably linear or branched and more preferably linear. The alkynyl group preferably has 2 to 10 carbon atoms, more preferably has 2 to 8 carbon atoms, and particularly preferably has 2 to 5 carbon atoms. The alkynyl group may be any of linear, branched, and cyclic forms, and is preferably linear or branched and more preferably linear. The aryl group preferably has 6 to 30 carbon atoms, more preferably has 6 to 20 carbon atoms, and still more preferably has 6 to 12 carbon atoms.

In Formula (Z1), $Rz^1$ and $Rz^2$ may be bonded to each other through a divalent group to form a ring. Examples of the divalent group include —$CH_2$—, —O—, and —$SO_2$—. Specific examples of the ring formed by bonding $Rz^1$ and $Rz^2$ to each other through the divalent group include the following.

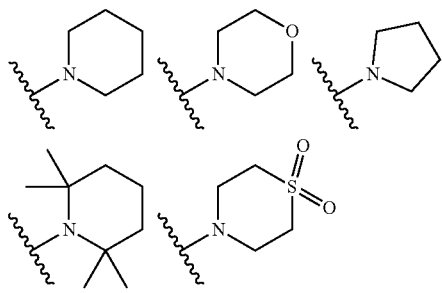

In Formula (Z), m represents an integer of 1 to 5, and is preferably 1 to 4, more preferably 1 to 3, still more preferably 2 or 3, and particularly preferably 2.

In Formula (1), $Z^1$ is preferably a group represented by Formula (Z2).

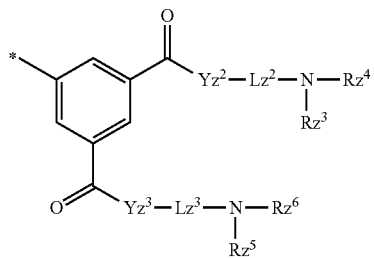

(Z2)

In the formula, * represents a bonding hand, $Yz^2$ and $Yz^3$ each independently represent —N($Ry^2$)— or —O—, in which $Ry^2$ represents a hydrogen atom, an alkyl group, an alkenyl group, an alkynyl group, or an aryl group, $Lz^2$ and $Lz^3$ each independently represent a divalent linking group, and $Rz^3$ to $Rz^6$ each independently represent a hydrogen atom, an alkyl group, an alkenyl group, an alkynyl group, or an aryl group, and $Rz^3$ and $Rz^4$, and $Rz^5$ and $Rz^6$ may be respectively bonded to each other through a divalent group to form a ring.

$Yz^2$ and $Yz^3$ in Formula (Z2) have the same meanings as $Yz^1$ in Formula (Z1), and the preferred ranges are also the same. $Ry^2$ represents a hydrogen atom, an alkyl group, an alkenyl group, an alkynyl group, or an aryl group, and a hydrogen atom or an alkyl group is preferable and a hydrogen atom is more preferable. The preferred ranges of the alkyl group, alkenyl group, alkynyl group, and aryl group represented by $Ry^2$ are the same as the ranges described as the preferred ranges of the alkyl group, alkenyl group, alkynyl group, and aryl group of $Ra^1$.

$Lz^2$ and $Lz^3$ in Formula (Z2) have the same meanings as $Lz^1$ in Formula (Z1), and the preferred ranges are also the same. $Rz^3$ to $Rz^6$ in Formula (Z2) have the same meanings as $Rz^1$ and $Rz^2$ in Formula (Z1), and the preferred ranges are also the same.

Specific examples of $Z^1$ include groups having the following structures. In the following structural formulae, Ph represents a phenyl group.

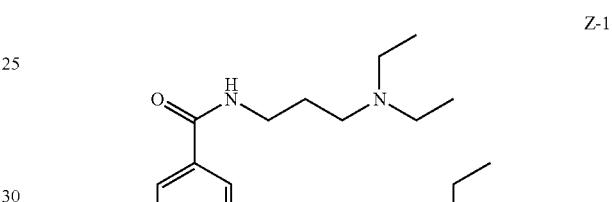

Z-1

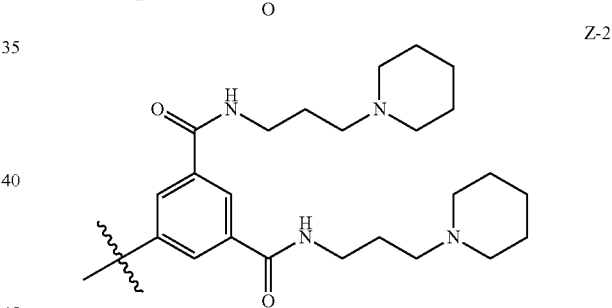

Z-2

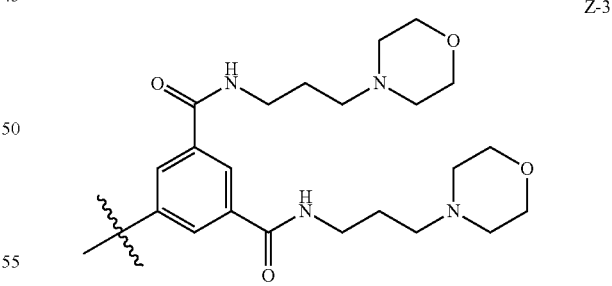

Z-3

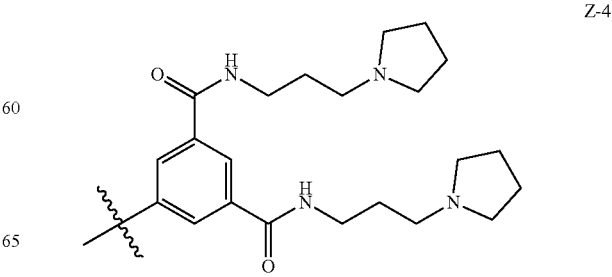

Z-4

-continued
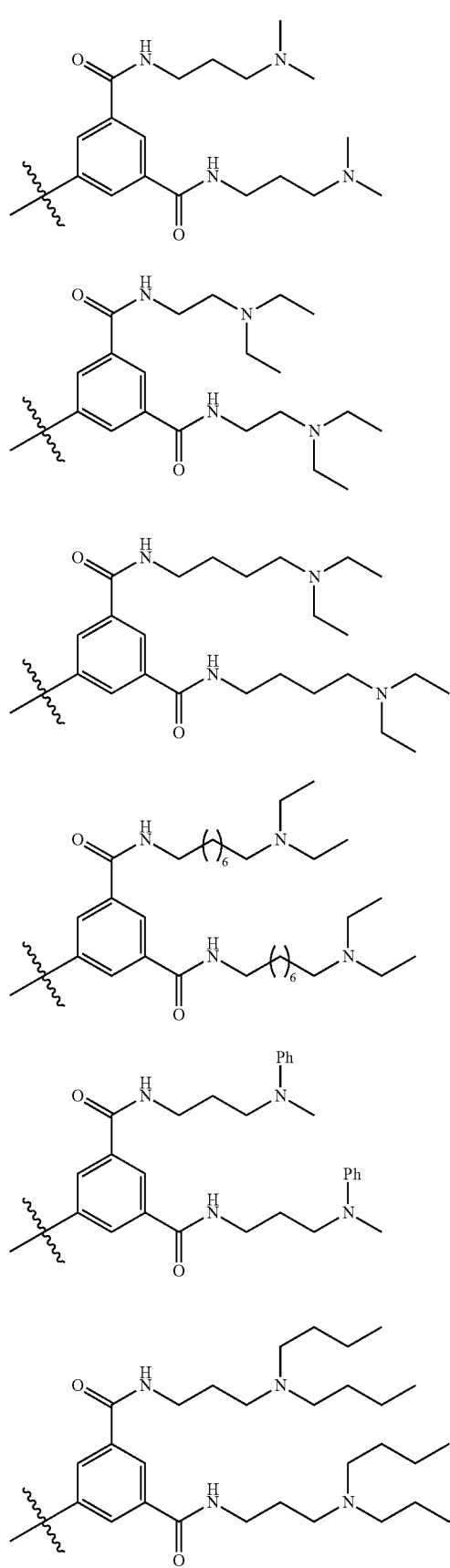
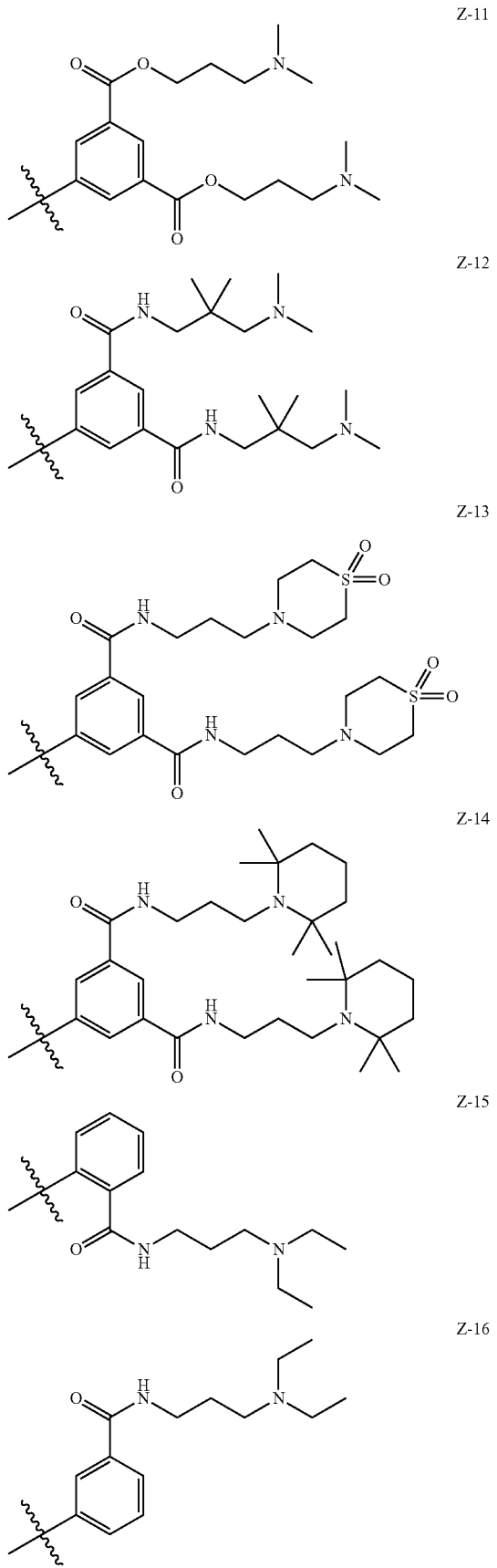

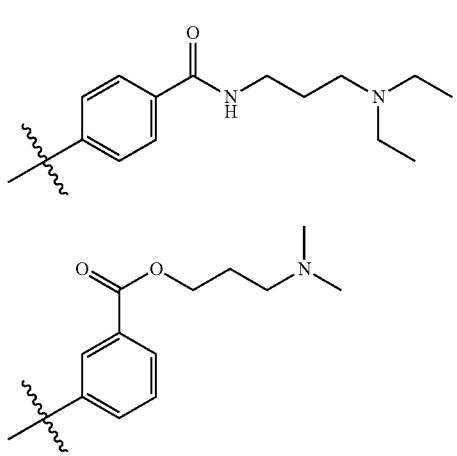

Z-17

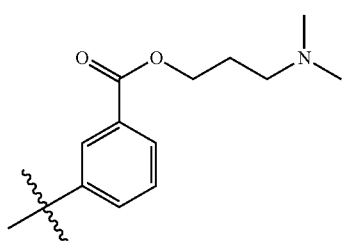

Z-18

The compound (1) used in the photosensitive composition according to the embodiment of the present invention is preferably a compound represented by Formula (2). By using such a compound, the effects of the present invention are more remarkably obtained.

$$A^1\text{-}X^1\text{-}L^2\text{-}X^2\text{—}Z^2 \qquad (2)$$

In Formula (2), $A^1$ represents a group including an aromatic ring, $X^1$ and $X^2$ each independently represent a single bond, —O—, —N($R^1$)—, —NHCO—, —CONH—, —OCO—, —COO—, —CO—, —SO$_2$NH—, or —SO$_2$—, in which $R^1$ represents a hydrogen atom, an alkyl group, an alkenyl group, an alkynyl group, or an aryl group, $L^2$ represents a single bond or a divalent linking group, and $Z^1$ represents the group represented by Formula (Z1).

$A^1$ and $Z^1$ in Formula (2) have the same meanings as $A^1$ and $Z^1$ in Formula (1), and the preferred ranges are also the same.

$X^1$ and $X^2$ in Formula (2) each independently represent a single bond, —O—, —N($R^1$)—, —NHCO—, —CONH—, —OCO—, —COO—, —CO—, —SO$_2$NH—, or —SO$_2$—, —O—, —N($R^1$)—, —NHCO—, —CONH—, —OCO—, —COO—, —CO—, —SO$_2$NH—, or —SO$_2$— is preferable. $R^1$ represents a hydrogen atom, an alkyl group, an alkenyl group, an alkynyl group, or an aryl group, and a hydrogen atom or an alkyl group is preferable and a hydrogen atom is more preferable. The preferred ranges of the alkyl group, alkenyl group, alkynyl group, and aryl group represented by $R^1$ are the same as the ranges described as the preferred ranges of the alkyl group, alkenyl group, alkynyl group, and aryl group of $Ra^1$.

$L^2$ in Formula (2) represents a single bond or a divalent linking group. Examples of the divalent linking group represented by $L^2$ include an alkylene group, an arylene group, a group in which an alkylene group and an arylene group are bonded to each other through a single bond, —O—, —N($R^2$)—, —NHCO—, —CONH—, —OCO—, —COO—, —CO—, —SO$_2$NH—, —SO$_2$—, or a group formed by a combination of these groups, and a group in which alkylene groups or arylene groups are bonded to each other through —O—, —N($R^2$)—, —NHCO—, —CONH—, —OCO—, —COO—, —CO—, —SO$_2$NH—, —SO$_2$—, or a group formed by a combination of these groups. $R^2$ represents a hydrogen atom, an alkyl group, an alkenyl group, an alkynyl group, or an aryl group, and a hydrogen atom or an alkyl group is preferable and a hydrogen atom is more preferable. The preferred ranges of the alkyl group, alkenyl group, alkynyl group, and aryl group represented by $R^2$ are the same as the ranges described as the preferred ranges of the alkyl group, alkenyl group, alkynyl group, and aryl group of Ra.

Specific examples of the compound (1) include the following. In the following table, the symbols described in the columns of structure of $A^1$, structure of $L^1$, and structure of $Z^1$ are the structures exemplified in the specific examples of $A^1$, the specific examples of $L^1$, and the specific examples of $Z^1$ respectively.

TABLE 1

$A^1\text{-}L^1\text{-}Z^1$

| Compound No. | Structure of $A^1$ | Structure of $L^1$ | Structure of $Z^1$ |
|---|---|---|---|
| C-1 | A-1 | L-1 | Z-1 |
| C-2 | A-2 | L-1 | Z-1 |
| C-3 | A-3 | L-1 | Z-1 |
| C-4 | A-4 | L-1 | Z-1 |
| C-5 | A-5 | L-1 | Z-1 |
| C-6 | A-6 | L-1 | Z-1 |
| C-7 | A-7 | L-1 | Z-1 |
| C-8 | A-8 | L-1 | Z-1 |
| C-9 | A-9 | L-1 | Z-1 |
| C-10 | A-10 | L-1 | Z-1 |
| C-11 | A-11 | L-1 | Z-1 |
| C-12 | A-12 | L-1 | Z-1 |
| C-13 | A-13 | L-1 | Z-1 |
| C-14 | A-14 | L-1 | Z-1 |
| C-15 | A-15 | L-1 | Z-1 |
| C-16 | A-16 | L-1 | Z-1 |
| C-17 | A-17 | L-1 | Z-1 |
| C-18 | A-18 | L-1 | Z-1 |
| C-19 | A-19 | L-1 | Z-1 |
| C-20 | A-20 | L-1 | Z-1 |
| C-21 | A-21 | L-1 | Z-1 |
| C-22 | A-22 | L-1 | Z-1 |
| C-23 | A-23 | L-1 | Z-1 |
| C-24 | A-24 | L-1 | Z-1 |
| C-25 | A-25 | L-2 | Z-1 |
| C-26 | A-26 | L-2 | Z-1 |
| C-27 | A-16 | L-3 | Z-1 |
| C-28 | A-16 | L-4 | Z-1 |
| C-29 | A-16 | L-5 | Z-1 |
| C-30 | A-16 | L-6 | Z-1 |
| C-31 | A-7 | L-7 | Z-1 |
| C-32 | A-28 | L-7 | Z-1 |
| C-33 | A-29 | L-8 | Z-1 |
| C-34 | A-30 | L-8 | Z-1 |
| C-35 | A-31 | L-8 | Z-1 |
| C-36 | A-32 | L-8 | Z-1 |
| C-37 | A-33 | L-8 | Z-1 |
| C-38 | A-34 | L-8 | Z-1 |
| C-39 | A-35 | L-8 | Z-1 |
| C-40 | A-36 | L-8 | Z-1 |
| C-41 | A-37 | L-8 | Z-1 |
| C-42 | A-38 | L-8 | Z-1 |
| C-43 | A-39 | L-8 | Z-1 |
| C-44 | A-40 | L-8 | Z-1 |
| C-45 | A-41 | L-8 | Z-1 |
| C-46 | A-42 | L-8 | Z-1 |
| C-47 | A-43 | L-8 | Z-1 |
| C-48 | A-44 | L-8 | Z-1 |
| C-49 | A-45 | L-8 | Z-1 |
| C-50 | A-46 | L-8 | Z-1 |
| C-51 | A-47 | L-8 | Z-1 |
| C-52 | A-48 | L-8 | Z-1 |
| C-53 | A-49 | L-8 | Z-1 |
| C-54 | A-50 | L-8 | Z-1 |
| C-55 | A-51 | L-8 | Z-1 |
| C-56 | A-52 | L-8 | Z-1 |
| C-57 | A-53 | L-8 | Z-1 |
| C-58 | A-54 | L-8 | Z-1 |
| C-59 | A-55 | L-8 | Z-1 |
| C-60 | A-56 | L-8 | Z-1 |
| C-61 | A-57 | L-8 | Z-1 |

TABLE 1-continued

A¹-L¹-Z¹

| Compound No. | Structure of A¹ | Structure of L¹ | Structure of Z¹ |
|---|---|---|---|
| C-62 | A-58 | L-8 | Z-1 |
| C-63 | A-32 | L-9 | Z-1 |
| C-64 | A-32 | L-10 | Z-1 |
| C-65 | A-32 | L-11 | Z-1 |
| C-66 | A-32 | L-12 | Z-1 |
| C-67 | A-32 | L-13 | Z-1 |
| C-68 | A-32 | L-14 | Z-1 |
| C-69 | A-32 | L-15 | Z-1 |
| C-70 | A-32 | L-16 | Z-1 |
| C-71 | A-32 | L-17 | Z-1 |
| C-72 | A-32 | L-18 | Z-1 |
| C-73 | A-32 | L-19 | Z-1 |
| C-74 | A-32 | L-8 | Z-2 |
| C-75 | A-32 | L-8 | Z-3 |
| C-76 | A-32 | L-8 | Z-4 |
| C-77 | A-32 | L-8 | Z-5 |
| C-78 | A-32 | L-8 | Z-6 |
| C-79 | A-32 | L-8 | Z-7 |
| C-80 | A-32 | L-8 | Z-8 |
| C-81 | A-32 | L-8 | Z-9 |
| C-82 | A-32 | L-8 | Z-10 |
| C-83 | A-32 | L-8 | Z-11 |
| C-84 | A-32 | L-8 | Z-12 |
| C-85 | A-32 | L-8 | Z-13 |
| C-86 | A-32 | L-8 | Z-14 |
| C-87 | A-32 | L-8 | Z-15 |
| C-88 | A-32 | L-8 | Z-16 |
| C-89 | A-32 | L-8 | Z-17 |
| C-90 | A-32 | L-8 | Z-18 |
| C-91 | A-16 | L-1 | Z-17 |
| C-92 | A-15 | L-1 | Z-17 |
| C-93 | A-59 | L-8 | Z-1 |
| C-94 | A-60 | L-8 | Z-1 |
| C-95 | A-61 | L-8 | Z-1 |
| C-96 | A-62 | L-8 | Z-1 |
| C-97 | A-63 | L-8 | Z-1 |
| C-98 | A-64 | L-8 | Z-1 |
| C-99 | A-65 | L-8 | Z-1 |

In the compound (1), the maximum value of a molar light absorption coefficient in a wavelength range of 400 to 700 nm is preferably 1000 $L \cdot mol^{-1} \cdot cm^{-1}$ or less and more preferably 100 $L \cdot mol^{-1} \cdot cm^{-1}$ or less. According to this aspect, adhesiveness of a film to be obtained with a support is easily further improved. In the present specification, the value of the molar light absorption coefficient of the compound (1) is a value measured by a method described in Examples described later.

It is also preferable that the compound (1) satisfies any one of the following spectral characteristics (a) to (d).
(a) maximum value of the molar light absorption coefficient in a wavelength range of more than 700 nm and 750 nm or less is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less.
(b) maximum value of the molar light absorption coefficient in a wavelength range of more than 750 nm and 800 nm or less is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less.
(c) maximum value of the molar light absorption coefficient in a wavelength range of more than 800 nm and 850 nm or less is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less.
(d) maximum value of the molar light absorption coefficient in a wavelength range of more than 850 nm and 900 nm or less is preferably 3000 $L \cdot mol^{-1} \cdot cm^{-1}$ or less, more preferably 1000 $L \cdot mol^{-1} \cdot cm^{-1}$ or less, and still more preferably 100 $L \cdot mol^{-1} \cdot cm^{-1}$ or less.

The content of the compound (1) in the total solid content of the photosensitive composition is preferably 0.3% to 20% by mass. The lower limit is preferably 0.6% by mass or more and more preferably 0.9% by mass or more. The upper limit is preferably 15% by mass or less, more preferably 12.5% by mass or less, and still more preferably 10% by mass or less.

In addition, the content of the compound (1) is preferably 1 to 30 parts by mass with respect to 100 parts by mass of the pigment. The lower limit is preferably 2 parts by mass or more and more preferably 3 parts by mass or more. The upper limit is preferably 20 parts by mass or less and more preferably 15 parts by mass or less. The compound (1) may be used singly or in combination of two or more kinds thereof. In a case where two or more kinds thereof are used in combination, the total amount thereof is preferably within the above-described range.

<<Polymerizable Compound>>

The photosensitive composition according to the embodiment of the present invention contains a polymerizable compound. As the polymerizable compound, a known compound which is cross-linkable by a radical, an acid, or heat can be used. In the present invention, the polymerizable compound is preferably, for example, a compound having an ethylenically unsaturated bonding group. Examples of the ethylenically unsaturated bonding group include a vinyl group, a (meth)allyl group, and a (meth)acryloyl group. The polymerizable compound used in the present invention is preferably a radically polymerizable compound.

Any chemical forms of a monomer, a prepolymer, an oligomer, or the like may be used as the polymerizable compound, but a monomer is preferable. The molecular weight of the polymerizable compound is preferably 100 to 3000. The upper limit is more preferably 2000 or less and still more preferably 1500 or less. The lower limit is more preferably 150 or more and still more preferably 250 or more.

The polymerizable compound is preferably a compound including 3 or more ethylenically unsaturated bonding groups, more preferably a compound including 3 to 15 ethylenically unsaturated bonding groups, and still more preferably a compound having 3 to 6 ethylenically unsaturated bonding groups. In addition, the polymerizable compound is preferably a trifunctional to pentadecafunctional (meth)acrylate compound and more preferably a trifunctional to hexafunctional (meth)acrylate compound. Specific examples of the polymerizable compound include the compounds described in paragraph Nos. 0095 to 0108 of JP2009-288705A, paragraph No. 0227 of JP2013-029760A, paragraph Nos. 0254 to 0257 of JP2008-292970A, paragraph Nos. 0034 to 0038 of JP2013-253224A, paragraph No. 0477 of JP2012-208494A, JP2017-048367A, JP6057891B, and JP6031807B, the contents of which are incorporated herein by reference.

As the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa (meth)acrylate (as a commercially available product, KAYARAD DPHA manufactured by Nippon Kayaku Co., Ltd., NK ESTER A-DPH-12E manufactured by Shin-Nakamura Chemical Co., Ltd.), or a compound having a structure in which these (meth)acryloyl groups are bonded through an ethylene glycol and/or a propylene glycol residue (for example, SR454 and SR499 which are commercially available products from Sartomer) is preferable. In addition, as the polymerizable compound, diglycerin ethylene oxide (EO)-modified (meth)acrylate (as a commercially available product, M-460 manufactured by TOAGOSEI CO., LTD.), pentaerythritol tetraacrylate (NK ESTER A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), ARONIX TO-2349 (manufactured by TOAGOSEI CO., LTD.), NK OLIGO UA-7200 (manufactured by Shin-Nakamura Chemical Co., Ltd.), 8UH-1006 and 8UH-1012 (manufactured by Taisei Fine Chemical Co., Ltd.), Light Acrylate POB-A0 (manufactured by KYOE-ISHA CHEMICAL Co., Ltd.), and the like can also be used.

In addition, as the polymerizable compound, it is also preferable to use a trifunctional (meth)acrylate compound such as trimethylolpropane tri(meth)acrylate, trimethylolpropane propyleneoxide-modified tri(meth)acrylate, trimethylolpropane ethyleneoxide-modified tri(meth)acrylate, isocyanuric acid ethyleneoxide-modified tri(meth)acrylate, and pentaerythritol tri(meth)acrylate. Examples of a commercially available product of the trifunctional (meth)acrylate compound include ARONIX M-309, M-310, M-321, M-350, M-360, M-313, M-315, M-306, M-305, M-303, M-452, and M-450 (manufactured by TOAGOSEI CO., LTD.), NK ESTER A9300, A-GLY-9E, A-GLY-20E, A-TMM-3, A-TMM-3L, A-TMM-3LM-N, A-TMPT, and TMPT (manufactured by Shin-Nakamura Chemical Co., Ltd.), and KAYARAD GPO-303, TMPTA, THE-330, TPA-330, and PET-30 (manufactured by Nippon Kayaku Co., Ltd.).

As the polymerizable compound, a compound having an acid group can also be used. By using a polymerizable compound having an acid group, the polymerizable compound in an unexposed area is easily removed during development and the generation of a development residue can be suppressed. Examples of the acid group include a carboxyl group, a sulfo group, and a phosphoric acid group, and a carboxyl group is preferable. Examples of a commercially available product of the polymerizable compound having an acid group include ARONIX M-510, M-520, and ARONIX TO-2349 (manufactured by TOAGOSEI CO., LTD). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

The polymerizable compound is preferably a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, a polymerizable compound having an alkyleneoxy group can also be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth)acrylate compound having 4 to 20 ethyleneoxy groups. Examples of a commercially available product of the polymerizable compound having an alkyleneoxy group include SR-494 manufactured by Sartomer, which is a tetrafunctional (meth)acrylate having 4 ethyleneoxy groups, and KAYARAD TPA-330 manufactured by Nippon Kayaku Co., Ltd, which is a trifunctional (meth)acrylate having 3 isobutyleneoxy groups.

As the polymerizable compound, a polymerizable compound having a fluorene skeleton can also be used. Examples of a commercially available product of the polymerizable compound having a fluorene skeleton include OGSOL EA-0200, EA-0300 (manufactured by Osaka Gas Chemicals Co., Ltd., (meth)acrylate monomer having a fluorene skeleton).

As the polymerizable compound, it is also preferable to use a compound which does not substantially include environmentally regulated substances such as toluene. Examples of a commercially available product of such a compound include KAYARAD DPHA LT and KAYARAD DPEA-12 LT (manufactured by Nippon Kayaku Co., Ltd.).

The urethane acrylates described in JP1973-041708B (JP-S48-041708B), JP1976-037193A (JP-S51-037193A), JP1990-032293B (JP-H02-032293B), or JP1990-016765B (JP-H02-016765B), or the urethane compounds having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B) are also suitable as the polymerizable compound. In addition, the polymerizable compounds having an amino structure or a sulfide structure in the molecule, described in JP1988-277653A (JP-S63-277653A), JP1988-260909A (JP-S63-260909A), or JP1989-105238A (JP-H01-105238A), are also preferably used. In addition, as the polymerizable compound, commercially available products such as UA-7200 (manufactured by Shin-Nakamura Chemical Co., Ltd.), DPHA-40H (manufactured by Nippon Kayaku Co., Ltd.), and UA-306H UA-306T, UA-306, AH-600, T-600, $A^1$-600, and LINC-202UA (manufactured by KYOE-ISHA CHEMICAL Co., Ltd.) can also be used.

The content of the polymerizable compound in the total solid content of the photosensitive composition is preferably 0.1% to 50% by mass. The lower limit is more preferably 0.5% by mass or more and still more preferably 1% by mass or more. The upper limit is more preferably 45% by mass or less and still more preferably 40% by mass or less.

The polymerizable compound may be used singly or in combination of two or more kinds thereof. In a case where two or more kinds thereof are used in combination, the total thereof is preferably within the above-described range.

<<Oxime-Based Photopolymerization Initiator>>

The photosensitive composition according to the embodiment of the present invention includes an oxime-based photopolymerization initiator as a photopolymerization initiator. Examples of the oxime-based photopolymerization initiator include a compound (oxime compound) having an oxime site in the molecule.

The oxime-based photopolymerization initiator used in the present invention is preferably a photoradical polymerization initiator. In addition, the oxime-based photopolymerization initiator is preferably a compound having photosensitivity to light in a range from the ultraviolet range to the visible range. The oxime-based photopolymerization initiator is preferably a compound having a maximum absorption wavelength in a wavelength range of 350 to 500 nm and more preferably a compound having a maximum absorption wavelength in a wavelength range of 360 to 480 nm. In addition, from the viewpoint of sensitivity, the molar light absorption coefficient of the oxime compound at a wavelength of 365 nm or 405 nm is preferably high, more preferably 1000 to 300000, still more preferably 2000 to 300000, and particularly preferably 5000 to 200000. The molar light absorption coefficient of the oxime compound can be measured using a known method. For example, the molar light absorption coefficient is preferably measured by a spectrophotometer (Cary-5 spectrophotometer, manufactured by Varian) using an ethyl acetate solvent at a concentration of 0.01 g/L.

Examples of the oxime-based photopolymerization initiator include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2000-080068A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, and the compounds described in paragraph Nos. 0025 to 0038 of WO2017/164127A. Specific examples of the oxime-based photopolymerization initiator include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.
Examples of a commercially available product include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A).

In addition, as the oxime-based photopolymerization initiator, it is also preferable to use an oxime compound having no colorability or an oxime compound having high transparency and being difficult to discolor. Examples of a commercially available product include ADEKA ARKLS NCI-730, NCI-831, and NCI-930 (all of which are manufactured by ADEKA Corporation).

In the present invention, as the oxime-based photopolymerization initiator, an oxime compound having a fluorene ring can also be used. Specific examples of the oxime compound having a fluorene ring include the compounds described in JP2014-137466A. The contents of the publications are incorporated herein by reference.

In the present invention, as the oxime-based photopolymerization initiator, an oxime compound having a fluorine atom can also be used. Specific examples of the oxime compound having a fluorine atom include the compounds described in JP2010-262028A, the compounds 24, and 36 to 40 described in JP2014-500852A, and the compound (C-3) described in JP2013-164471A. The contents of the publications are incorporated herein by reference.

In the present invention, as the oxime-based photopolymerization initiator, an oxime compound having a nitro group can also be used. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

In the present invention, as the oxime-based photopolymerization initiator, an oxime compound having a benzofuran skeleton can also be used. Specific examples thereof include OE-01 to OE-75 described in WO2015/036910A.

In the present invention, as the oxime-based photopolymerization initiator, a bifunctional or trifunctional or higher oxime-based photopolymerization initiator may be used. By using such an oxime-based photopolymerization initiator, two or more radicals are generated from one molecule of the oxime-based photopolymerization initiator, and as a result, good sensitivity is obtained. In addition, in a case of using a compound having an asymmetric structure as the oxime-based photopolymerization initiator, crystallinity is reduced so that solubility in a solvent or the like is improved, precipitation is to be difficult over time, and temporal stability of the photosensitive composition can be improved. Specific examples of the bifunctional or trifunctional or higher oxime-based photopolymerization initiator include dimers of the oxime compounds described in JP2010-527339A, JP2011-524436A, WO2015/004565A, paragraph Nos. 0412 to 0417 of JP2016-532675A, and paragraph Nos. 0039 to 0055 of WO2017/033680A; the compound (E) and compound (G) described in JP2013-522445A; Cmpd 1 to 7 described in WO2016/034963A; the oxime-based photopolymerization initiators described in paragraph No. 0007 of JP2017-523465A; the oxime-based photopolymerization initiators described in paragraph Nos. 0020 to 0033 of JP2017-167399A; the photopolymerization initiator (A) described in paragraph Nos. 0017 to 0026 of JP2017-151342A; and the oxime ester photoinitiators described in JP6469669B.

Specific examples of the oxime-based photopolymerization initiator which are preferably used in the present invention are shown below, but the present invention is not limited thereto.

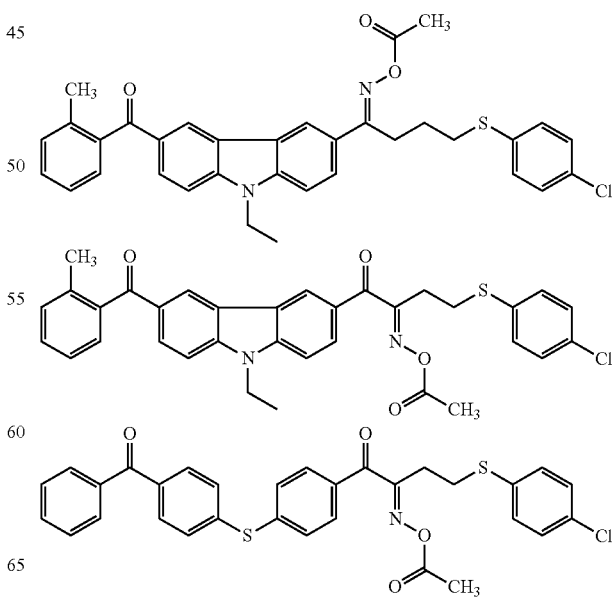

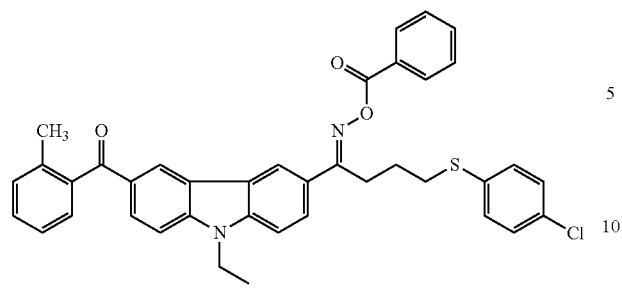
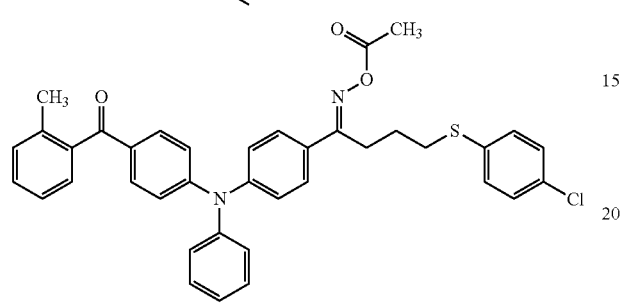
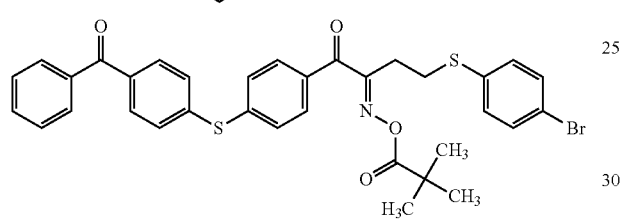
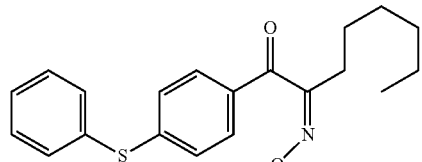
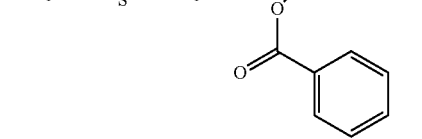
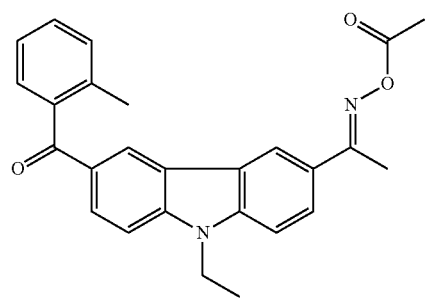
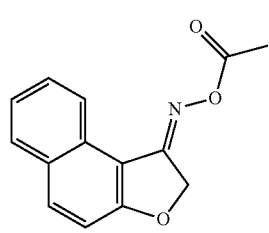
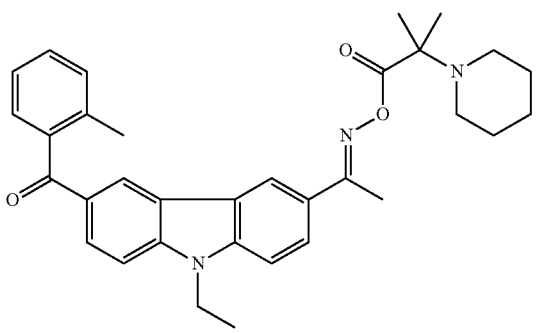
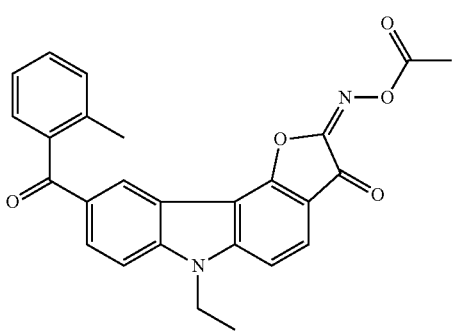
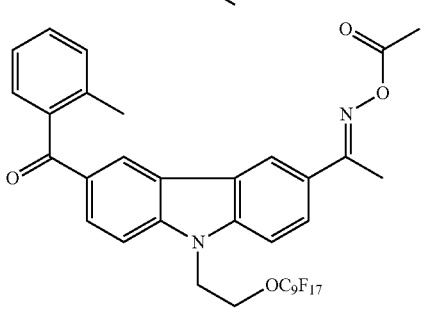
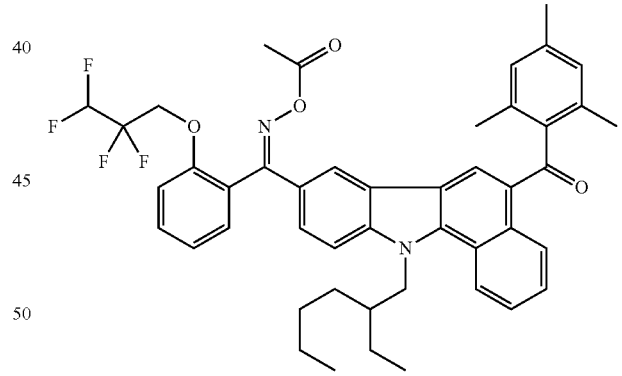
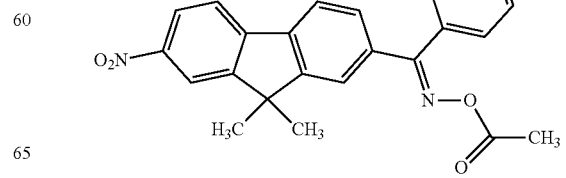

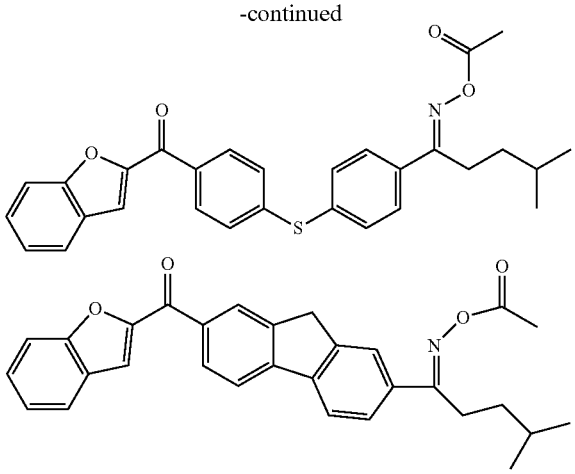

The content of the oxime-based photopolymerization initiator in the total solid content of the photosensitive composition is preferably 0.1% to 30% by mass. The lower limit is preferably 0.5% by mass or more and more preferably 1% by mass or more. The upper limit is preferably 20% by mass or less and more preferably 15% by mass or less. In the photosensitive composition according to the embodiment of the present invention, the oxime-based photopolymerization initiator may be used singly or in combination of two or more kinds thereof. In a case where two or more kinds thereof are used, the total amount thereof is preferably within the above-described range.

<<Other Photopolymerization Initiators>>

The photosensitive composition according to the embodiment of the present invention can contain, as a photopolymerization initiator, a photopolymerization initiator (other photopolymerization initiators) in addition to the oxime-based photopolymerization initiator. Examples of the other photopolymerization initiators include halogenated hydrocarbon derivatives (for example, a compound having a triazine skeleton and a compound having an oxadiazole skeleton), an acylphosphine compound, hexaaryl biimidazole, an organic peroxide, a thio compound, a ketone compound, an aromatic onium salt, an α-hydroxyketone compound, and an α-aminoketone compound. From the viewpoint of exposure sensitivity, as the other photopolymerization initiators, a trihalomethyl triazine compound, a benzyl dimethyl ketal compound, an α-hydroxyketone compound, an α-aminoketone compound, an acylphosphine compound, a phosphine oxide compound, a metallocene compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, and a compound selected from an α-hydroxyketone compound, an α-aminoketone compound, and an acylphosphine compound is more preferable.

Examples of a commercially available product of the α-hydroxyketone compound include IRGACURE-184, DAROCUR-1173, IRGACURE-500, IRGACURE-2959, and IRGACURE-127 (all manufactured by BASF). Examples of a commercially available product of the α-aminoketone compound include IRGACURE-907, IRGACURE-369, IRGACURE-379, and IRGACURE-379EG (all manufactured by BASF). Examples of a commercially available product of the acylphosphine compound include IRGACURE-819 and DAROCUR-TPO (both manufactured by BASF).

In a case where the photosensitive composition according to the embodiment of the present invention contains other photopolymerization initiators, the content of the other photopolymerization initiators in the total solid content of the photosensitive composition according to the embodiment of the present invention is preferably 0.1% to 30% by mass. The lower limit is preferably 0.5% by mass or more and more preferably 1% by mass or more. The upper limit is preferably 20% by mass or less and more preferably 15% by mass or less.

In addition, the content of the other photopolymerization initiators is preferably 1 to 100 parts by mass with respect to 100 parts by mass of the oxime-based photopolymerization initiator. The upper limit is preferably 90 parts by mass or less and more preferably 80 parts by mass or less. The lower limit is preferably 5 parts by mass or more and more preferably 10 parts by mass or more.

In addition, the total content of the oxime-based initiator and other photopolymerization initiators in the total solid content of the photosensitive composition according to the embodiment of the present invention is preferably 0.1% to 30% by mass. The lower limit is preferably 0.5% by mass or more and more preferably 1% by mass or more. The upper limit is preferably 20% by mass or less and more preferably 15% by mass or less.

It is also preferable that the photosensitive composition according to the embodiment of the present invention does not substantially contain the other photopolymerization initiators. According to this aspect, it is easy to form a film having more excellent adhesiveness. The case where the photosensitive composition according to the embodiment of the present invention does not substantially include the other photopolymerization initiators means that the content of the other photopolymerization initiators in the total solid content of the photosensitive composition according to the embodiment of the present invention is preferably 0.05% by mass or less, more preferably 0.01% by mass or less, and particularly preferably 0% by mass.

<<Resin>>

The photosensitive composition according to the embodiment of the present invention can contain a resin. The resin is blended in, for example, an application for dispersing particles such as a pigment in a photosensitive composition or an application as a binder. Mainly, a resin which is used for dispersing particles such as a pigment is also referred to as a dispersant. However, such applications of the resin are only exemplary, and the resin can also be used for other purposes in addition to such applications.

The weight-average molecular weight (Mw) of the resin is preferably 3000 to 2000000. The upper limit is preferably 1000000 or less and more preferably 500000 or less. The lower limit is preferably 4000 or more and more preferably 5000 or more.

Examples of the resin include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, and a styrene resin. These resins may be used singly or as a mixture of two or more kinds thereof. In addition, the resins described in paragraph Nos. 0041 to 0060 of JP2017-206689A, and the resins described in paragraph Nos. 0022 to 007 of JP2018-010856A can also be used.

In the present invention, as the resin, a resin having an acid group can be preferably used. According to this aspect, developability of the photosensitive composition can be improved, and pixels having excellent rectangularity can be easily formed. Examples of the acid group include a carboxyl group, a phosphoric acid group, a sulfo group, and a phenolic hydroxy group, and a carboxyl group is preferable. The resin having an acid group can be used, for example, as an alkali-soluble resin.

The resin having an acid group preferably includes a repeating unit having an acid group in the side chain, and more preferably includes 5% to 70% by mole of repeating units having an acid group in the side chain with respect to the total repeating units of the resin. The upper limit of the content of the repeating unit having an acid group in the side chain is preferably 50% by mole or less and more preferably 30% by mole or less. The lower limit of the content of the repeating unit having an acid group in the side chain is preferably 10% by mole or more and more preferably 20% by mole or more.

It is also preferable that the resin having an acid group includes a repeating unit derived from a monomer component including a compound represented by Formula (ED1) and/or a compound represented by Formula (ED2) (hereinafter, these compounds may be referred to as an "ether dimer").

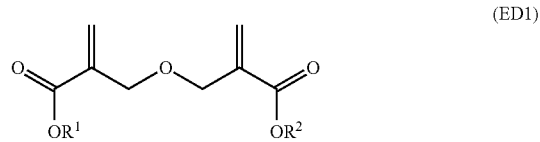

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph No. 0317 of JP2013-029760A, the contents of which are incorporated herein by reference.

It is also preferable that the resin used in the present invention includes a repeating unit derived from a compound represented by Formula (X).

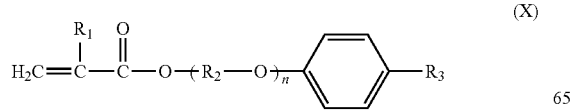

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may include a benzene ring. n represents an integer of 1 to 15.

With regard to the resin having an acid group, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, the contents of which are incorporated herein by reference. A commercially available product can also be used as the resin having an acid group.

The acid value of the resin having an acid group is preferably 30 to 500 mgKOH/g. The lower limit is preferably 50 mgKOH/g or more and more preferably 70 mgKOH/g or more. The upper limit is preferably 400 mgKOH/g or less, more preferably 300 mgKOH/g or less, and still more preferably 200 mgKOH/g or less. The weight-average molecular weight (Mw) of the resin having an acid group is preferably 5000 to 100000. In addition, the number-average molecular weight (Mn) of the resin having an acid group is preferably 1000 to 20000.

Examples of the resin having an acid group include a resin having the following structures.

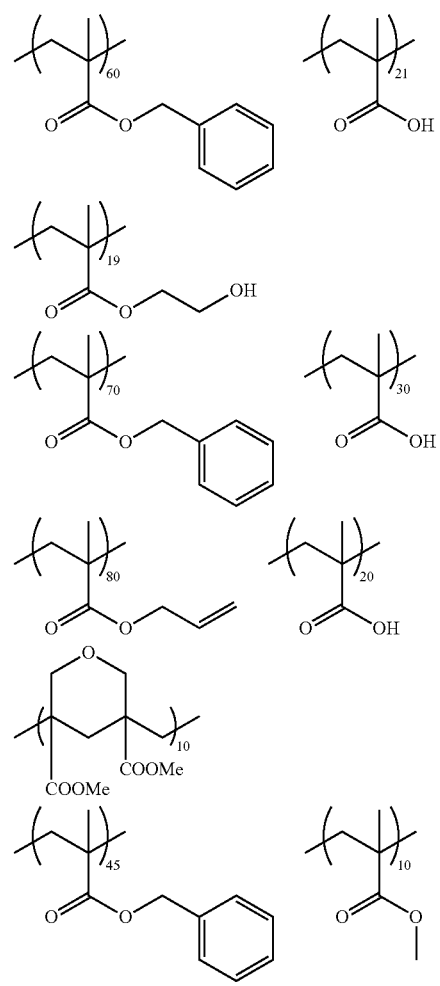

-continued

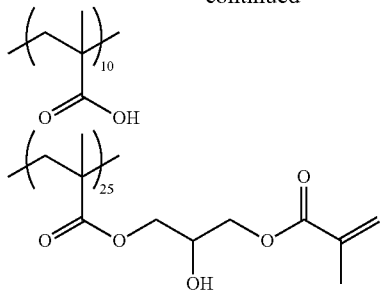

The photosensitive composition according to the embodiment of the present invention can also include a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70% by mole or more in a case where the total amount of the acid group and the basic group is 100% by mole, and more preferably a resin substantially consisting of only an acid group. The acid group included in the acidic dispersant (acidic resin) is preferably a carboxyl group. The acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50% by mole in a case where the total amount of the acid group and the basic group is 100% by mole. The basic group included in the basic dispersant is preferably an amino group.

The resin used as a dispersant preferably includes a repeating unit having an acid group. In a case where the resin used as a dispersant includes a repeating unit having an acid group, the generation of the development residue can be further suppressed in the formation of a pattern by a photolithography method.

It is also preferable that the resin used as a dispersant is a graft resin. With regard to details of the graft resin, reference can be made to the description in paragraph Nos. 0025 to 0094 of JP2012-255128A, the contents of which are incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, the contents of which are incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

In addition, the above-described resin (alkali-soluble resin) having an acid group can also be used as a dispersant.

In addition, it is also preferable that the resin used as a dispersant is a resin including a repeating unit having an ethylenically unsaturated bonding group in the side chain. The content of the repeating unit having an ethylenically unsaturated bonding group in the side chain is preferably 10% by mole or more, more preferably 10% to 80% by mole, and still more preferably 20% to 70% by mole with respect to the total repeating units of the resin.

A commercially available product is also available as the dispersant, and specific examples thereof include DISPERBYK series (for example, DISPERBYK-111, 161, and the like) manufactured by BYK Chemie, and Solsperse series (for example, Solsperse 76500) manufactured by Lubrizol Corporation. The dispersing agents described in paragraph Nos. 0041 to 0130 of JP2014-130338A can also be used, the contents of which are incorporated herein by reference. The resin described as a dispersant can be used for an application other than the dispersant. For example, the resin can also be used as a binder.

In a case where the photosensitive composition according to the embodiment of the present invention includes a resin, the content of the resin in the total solid content of the photosensitive composition is preferably 5% to 50% by mass. The lower limit is preferably 10% by mass or more and more preferably 15% by mass or more. The upper limit is preferably 40% by mass or less, more preferably 35% by mass or less, and still more preferably 30% by mass or less. In addition, the content of the resin having an acid group, in the total solid content of the photosensitive composition, is preferably 5% to 50% by mass. The lower limit is preferably 10% by mass or more and more preferably 15% by mass or more. The upper limit is preferably 40% by mass or less, more preferably 35% by mass or less, and still more preferably 30% by mass or less. In addition, from the reason that excellent developability is easily obtained, the content of the resin having an acid group in the total amount of the resin is preferably 30% by mass or more, more preferably 50% by mass or more, still more preferably 70% by mass or more, and particularly preferably 80% by mass or more. The upper limit may be 100% by mass, 95% by mass, or 90% by mass or less.

In addition, from the viewpoint of curability, developability, and film-forming property, the total content of the polymerizable compound and resin in the total solid content of the photosensitive composition is preferably 10% to 65% by mass. The lower limit is preferably 15% by mass or more, more preferably 20% by mass or more, and still more preferably 30% by mass or more. The upper limit is preferably 60% by mass or less, more preferably 50% by mass or less, and still more preferably 40% by mass or less. In addition, the photosensitive composition according to the embodiment of the present invention preferably contains 30 to 300 parts by mass of the resin with respect to 100 parts by mass of the polymerizable compound. The lower limit is preferably 50 parts by mass or more and more preferably 80 parts by mass or more. The upper limit is preferably 250 parts by mass or less and more preferably 200 parts by mass or less.

<<Compound Having Cyclic Ether Group>>

The photosensitive composition according to the embodiment of the present invention can contain a compound having a cyclic ether group. Examples of the cyclic ether group include an epoxy group and an oxetanyl group. The compound having a cyclic ether group is preferably a compound having an epoxy group. Examples of the compound having an epoxy group include a compound having one or more epoxy groups in one molecule, and a compound two or more epoxy groups in one molecule is preferable. It is preferable to have 1 to 100 epoxy groups in one molecule. The upper limit of the number of epoxy groups may be, for example, 10 or less or 5 or less. The lower limit of the number of epoxy groups is preferably 2 or more. As the compound having an epoxy group, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents of the publications are incorporated herein by reference.

The compound having an epoxy group may be a low-molecular-weight compound (for example, having a molecular weight of less than 2000, and further, a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the compound having an epoxy group is preferably 200 to 100000 and more preferably 500 to 50000. The upper limit of the weight-average molecular weight is preferably 10000 or less, more preferably 5000 or less, and still more preferably 3000 or less.

As the compound having an epoxy group, an epoxy resin can be preferably used. Examples of the epoxy resin include an epoxy resin which is a glycidyl etherified product of a phenol compound, an epoxy resin which is a glycidyl etherified product of various novolak resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. The epoxy equivalent of the epoxy resin is preferably 310 to 3300 g/eq, more preferably 310 to 1700 g/eq, and still more preferably 310 to 1000 g/eq.

Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, and G-01758 (all of which are manufactured by NOF Corporation., an epoxy group-containing polymer).

In a case where the photosensitive composition according to the embodiment of the present invention contains a compound having a cyclic ether group, the content of the compound having a cyclic ether group in the total solid content of the photosensitive composition is preferably 0.1% to 20% by mass. The lower limit is, for example, preferably 0.5% by mass or more and more preferably 1% by mass or more. The upper limit is, for example, preferably 15% by mass or less and still more preferably 10% by mass or less. The compound having a cyclic ether group may be used singly or in combination of two or more kinds thereof. In a case of using two or more kinds thereof, the total amount thereof is preferably within the above-described range.

<<Silane Coupling Agent>>

The photosensitive composition according to the embodiment of the present invention can contain a silane coupling agent. According to this aspect, adhesiveness of a film to be obtained with a support can be further improved. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the photosensitive composition is preferably 0.1% to 5% by mass. The upper limit is preferably 3% by mass or less and more preferably 2% by mass or less. The lower limit is preferably 0.5% by mass or more and more preferably 1% by mass or more. The silane coupling agent may be used singly or in combination of two or more kinds thereof. In a case of using two or more kinds thereof, the total amount thereof is preferably within the above-described range.

<<Solvent>>

The photosensitive composition according to the embodiment of the present invention can contain a solvent. Examples of the solvent include an organic solvent. Basically, the solvent is not particularly limited as long as it satisfies solubility of the respective components or coatability of the photosensitive composition. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to the description in paragraph No. 0223 of WO2015/166779A, the contents of which are incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the solvent is low (for example, 50 parts per million (ppm) by mass or less, 10 ppm by mass or less, or 1 ppm by mass or less with respect to the total amount of the organic solvent) in consideration of environmental aspects and the like.

In the present invention, a solvent having a low metal content is preferably used. For example, the metal content in the solvent is preferably 10 ppb (parts per billion) by mass or less. A solvent in which the metal content is at a level of ppt (parts per trillion) by mass may be used as desired, and such a high-purity solvent is provided by, for example, Toyo Kasei Kogyo Co., Ltd. (The Chemical Daily, Nov. 13, 2015).

Examples of a method for removing impurities such as a metal from the solvent include distillation (such as molecular distillation and thin-film distillation) and filtration using a filter. The filter pore size of the filter used for the filtration is preferably 10 µm or less, more preferably 5 µm or less, and still more preferably 3 µm or less. As a material of the filter, polytetrafluoroethylene, polyethylene, or nylon is preferable.

The solvent may include isomers (compounds having the same number of atoms and different structures). In addition, only one kind of isomers may be included, or a plurality of isomers may be included.

In the present invention, the organic solvent preferably has the content of peroxides of 0.8 mmol/L or less, and more preferably, the organic solvent does not substantially include peroxides.

The content of the solvent in the photosensitive composition is preferably 10% to 95% by mass, more preferably 20% to 90% by mass, and still more preferably 30% to 90% by mass.

In addition, from the viewpoint of environmental regulation, it is preferable that the photosensitive composition according to the embodiment of the present invention does not substantially contain environmentally regulated substances. In the present invention, the description "does not substantially contain environmentally regulated substances" means that the content of the environmentally regulated substances in the photosensitive composition is 50 ppm by mass or less, preferably 30 ppm by mass or less, still more preferably 10 ppm by mass or less, and particularly preferably 1 ppm by mass or less. Examples of the environmentally regulated substances include benzenes; alkylbenzenes such as toluene and xylene; and halogenated benzenes such as chlorobenzene. These compounds are registered as environmentally regulated substances in accordance with Registration Evaluation Authorization and Restriction of Chemicals (REACH) rules, Pollutant Release and Transfer Register (PRTR) law, Volatile Organic Compounds (VOC) regulation, and the like, and strictly regulated in their usage and handling method. These compounds can be used as a solvent in a case of producing respective components used in the photosensitive composition according to the embodiment of the present invention, and may be incorporated into the photosensitive composition as a residual solvent. From the viewpoint of human safety and environmental considerations, it is preferable to reduce these substances as much as possible. Examples of a method for reducing the environmentally regulated substances include a method for reducing the environmentally regulated substances by distilling the environmentally regulated substances from a system by heating or depressurizing the system such that the temperature of the system is higher than a boiling point of the environmentally regulated substances. In addition, in a case of distilling a small amount of the environmentally regulated substances, it is also useful to azeotrope with a solvent having the boiling point equivalent to that of the above-described solvent in order to increase efficiency. In addition, in a case of containing a compound having radical polymerizability, in order to suppress the radical polymerization reaction proceeding during the distillation under reduced pressure to cause crosslinking between the molecules, a polymerization inhibitor or the like may be added and the distillation under reduced pressure is performed. These distillation methods can be performed at any stage of raw material, product (for example, resin solution after polymerization or polyfunctional monomer solution) obtained by reacting the raw material, or photosensitive composition produced by mixing these compounds.

<<Polymerization Inhibitor>>

The photosensitive composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-t-butylphenol), and an N-nitrosophenylhydroxylamine salt (an ammonium salt, a cerous salt, or the like). Among these, p-methoxyphenol is preferable. The content of the polymerization inhibitor in the total solid content of the photosensitive composition is preferably 0.0001% to 5% by mass.

<<Surfactant>>

The photosensitive composition according to the embodiment of the present invention can contain a surfactant. As the surfactant, various surfactants such as a fluorine-based surfactant, a nonionic surfactant, a cationic surfactant, an anionic surfactant, and a silicon-based surfactant can be used. With regard to the surfactant, reference can be made to the description in paragraph Nos. 0238 to 0245 of WO2015/166779A, the contents of which are incorporated herein by reference.

In the present invention, it is preferable that the surfactant is a fluorine-based surfactant. By containing a fluorine-based surfactant in the photosensitive composition, liquid characteristics (particularly, fluidity) are further improved, and liquid saving properties can be further improved. In addition, it is possible to form a film with a small thickness unevenness.

The fluorine content in the fluorine-based surfactant is suitably 3% to 40% by mass, and more preferably 5% to 30% by mass and particularly preferably 7% to 25% by mass. The fluorine-based surfactant in which the fluorine content is within the above-described range is effective in terms of the evenness of the thickness of the coating film or liquid saving properties and the solubility of the surfactant in the photosensitive composition is also good.

Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. Examples of a commercially available product of the fluorine-based surfactant include MEGAFACE F171, F172, F173, F176, F177, F141, F142, F143, F144, $R^{30}$, F437, F475, F479, F482, F554, F780, EXP, and MFS-330 (all of which are manufactured by DIC Corporation), FLUORAD FC430, FC431, and FC171 (all of which are manufactured by Sumitomo 3M), SURFLON S-382, SC-101, SC-103, SC-104, SC-105. SC-1068, SC-381, SC-383, and S-393, and KH-40 (all of which are manufactured by Asahi Glass Co., Ltd.), and PolyFox PF636, PF656, PF6320, PF6520, and PF7002 (all of which are manufactured by OMNOVA).

In addition, as the fluorine-based surfactant, an acrylic compound, which has a molecular structure having a functional group containing a fluorine atom and in which, by applying heat to the molecular structure, the functional group containing a fluorine atom is broken to volatilize a fluorine atom, can also be suitably used. Examples of such a fluorine-based surfactant include MEGAFACE DS series manufactured by DIC Corporation (The Chemical Daily, Feb. 22, 2016; Nikkei Business Daily, Feb. 23, 2016) such as MEGAFACE DS-21.

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant. With regard to such a fluorine-based surfactant, reference can be made to the description in JP2016-216602A, the contents of which are incorporated herein by reference.

A block polymer can also be used as the fluorine-based surfactant. Examples thereof include the compounds described in JP2011-089090A. As the fluorine-based surfactant, a fluorine-containing polymer compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups) can also be preferably used. The following compounds are also exemplified as the fluorine-based surfactant used in the present invention.

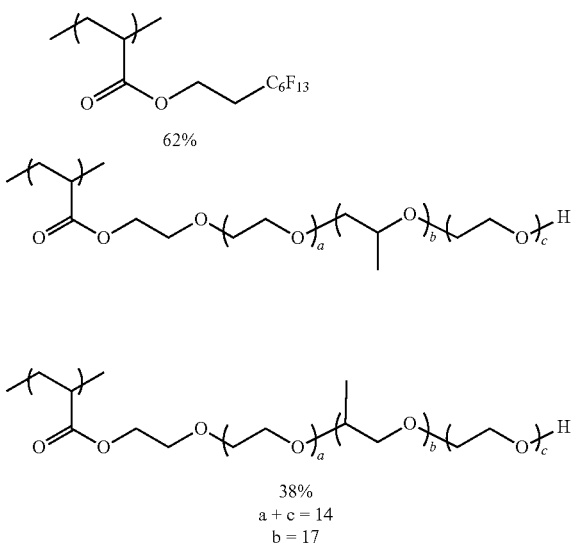

The weight-average molecular weight of the above-described compound is preferably 3000 to 50000, and is, for example, 14000. In the compound, "%" representing the proportion of a repeating unit is mol %.

In addition, as the fluorine-based surfactant, a fluorine-containing polymer having an ethylenically unsaturated bonding group in the side chain can also be used. Specific examples thereof include the compounds described in paragraph Nos. 0050 to 0090 and paragraph Nos. 0289 to 0295 of JP2010-164965A, and for example, MEGAFACE RS-101, RS-102, RS-718K, and RS-72-K manufactured by DIC Corporation. As the fluorine-based surfactant, the compounds described in paragraph Nos. 0015 to 0158 of JP2015-117327A can also be used.

Examples of the nonionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC $L^{10}$, L31, L61, L62, 10R5, 17R2, and 25R2 (manufactured by BASF), TETRONIC 304, 701, 704, 901, 904, and 150R1 (manufactured by BASF), SOLSPERSE 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), and OLFINE E1010, and SURFYNOL 104, 400, and 440 (manufactured by Nissin Chemical Industry Co., Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), TSF-4440, TSF-4300, TSF-4445, TSF-4460, and TSF-4452 (all of which are manufactured by Momentive Performance Materials Co., Ltd.), KP-341, KF-6001, and KF-6002 (all of which are manufactured by Shin-Etsu Chemical Co., Ltd.), and BYK307, BYK323, and BYK330 (all of which are manufactured by BYK Chemie).

The content of the surfactant in the total solid content of the photosensitive composition is preferably 0.001% by mass to 5.0% by mass and more preferably 0.005% to 3.0% by mass. The surfactant may be used singly or in combination of two or more kinds thereof. In a case of using two or more kinds thereof, the total amount thereof is preferably within the above-described range.

<<Ultraviolet Absorber>>

The photosensitive composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Specific examples of the ultraviolet absorber include a compound having the following structures. Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016).

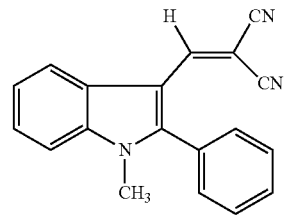

-continued

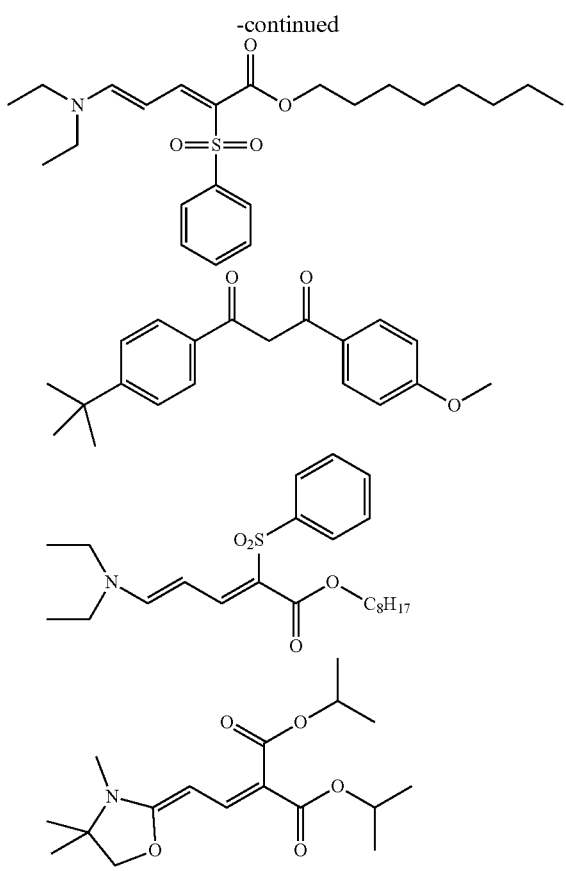

The content of the ultraviolet absorber in the total solid content of the photosensitive composition is preferably 0.01% to 10% by mass and more preferably 0.01% to 5% by mass. In the present invention, the ultraviolet absorber may be used singly or in combination of two or more kinds thereof. In a case where two or more kinds thereof are used, it is preferable that the total amount thereof is within the above-described range.

<<Antioxidant>>

The photosensitive composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of a commercially available product of the antioxidant include ADK STAB AO-20, ADK STAB AO-30, ADK STAB AO-40, ADK STAB AO-50, ADK STAB AO-50F, ADK STAB AO-60, ADK STAB AO-60G, ADK STAB AO-80, and ADK STAB AO-330 (all of which are manufactured by ADEKA Corporation).

The content of the antioxidant in the total solid content of the photosensitive composition is preferably 0.01% to 20% by mass and more preferably 0.3% to 15% by mass.

The antioxidant may be used singly or in combination of two or more kinds thereof. In a case where two or more kinds thereof are used, it is preferable that the total amount thereof is within the above-described range.

<<Other Components>>

Optionally, the photosensitive composition according to the embodiment of the present invention may further contain a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference.

In addition, as desired, the photosensitive composition according to the embodiment of the present invention may contain a potential antioxidant. Examples of the potential antioxidant include a compound in which a site functioning as an antioxidant is protected by a protecting group, and the protecting group is eliminated by heating the compound at 100° C. to 250° C. or heating the compound at 80° C. to 200° C. in the presence of an acid or basic catalyst so that the compound functions as an antioxidant. Examples of the potential antioxidant include the compounds described in WO2014/021023A, WO2017/030005A, and JP2017-008219A. Examples of a commercially available product thereof include ADEKA ARKLS GPA-5001 (manufactured by ADEKA Corporation).

In addition, in order to adjust the refractive index of the film to be obtained, the photosensitive composition according to the embodiment of the present invention may contain a metal oxide. Examples of the metal oxide include $TiO_2$, $ZrO_2$, $Al_2O_3$, and $SiO_2$. The primary particle diameter of the metal oxide is preferably 1 to 100 nm, more preferably 3 to 70 nm, and most preferably 5 to 50 nm. The metal oxide may have a core-shell structure, and in this case, the core portion may be hollow.

In addition, the photosensitive composition according to the embodiment of the present invention may include a light-resistance improver. Examples of the light-resistance improver include the compounds described in paragraph Nos. 0036 and 0037 of JP2017-198787A, the compounds described in paragraph Nos 0029 to 0034 of JP2017-146350A, the compounds described in paragraph Nos. 0036 and 0037, and 0049 to 0052 of JP2017-129774A, the compounds described in paragraph Nos. 0031 to 0034 and 0058 and 0059 of JP2017-129674A, the compounds described in paragraph Nos. 0036 and 0037, and 0051 to 0054 of JP2017-122803A, the compounds described in paragraph Nos. 0025 to 0039 of WO2017/164127A, the compounds described in paragraph Nos. 0034 to 0047 of JP2017-186546A, the compounds described in paragraph Nos. 0019 to 0041 of JP2015-025116A, the compounds described in paragraph Nos. 0101 to 0125 of JP2012-145604A, the compounds described in paragraph Nos. 0018 to 0021 of JP2012-103475A, the compounds described in paragraph Nos. 0015 to 0018 of JP2011-257591A, the compounds described in paragraph Nos. 0017 to 0021 of JP2011-191483A, the compounds described in paragraph Nos. 0108 to 0116 of JP2011-145668A, and the compounds described in paragraph Nos. 0103 to 0153 of JP2011-253174A.

For example, in a case where a film is formed by coating, the viscosity (25° C.) of the photosensitive composition according to the embodiment of the present invention is preferably 1 to 100 mPa·s. The lower limit is more preferably 2 mPa·s or more and still more preferably 3 mPa·s or more. The upper limit is more preferably 50 mPa·s or less, still more preferably 30 mPa·s or less, and particularly preferably 15 mPa·s or less.

In the photosensitive composition according to the embodiment of the present invention, the content of free metal which is not bonded to or coordinated with a pigment or the like is preferably 100 ppm or less, more preferably 50 ppm or less, and still more preferably 10 ppm or less, it is particularly preferable to not contain the free metal substantially. According to this aspect, the effects described in JP2012-153796A, JP2000-345085A, JP2005-200560A, JP1997-043620A (JP-H08-043620A), JP2004-145078A, JP2014-119487A, JP2010-083997A, JP2017-090930A, JP2018-025612A, JP2018-025797A, JP2017-155228A, JP2018-036521A, and the like can be obtained. Examples of the types of the above-described free metals include Na, K, Ca, Sc, Ti, Mn, Cu, Zn, Fe, Cr, Co, Mg, Al, Sn, Zr, Ga, Ge, Ag, Au, Pt, Cs, and Bi. In addition, in the photosensitive composition according to the embodiment of the present invention, the content of free halogen which is not bonded to or coordinated with a pigment or the like is preferably 100 ppm or less, more preferably 50 ppm or less, and still more preferably 10 ppm or less, it is particularly preferable to not contain the free halogen substantially. Examples of a method for reducing free metals and halogens in the photosensitive composition include washing with ion exchange water, filtration, ultrafiltration, and purification with an ion exchange resin.

<Storage Container>

A storage container for the photosensitive composition according to the embodiment of the present invention is not particularly limited, and a known storage container can be used. In addition, as the storage container, it is also preferable to use a multilayer bottle having an inner wall constituted with six layers from six kinds of resins or a bottle having a 7-layer structure from 6 kinds of resins for the purpose of suppressing incorporation of impurities into raw materials or photosensitive compositions. Examples of such a container include the containers described in JP2015-123351A.

<Method for Preparing Photosensitive Composition>

The photosensitive composition according to the embodiment of the present invention can be prepared by mixing the above-described components. In the preparation of the photosensitive composition, all the components may be dissolved and/or dispersed at the same time in a solvent to prepare the photosensitive composition, or the respective components may be appropriately left in two or more solutions or dispersion liquids and mixed to prepare the photosensitive composition upon use (during coating), as desired.

In addition, in the preparation of the photosensitive composition, a process for dispersing the pigment is preferably included. In the process for dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. With regard to the materials, equipment, treatment conditions, and the like used in the salt milling step, reference can be made to, for example, the description in JP2015-194521A and JP2012-046629A.

It is preferable that, in the preparation of the photosensitive composition, the photosensitive composition is filtered through a filter for the purpose of removing foreign matters, reducing defects, or the like. As the filter, any filters that have been used in the related art for filtration use and the like may be used without particular limitation. Examples of the filter include filters formed of materials including, for example, a fluororesin such as polytetrafluoroethylene (PTFE), a polyamide-based resin such as nylon (for example, nylon-6 and nylon-6,6), and a polyolefin resin (including a polyolefin resin having a high-density or an ultrahigh molecular weight) such as polyethylene and polypropylene (PP). Among these materials, polypropylene (including a high-density polypropylene) and nylon are preferable.

The pore size of the filter is preferably 0.01 to 7.0 μm, more preferably 0.01 to 3.0 μm, and still more preferably 0.05 to 0.5 μm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd.

In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

<Film>

The film according to an embodiment of the present invention is a film obtained from the photosensitive composition according to the embodiment of the present invention. The film according to the embodiment of the present invention can be used for a color filter, a near-infrared transmission filter, a near-infrared cut filter, a black matrix, a light-shielding film, a refractive index adjusting film, and the like. For example, the film according to an embodiment of the present invention can be preferably used as a colored layer of a color filter.

The thickness of the film according to the embodiment of the present invention can be adjusted according to the purpose. For example, the film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more.

<Method for Producing Film>

The film according to the embodiment of the present invention can be produced through a step of applying the photosensitive composition according to the embodiment of the present invention on a support. The method for producing the film according to the embodiment of the present invention preferably further includes a step of forming a pattern (pixel). A photolithography method is preferable as a method of forming a pattern (pixel).

Pattern formation by the photolithography method preferably includes a step of forming a photosensitive composition layer on a support with the photosensitive composition according to the embodiment of the present invention, a step of patternwise exposing the photosensitive composition layer, and a step of removing an unexposed area of the photosensitive composition layer by development to form a pattern (pixel). A step (pre-baking step) of baking the photosensitive composition layer and a step (post-baking step) of baking the developed pattern (pixel) may be provided, as desired.

<<Step of Forming Photosensitive Composition Layer>>

In the step of forming a photosensitive composition layer, the photosensitive composition layer is formed on a support using the photosensitive composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, an undercoat layer may be provided on the silicon substrate so as to improve adhesiveness to an upper layer, prevent the diffusion of materials, or planarize the surface of the substrate.

As a method for applying the photosensitive composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprint method. A method for applying the ink jet is not particularly limited, and examples thereof include a method described in "Extension of Use of Ink Jet—Infinite Possibilities in Patent—" (February, 2005, S. B. Research Co., Ltd.) (particularly pp. 115 to 133) and methods described in JP2003-262716A, JP2003-185831A, JP2003-261827A, JP2012-126830A, and JP2006-169325A. In addition, with regard to the method for applying the photosensitive composition, reference can be made to the description in WO2017/030174A and WO2017/018419A, the contents of which are incorporated herein by reference.

The photosensitive composition layer formed on the support may be dried (pre-baked). In a case of producing a film by a low-temperature process, pre-baking may not be performed. In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. The pre-baking can be performed using a hot plate, an oven, or the like.

<<Exposing Step>>

Next, the photosensitive composition layer is patternwise exposed (exposing step). For example, the photosensitive composition layer can be subjected to patternwise exposure by performing exposure using a stepper exposure machine or a scanner exposure machine through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the photosensitive composition layer may be irradiated with light continuously to expose the photosensitive composition layer, or the photosensitive composition layer may be irradiated with light in a pulse to expose the photosensitive composition layer (pulse exposure). The pulse exposure refers to an exposing method in which light irradiation and resting are repeatedly performed in a short cycle (for example, millisecond-level or less). In a case of the pulse exposure, the pulse width is preferably 100 nanoseconds (ns) or less, more preferably 50 nanoseconds or less, and still more preferably 30 nanoseconds or less. The lower limit of the pulse width is not particularly limited, and may be 1 femtosecond (fs) or more or 10 femtoseconds or more. The frequency is preferably 1 kHz or more, more preferably 2 kHz or more, and still more preferably 4 kHz or more. The upper limit of the frequency is preferably 50 kHz or less, more preferably 20 kHz or less, and still more preferably 10 kHz or less. The maximum instantaneous illuminance is preferably 50000000 W/m$^2$ or more, more preferably 100000000 W/m$^2$ or more, and still more preferably 200000000 W/m$^2$ or more. In addition, the upper limit of the maximum instantaneous illuminance is preferably 1000000000 W/m$^2$ or less, more preferably 800000000 W/m$^2$ or less, and still more preferably 500000000 W/m$^2$ or less. The pulse width refers to a time during which light is irradiated in a pulse period. In addition, the frequency refers to the number of pulse periods per second. In addition, the maximum instantaneous illuminance refers to an average illuminance within the period of light irradiation in the pulse period. In addition, the pulse period refers to a period in which light irradiation and resting in the pulse exposure are defined as one cycle.

The irradiation dose (exposure dose) is, for example, preferably 0.03 to 2.5 J/cm$^2$ and more preferably 0.05 to 1.0 J/cm$^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 W/m$^2$ to 100000 W/m$^2$ (for example, 5000 W/m$^2$, 15000 W/m$^2$, or 35000 W/m$^2$). Appropriate conditions of each of the oxygen concentration and the exposure illuminance may be combined, and for example, a combination of the oxygen concentration of 10% by volume and the illuminance of 10000 W/m$^2$, a combination of the oxygen concentration of 35% by volume and the illuminance of 20000 W/m$^2$, or the like is available.

<<Developing Step>>

Next, the unexposed area of the photosensitive composition layer is removed by development to form a pattern (pixel). The removal of the unexposed area of the photosensitive composition layer by development can be carried out using a developer. Thus, the photosensitive composition layer of the unexposed area in the exposing step is eluted into the developer, and as a result, only a photocured portion remains. As the developer, an organic alkaline developer causing no damage on a base of element, circuit, or the like is desirable. The temperature of the developer is preferably, for example, 20° C. to 30° C. The development time is preferably 20 to 180 seconds. In addition, in order to improve residue removing properties, a step of removing the developer by shaking off per 60 seconds and supplying a fresh developer may be repeated multiple times.

As the developer, an aqueous alkaline solution (alkaline developer) obtained by diluting an alkali agent with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl)ammonium hydroxide, choline, pyrrole, piperidine, and 1,8-diazabicyclo[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the aqueous alkaline solution is preferably 0.001% to 10% by mass and more preferably 0.01% to 1% by mass. In addition, the developer may further contain a surfactant. Examples of the surfactant include the surfactants described above, and the surfactant is preferably a nonionic surfactant. From the viewpoint of transportation, storage, and the like, the developer may be first produced as a concentrated liquid and then diluted to a concentration required upon the use. The dilution ratio is not particularly limited, and can beset to, for example, a range of 1.5 to 100 times. In addition, it is also preferable to wash (rinse) with pure water after development. In addition, it is preferable that the rinsing is performed by supplying a rinsing liquid to the photosensitive composition layer after development while rotating the support on which the photosensitive composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a heating treatment after development in order to complete curing, and the heating temperature is preferably, for example, 100° C. to 240° C. and more preferably 200° C. to 240° C. The post-baking can be performed continuously or batchwise by using a heating unit such as a hot plate, a convection oven (hot-air circulating dryer), and a high-frequency heater so that the film after development satisfies the conditions.

In a case of carrying out the additional exposure treatment, light used for the exposure is preferably light having a wavelength of 400 nm or less. In addition, the additional exposure treatment may be carried out by the method described in KR10-2017-122130A.

The width of the pixel is preferably 0.5 to 20.0 µm. The lower limit is preferably 1.0 µm or more and more preferably 2.0 µm or more. The upper limit is preferably 15.0 µm or less and more preferably 10.0 µm or less.

The Young's modulus of the pixel is preferably 0.5 to 20 GPa and more preferably 2.5 to 15 GPa.

It is preferable that the pixel has high flatness. Specifically, the surface roughness Ra of the pixel is preferably 100 nm or less, more preferably 40 nm or less, and still more preferably 15 nm or less. The lower limit is not specified, but is preferably, for example, 0.1 nm or more. The surface roughness can be measured, for example, using an atomic force microscope (AFM) Dimension 3100 manufactured by Veeco Instruments, Inc.

In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.).

It is desired that the volume resistivity value of the pixel is high. Specifically, the volume resistivity value of the pixel is preferably $10^9$ Ω·cm or more and more preferably $10^{11}$ Ω·cm or more. The upper limit is not specified, but is preferably, for example, $10^4$ Ω·cm or less. The volume resistivity value of the pixel can be measured, for example, using an ultra-high resistance meter 5410 (manufactured by Advantest Corporation).

<Color Filter>

Next, the color filter according to an embodiment of the present invention will be described. The color filter according to the embodiment of the present invention has the film according to the embodiment of the present invention. In a case where the film according to the embodiment of the present invention is used for a color filter, as the pigment, it is preferable to use a chromatic pigment. In the color filter according to the embodiment of the present invention, the thickness of the film according to the embodiment of the present invention can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more. The color filter according to the embodiment of the present invention can be used for a solid-state imaging element such as a charge coupled device (CCD) and a complementary metal-oxide semiconductor (CMOS), an image display device, or the like.

In addition, in the color filter according to the embodiment of the present invention, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, infrared rays, and the like) having a specific wavelength can be imparted. The thickness of the protective layer is preferably 0.01 to 10 μm and still more preferably 0.1 to 5 μm. Examples of a method for forming the protective layer include a method of forming the protective layer by applying a resin composition dissolved in a solvent, a chemical vapor deposition method, and a method of attaching a molded resin with an adhesive. Examples of components constituting the protective layer include a (meth)acrylic resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, a polyol resin, a polyvinylidene chloride resin, a melamine resin, a urethane resin, an aramid resin, a polyamide resin, an alkyd resin, an epoxy resin, a modified silicone resin, a fluorine resin, a polycarbonate resin, a polyacrylonitrile resin, a cellulose resin, Si, C, W, $Al_2O_3$, Mo, $SiO_2$, and $Si_2N_4$, and two or more kinds of these components may be contained. For example, in a case of a protective layer for oxygen shielding, it is preferable that the protective layer contains a polyol resin, $SiO_2$, and $Si_2N_4$. In addition, in a case of a protective layer for low reflection, it is preferable that the protective layer contains a (meth)acrylic resin and a fluororesin.

In a case of forming the protective layer by applying a resin composition, as a method for applying the resin composition, a known method such as a spin coating method, a casting method, a screen printing method, and an inkjet method can be used. As the solvent contained in the resin composition, a known solvent (for example, propylene glycol 1-monomethyl ether 2-acetate, cyclopentanone, ethyl lactate, and the like) can be used. In a case of forming the protective layer by a chemical vapor deposition method, as the chemical vapor deposition method, a known chemical vapor deposition method (thermochemical vapor deposition method, plasma chemical vapor deposition method, and photochemical vapor deposition method) can be used.

The protective layer may contain, as desired, an additive such as organic or inorganic fine particles, an absorber of a specific wavelength (for example, ultraviolet rays, near-infrared rays, infrared rays, and the like), a refractive index adjusting agent, an antioxidant, an adhesive agent, and a surfactant. Examples of the organic or inorganic fine particles include polymer fine particles (for example, silicone resin fine particles, polystyrene fine particles, and melamine resin fine particles), titanium oxide, zinc oxide, zirconium oxide, indium oxide, aluminum oxide, titanium nitride, titanium oxynitride, magnesium fluoride, hollow silica, silica, calcium carbonate, and barium sulfate. As the absorber of a specific wavelength, a known absorber can be used. For example, as an ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. With regard to details thereof, reference can be made to the description in paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. As the infrared absorber, for example, a cyclic tetrapyrrole-based coloring agent, an oxocarbon-based coloring agent, a cyanine based coloring agent, a quaterrylene-based coloring agent, a naphthalocyanine-based coloring agent, a nickel complex-based coloring agent, a copper ion-based coloring agent, an iminium-based coloring agent, a subphthalonine-based coloring agent, a xanthene-based coloring agent, an azo-based coloring agent, a dipyrromethene-based coloring agent, a pyrrolopyrrole-based coloring agent, or the like can be used. With regard to details thereof, reference can be made to the description in paragraph Nos. 0020 to 0072 of JP2018-054760A, JP2009-263614A, and WO2017/146092A, the contents of which are incorporated herein by reference. The content of these additives can be appropriately adjusted, but is preferably 0.1% to 70% by mass and still more preferably 1% to 60% by mass with respect to the total mass of the protective layer.

In addition, as the protective layer, the protective layers described in paragraph Nos. 0073 to 0092 of JP2017-151176A can also be used.

<Solid-State Imaging Element>

The solid-state imaging element according to an embodiment of the present invention has the film according to the embodiment of the present invention. The configuration of the solid-state imaging element according to the embodiment of the present invention is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Furthermore, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. An imaging device including the solid-state imaging element according to the embodiment of the present invention can also be used as a vehicle camera or a monitoring camera, in addition to a digital camera or electronic equipment (mobile phones or the like) having an imaging function.

<Image Display Device>

The image display device according to an embodiment of the present invention has the film according to the embodiment of the present invention. Examples of the image display device include a liquid crystal display device or an organic electroluminescence display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

EXAMPLES

Hereinafter, the present invention will be described in more detail with reference to the examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below.

<Preparation of Dispersion Liquid>

A pigment (G pigment (green pigment): 8.29 parts by mass, Y pigment (yellow pigment): 2.07 parts by mass) shown in the following tables, a derivative shown in the following tables, a dispersant shown in the following tables, and 71.92 parts by mass of a solvent shown in the following tables were mixed. Thereafter, 230 parts by mass of zirconia beads having a diameter of 0.3 mm were added thereto to perform a dispersion treatment for 5 hours using a paint shaker, and the beads were separated by filtration to produce a dispersion liquid. The numerical values described in the following tables indicate parts by mass.

TABLE 2

| | Pigment | | Derivative | | Dispersant | | |
|---|---|---|---|---|---|---|---|
| | G pigment | Y pigment | Type | Parts by mass | Type | Parts by mass | Solvent Type |
| Dispersion liquid-1 | PG-36 | PY-185 | C-1 | 1.03 | P-1 | 15.12 | PGMEA |
| Dispersion liquid-2 | PG-36 | PY-185 | C-2 | 1.03 | P-1 | 15.12 | PGMEA |
| Dispersion liquid-3 | PG-36 | PY-185 | C-3 | 1.03 | P-1 | 15.12 | PGMEA |
| Dispersion liquid-4 | PG-36 | PY-185 | C-4 | 1.03 | P-1 | 15.12 | PGMEA |
| Dispersion liquid-5 | PG-36 | PY-185 | C-5 | 1.03 | P-1 | 15.12 | PGMEA |
| Dispersion liquid-6 | PG-36 | PY-185 | C-6 | 1.03 | P-1 | 15.12 | PGMEA |
| Dispersion liquid-7 | PG-36 | PY-185 | C-7 | 1.03 | P-1 | 15.12 | PGMEA |
| Dispersion liquid-8 | PG-36 | PY-185 | C-8 | 1.03 | P-1 | 15.12 | PGMEA |
| Dispersion liquid-9 | PG-36 | PY-185 | C-9 | 1.03 | P-1 | 15.12 | PGMEA |
| Dispersion liquid-10 | PG-36 | PY-185 | C-10 | 1.03 | P-1 | 15.12 | PGMEA |
| Dispersion liquid-11 | PG-36 | PY-185 | C-11 | 1.03 | P-1 | 15.12 | PGMEA |
| Dispersion liquid-12 | PG-36 | PY-185 | C-12 | 1.03 | P-1 | 15.12 | PGMEA |
| Dispersion liquid-13 | PG-36 | PY-185 | C-13 | 1.03 | P-1 | 15.12 | PGMEA |
| Dispersion liquid-14 | PG-36 | PY-185 | C-14 | 1.03 | P-1 | 15.12 | PGMEA |
| Dispersion liquid-15 | PG-36 | PY-185 | C-15 | 1.03 | P-1 | 15.12 | PGMEA |
| Dispersion liquid-16 | PG-36 | PY-185 | C-16 | 1.03 | P-1 | 15.12 | PGMEA |
| Dispersion liquid-17 | PG-36 | PY-185 | C-17 | 1.03 | P-1 | 15.12 | PGMEA |
| Dispersion liquid-18 | PG-36 | PY-185 | C-18 | 1.03 | P-1 | 15.12 | PGMEA |
| Dispersion liquid-19 | PG-36 | PY-185 | C-19 | 1.03 | P-1 | 15.12 | PGMEA |
| Dispersion liquid-20 | PG-36 | PY-185 | C-20 | 1.03 | P-1 | 15.12 | PGMEA |
| Dispersion liquid-21 | PG-36 | PY-185 | C-21 | 1.03 | P-1 | 15.12 | PGMEA |
| Dispersion liquid-22 | PG-36 | PY-185 | C-22 | 1.03 | P-1 | 15.12 | PGMEA |
| Dispersion liquid-23 | PG-36 | PY-185 | C-23 | 1.03 | P-1 | 15.12 | PGMEA |
| Dispersion liquid-24 | PG-36 | PY-185 | C-24 | 1.03 | P-1 | 15.12 | PGMEA |
| Dispersion liquid-25 | PG-36 | PY-185 | C-28 | 1.03 | P-1 | 15.12 | PGMEA |
| Dispersion liquid-26 | PG-36 | PY-185 | C-29 | 1.03 | P-1 | 15.12 | PGMEA |
| Dispersion liquid-27 | PG-36 | PY-185 | C-31 | 1.03 | P-1 | 15.12 | PGMEA |
| Dispersion liquid-28 | PG-36 | PY-185 | C-32 | 1.03 | P-1 | 15.12 | PGMEA |
| Dispersion liquid-29 | PG-36 | PY-185 | C-33 | 1.03 | P-1 | 15.12 | PGMEA |
| Dispersion liquid-30 | PG-36 | PY-185 | C-34 | 1.03 | P-1 | 15.12 | PGMEA |
| Dispersion liquid-31 | PG-36 | PY-185 | C-35 | 1.03 | P-1 | 15.12 | PGMEA |
| Dispersion liquid-32 | PG-36 | PY-185 | C-36 | 1.03 | P-1 | 15.12 | PGMEA |
| Dispersion liquid-33 | PG-36 | PY-185 | C-37 | 1.03 | P-1 | 15.12 | PGMEA |
| Dispersion liquid-34 | PG-36 | PY-185 | C-38 | 1.03 | P-1 | 15.12 | PGMEA |

TABLE 2-continued

| | Pigment | | Derivative | | Dispersant | | |
| --- | --- | --- | --- | --- | --- | --- | --- |
| | G pigment | Y pigment | Type | Parts by mass | Type | Pars by mass | Solvent Type |
| Dispersion liquid-35 | PG-36 | PY-185 | C-39 | 1.03 | P-1 | 15.12 | PGMEA |
| Dispersion liquid-36 | PG-36 | PY-185 | C-40 | 1.03 | P-1 | 15.12 | PGMEA |
| Dispersion liquid-37 | PG-36 | PY-185 | C-41 | 1.03 | P-1 | 15.12 | PGMEA |
| Dispersion liquid-38 | PG-36 | PY-185 | C-42 | 1.03 | P-1 | 15.12 | PGMEA |
| Dispersion liquid-39 | PG-36 | PY-185 | C-43 | 1.03 | P-1 | 15.12 | PGMEA |
| Dispersion liquid-40 | PG-36 | PY-185 | C-44 | 1.03 | P-1 | 15.12 | PGMEA |

TABLE 3

| | Pigment | | Derivative | | Dispersant | | |
| --- | --- | --- | --- | --- | --- | --- | --- |
| | G pigment | Y pigment | Type | Parts by mass | Type | Pars by mass | Solvent Type |
| Dispersion liquid-41 | PG-36 | PY-185 | C-45 | 1.03 | P-1 | 15.12 | PGMEA |
| Dispersion liquid-42 | PG-36 | PY-185 | C-46 | 1.03 | P-1 | 15.12 | PGMEA |
| Dispersion liquid-43 | PG-36 | PY-185 | C-47 | 1.03 | P-1 | 15.12 | PGMEA |
| Dispersion liquid-44 | PG-36 | PY-185 | C-48 | 1.03 | P-1 | 15.12 | PGMEA |
| Dispersion liquid-45 | PG-36 | PY-185 | C-49 | 1.03 | P-1 | 15.12 | PGMEA |
| Dispersion liquid-46 | PG-36 | PY-185 | C-50 | 1.03 | P-1 | 15.12 | PGMEA |
| Dispersion liquid-47 | PG-36 | PY-185 | C-51 | 1.03 | P-1 | 15.12 | PGMEA |
| Dispersion liquid-48 | PG-36 | PY-185 | C-52 | 1.03 | P-1 | 15.12 | PGMEA |
| Dispersion liquid-49 | PG-36 | PY-185 | C-53 | 1.03 | P-1 | 15.12 | PGMEA |
| Dispersion liquid-50 | PG-36 | PY-185 | C-54 | 1.03 | P-1 | 15.12 | PGMEA |
| Dispersion liquid-51 | PG-36 | PY-185 | C-55 | 1.03 | P-1 | 15.12 | PGMEA |
| Dispersion liquid-52 | PG-36 | PY-185 | C-56 | 1.03 | P-1 | 15.12 | PGMEA |
| Dispersion liquid-53 | PG-36 | PY-185 | C-57 | 1.03 | P-1 | 15.12 | PGMEA |
| Dispersion liquid-54 | PG-36 | PY-185 | C-58 | 1.03 | P-1 | 15.12 | PGMEA |
| Dispersion liquid-55 | PG-36 | PY-185 | C-59 | 1.03 | P-1 | 15.12 | PGMEA |
| Dispersion liquid-56 | PG-36 | PY-185 | C-60 | 1.03 | P-1 | 15.12 | PGMEA |
| Dispersion liquid-57 | PG-36 | PY-185 | C-61 | 1.03 | P-1 | 15.12 | PGMEA |
| Dispersion liquid-58 | PG-36 | PY-185 | C-62 | 1.03 | P-1 | 15.12 | PGMEA |
| Dispersion liquid-59 | PG-36 | PY-185 | C-63 | 1.03 | P-1 | 15.12 | PGMEA |
| Dispersion liquid-60 | PG-36 | PY-185 | C-64 | 1.03 | P-1 | 15.12 | PGMEA |
| Dispersion liquid-61 | PG-36 | PY-185 | C-65 | 1.03 | P-1 | 15.12 | PGMEA |
| Dispersion liquid-62 | PG-36 | PY-185 | C-66 | 1.03 | P-1 | 15.12 | PGMEA |
| Dispersion liquid-63 | PG-36 | PY-185 | C-67 | 1.03 | P-1 | 15.12 | PGMEA |
| Dispersion liquid-64 | PG-36 | PY-185 | C-68 | 1.03 | P-1 | 15.12 | PGMEA |

TABLE 3-continued

| | Pigment | | Derivative | | Dispersant | | |
| --- | --- | --- | --- | --- | --- | --- | --- |
| | G pigment | Y pigment | Type | Parts by mass | Type | Pars by mass | Solvent Type |
| Dispersion liquid-65 | PG-36 | PY-185 | C-69 | 1.03 | P-1 | 15.12 | PGMEA |
| Dispersion liquid-66 | PG-36 | PY-185 | C-70 | 1.03 | P-1 | 15.12 | PGMEA |
| Dispersion liquid-67 | PG-36 | PY-185 | C-71 | 1.03 | P-1 | 15.12 | PGMEA |
| Dispersion liquid-68 | PG-36 | PY-185 | C-72 | 1.03 | P-1 | 15.12 | PGMEA |
| Dispersion liquid-69 | PG-36 | PY-185 | C-73 | 1.03 | P-1 | 15.12 | PGMEA |
| Dispersion liquid-70 | PG-36 | PY-185 | C-74 | 1.03 | P-1 | 15.12 | PGMEA |
| Dispersion liquid-71 | PG-36 | PY-185 | C-75 | 1.03 | P-1 | 15.12 | PGMEA |
| Dispersion liquid-72 | PG-36 | PY-185 | C-76 | 1.03 | P-1 | 15.12 | PGMEA |
| Dispersion liquid-73 | PG-36 | PY-185 | C-77 | 1.03 | P-1 | 15.12 | PGMEA |
| Dispersion liquid-74 | PG-36 | PY-185 | C-78 | 1.03 | P-1 | 15.12 | PGMEA |
| Dispersion liquid-75 | PG-36 | PY-185 | C-79 | 1.03 | P-1 | 15.12 | PGMEA |
| Dispersion liquid-76 | PG-36 | PY-185 | C-81 | 1.03 | P-1 | 15.12 | PGMEA |
| Dispersion liquid-77 | PG-36 | PY-185 | C-82 | 1.03 | P-1 | 15.12 | PGMEA |
| Dispersion liquid-78 | PG-36 | PY-185 | C-83 | 1.03 | P-1 | 15.12 | PGMEA |
| Dispersion liquid-79 | PG-36 | PY-185 | C-84 | 1.03 | P-1 | 15.12 | PGMEA |
| Dispersion liquid-80 | PG-36 | PY-185 | C-85 | 1.03 | P-1 | 15.12 | PGMEA |

TABLE 4

| | Pigment | | Derivative | | Dispersant | | |
| --- | --- | --- | --- | --- | --- | --- | --- |
| | G pigment | Y pigment | Type | Parts by mass | Type | Pars by mass | Solvent Type |
| Dispersion liquid-81 | PG-36 | PY-185 | C-87 | 1.03 | P-1 | 15.12 | PGMEA |
| Dispersion liquid-82 | PG-36 | PY-185 | C-88 | 1.03 | P-1 | 15.12 | PGMEA |
| Dispersion liquid-83 | PG-36 | PY-185 | C-89 | 1.03 | P-1 | 15.12 | PGMEA |
| Dispersion liquid-84 | PG-36 | PY-185 | C-90 | 1.03 | P-1 | 15.12 | PGMEA |
| Dispersion liquid-85 | PG-36 | PY-185 | C-91 | 1.03 | P-1 | 15.12 | PGMEA |
| Dispersion liquid-86 | PG-36 | PY-185 | C-92 | 1.03 | P-1 | 15.12 | PGMEA |
| Dispersion liquid-87 | PG-36 | PY-185 | C-93 | 1.03 | P-1 | 15.12 | PGMEA |
| Dispersion liquid-88 | PG-36 | PY-185 | C-94 | 1.03 | P-1 | 15.12 | PGMEA |
| Dispersion liquid-89 | PG-36 | PY-185 | C-95 | 1.03 | P-1 | 15.12 | PGMEA |
| Dispersion liquid-90 | PG-36 | PY-185 | C-96 | 1.03 | P-1 | 15.12 | PGMEA |
| Dispersion liquid-91 | PG-36 | PY-185 | C-97 | 1.03 | P-1 | 15.12 | PGMEA |
| Dispersion liquid-92 | PG-36 | PY-185 | C-98 | 1.03 | P-1 | 15.12 | PGMEA |
| Dispersion liquid-93 | PG-36 | PY-185 | C-99 | 1.03 | P-1 | 15.12 | PGMEA |
| Dispersion liquid-94 | PG-58 | PY-185 | C-31 | 1.03 | P-1 | 15.12 | PGMEA |

TABLE 4-continued

|  | Pigment | | Derivative | | Dispersant | | |
|---|---|---|---|---|---|---|---|
|  | G pigment | Y pigment | Type | Parts by mass | Type | Parts by mass | Solvent Type |
| Dispersion liquid-95 | SQ-1 | PY-185 | C-31 | 1.03 | P-1 | 15.12 | PGMEA |
| Dispersion liquid-96 | PG-36 | PY-139 | C-31 | 1.03 | P-1 | 15.12 | PGMEA |
| Dispersion liquid-97 | PG-36 | PY-150 | C-31 | 1.03 | P-1 | 15.12 | PGMEA |
| Dispersion liquid-98 | PG-58 | PY-185 | C-35 | 1.03 | P-1 | 15.12 | PGMEA |
| Dispersion liquid-99 | SQ-1 | PY-185 | C-35 | 1.03 | P-1 | 15.12 | PGMEA |
| Dispersion liquid-100 | PG-36 | PY-139 | C-35 | 1.03 | P-1 | 15.12 | PGMEA |
| Dispersion liquid-101 | PG-36 | PY-150 | C-35 | 1.03 | P-1 | 15.12 | PGMEA |
| Dispersion liquid-102 | PG-58 | PY-185 | C-36 | 1.03 | P-1 | 15.12 | PGMEA |
| Dispersion liquid-103 | SQ-1 | PY-185 | C-36 | 1.03 | P-1 | 15.12 | PGMEA |
| Dispersion liquid-104 | PG-36 | PY-139 | C-36 | 1.03 | P-1 | 15.12 | PGMEA |
| Dispersion liquid-105 | PG-36 | PY-150 | C-36 | 1.03 | P-1 | 15.12 | PGMEA |
| Dispersion liquid-106 | PG-58 | PY-185 | C-47 | 1.03 | P-1 | 15.12 | PGMEA |
| Dispersion liquid-107 | SQ-1 | PY-185 | C-47 | 1.03 | P-1 | 15.12 | PGMEA |
| Dispersion liquid-108 | PG-36 | PY-139 | C-47 | 1.03 | P-1 | 15.12 | PGMEA |
| Dispersion liquid-109 | PG-36 | PY-150 | C-47 | 1.03 | P-1 | 15.12 | PGMEA |
| Dispersion liquid-110 | PG-58 | PY-185 | C-56 | 1.03 | P-1 | 15.12 | PGMEA |
| Dispersion liquid-111 | SQ-1 | PY-185 | C-56 | 1.03 | P-1 | 15.12 | PGMEA |
| Dispersion liquid-112 | PG-36 | PY-139 | C-56 | 1.03 | P-1 | 15.12 | PGMEA |
| Dispersion liquid-113 | PG-36 | PY-150 | C-56 | 1.03 | P-1 | 15.12 | PGMEA |
| Dispersion liquid-114 | PG-36 | PY-185 | C-35 | 1.03 | P-2 | 15.12 | PGMEA |
| Dispersion liquid-115 | PG-36 | PY-185 | C-35 | 1.03 | P-3 | 15.12 | PGMEA |
| Dispersion liquid-116 | PG-36 | PY-185 | C-35 | 1.03 | P-1 | 11.00 | PGMEA |
| Dispersion liquid-117 | PG-36 | PY-185 | C-36 | 1.03 | P-2 | 15.12 | PGMEA |
| Dispersion liquid-118 | PG-36 | PY-185 | C-36 | 1.03 | P-3 | 15.12 | PGMEA |
| Dispersion liquid-119 | PG-36 | PY-185 | C-36 | 1.03 | P-1 | 11.00 | PGMEA |
| Dispersion liquid-120 | PG-36 | PY-185 | C-47 | 1.03 | P-2 | 15.12 | PGMEA |

TABLE 5

|  | Pigment | | Derivative | | Dispersant | | |
|---|---|---|---|---|---|---|---|
|  | G pigment | Y pigment | Type | Parts by mass | Type | Parts by mass | Solvent Type |
| Dispersion liquid-121 | PG-36 | PY-185 | C-47 | 1.03 | P-3 | 15.12 | PGMEA |
| Dispersion liquid-122 | PG-36 | PY-185 | C-47 | 1.03 | P-1 | 11.00 | PGMEA |
| Dispersion liquid-123 | PG-36 | PY-185 | C-35 | 1.03 | P-1 | 15.12 | PGME |
| Dispersion liquid-124 | PG-36 | PY-185 | C-36 | 1.03 | P-1 | 15.12 | PGME |
| Dispersion liquid-125 | PG-36 | PY-185 | C-47 | 1.03 | P-1 | 15.12 | PGME |
| Dispersion liquid-126 | PG-36 | PY-185 | C-36 / C-93 | 0.53 / 0.50 | P-1 | 15.12 | PGMEA |
| Dispersion liquid-127 | PG-36 | PY-185 | C-36 / C-47 | 0.53 / 0.50 | P-1 | 15.12 | PGMEA |
| Dispersion liquid-128 | PG-36 | PY-185 | C-R1 | 1.03 | P-1 | 15.12 | PGMEA |

Details of the materials indicated by the abbreviations in the above tables are as follows. 239-745

[G Pigment]
PG-36: C. I. Pigment Green 36
PG-58: C. I. Pigment Green 58
SQ-1: compound having the following structure

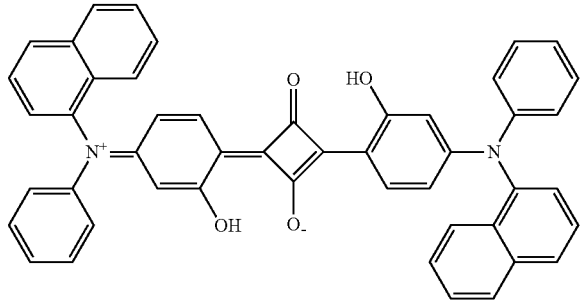

SQ-1

[Y Pigment]
PY-139: C. I. Pigment Yellow 139
PY-150: C. I. Pigment Yellow 150
PY-185: C. I. Pigment Yellow 185
[Derivative] C-1 to C-24, C-28, C-29, C-31 to C-79, and C-81 to C-99: compounds having the structures described in the specific examples of the above-described compound (1)
C-R1: compound having the following structure

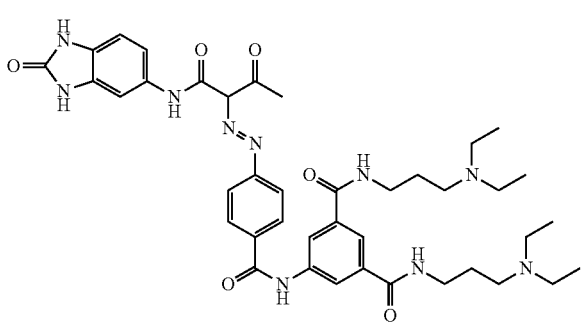 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

In each compound used as the derivative, the maximum value ($\varepsilon$max) of a molar light absorption coefficient in a wavelength range of 400 to 700 nm is as follows. $\varepsilon$max of each compound was measured as follows.

20 mg of each compound was dissolved in 200 mL of methanol, and methanol was added to 2 mL of this solution so as to be 50 mL. The absorbance of this solution was measured in a wavelength range of 200 to 800 nm using Cary 5000 UV-Vis-NIR spectrophotometer (manufactured by Agilent Technologies, Inc.) to calculate εmax. The evaluation results are listed in the following table.

- A: maximum value (εmax) of a molar light absorption coefficient in a wavelength range of 400 to 700 nm was 100 L·mol$^{-1}$·cm$^{-1}$ or less.
- B: maximum value (εmax) of a molar light absorption coefficient in a wavelength range of 400 to 700 nm was more than 100 L·mol$^{-1}$·cm$^{-1}$ and 1000 L·mol$^{-1}$·cm$^{-1}$ or less.
- C: maximum value (εmax) of a molar light absorption coefficient in a wavelength range of 400 to 700 nm was more than 1000 L·mol$^{-1}$·cm$^{-1}$ and 3000 L·mol$^{-1}$·cm$^{-1}$ or less.
- D: maximum value (εmax) of a molar light absorption coefficient in a wavelength range of 400 to 700 nm was more than 3000 L·mol$^{-1}$·cm$^{-1}$.

TABLE 6

| Type of derivative | εmax |
| --- | --- |
| C-1 | A |
| C-2 | B |
| C-3 | A |
| C-4 | A |
| C-5 | A |
| C-6 | B |
| C-7 | A |
| C-8 | A |
| C-9 | A |
| C-10 | A |
| C-11 | A |
| C-12 | A |
| C-13 | A |
| C-14 | A |
| C-15 | A |
| C-16 | B |
| C-17 | A |
| C-18 | A |
| C-19 | A |
| C-20 | C |
| C-21 | A |
| C-22 | A |
| C-23 | A |
| C-24 | A |
| C-28 | B |
| C-29 | B |
| C-31 | A |
| C-32 | A |
| C-33 | B |
| C-34 | C |
| C-35 | C |
| C-36 | A |
| C-37 | A |
| C-38 | A |
| C-39 | A |
| C-40 | A |
| C-41 | A |
| C-42 | A |
| C-43 | A |
| C-44 | A |
| C-45 | A |
| C-46 | A |
| C-47 | A |
| C-48 | A |
| C-49 | A |
| C-50 | C |
| C-51 | B |
| C-52 | A |
| C-53 | A |
| C-54 | A |
| C-55 | A |
| C-56 | B |
| C-57 | B |
| C-58 | B |
| C-59 | B |
| C-60 | A |
| C-61 | A |
| C-62 | A |
| C-63 | A |
| C-64 | A |
| C-65 | A |
| C-66 | A |
| C-67 | A |
| C-68 | A |
| C-69 | A |
| C-70 | A |
| C-71 | A |
| C-72 | A |
| C-73 | A |
| C-74 | A |
| C-75 | A |
| C-76 | A |
| C-77 | A |
| C-78 | A |
| C-79 | A |
| C-81 | A |
| C-82 | A |
| C-83 | A |
| C-84 | A |
| C-85 | A |
| C-87 | A |
| C-88 | A |
| C-89 | A |
| C-90 | A |
| C-91 | A |
| C-92 | A |
| C-93 | A |
| C-94 | A |
| C-95 | A |
| C-96 | A |
| C-97 | A |
| C-98 | A |
| C-99 | A |
| C-R1 | D |

[Dispersant]

P-1: 30% by mass of propylene glycol monomethyl ether acetate (PGMEA) solution of a resin having the following structure. The numerical value described together with the main chain indicates a molar ratio, and the numerical value described together with the side chain indicates the number of repeating units. Mw=20000.

P-2: 30% by mass of PGMEA solution of a resin having the following structure. The numerical value described together with the main chain indicates a molar ratio, and the numerical value described together with the side chain indicates the number of repeating units. Mw=18000.

P-3: 30% by mass of PGMEA solution of a resin having the following structure. The numerical value described together with the main chain indicates a molar ratio, and the numerical value described together with the side chain indicates the number of repeating units. Mw=22000.

(P-1)
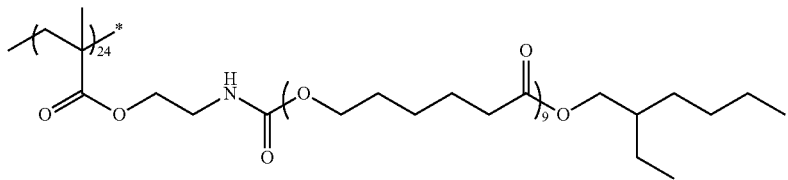
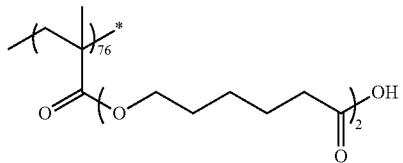
(P-2)
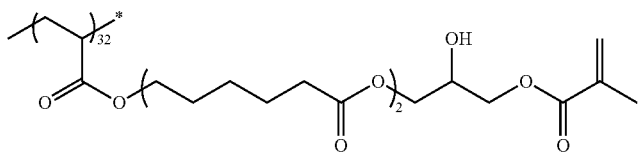
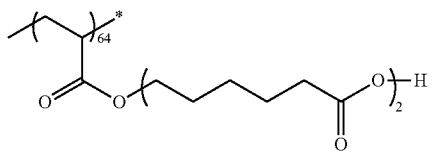
(P-3)
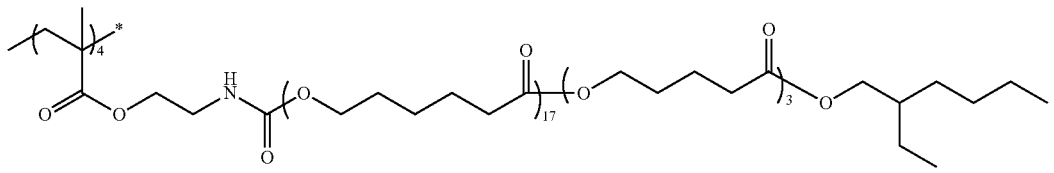
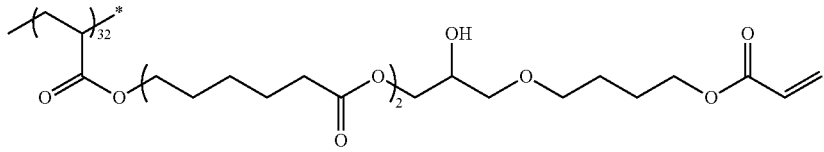
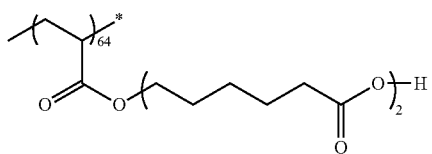
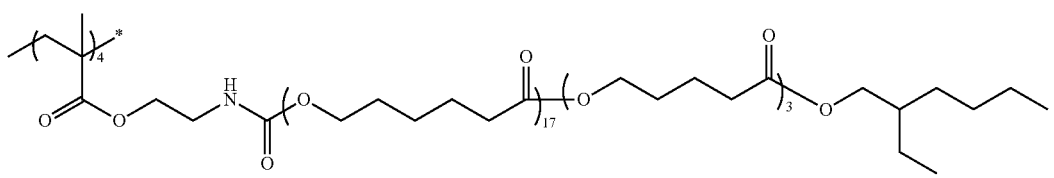

[Solvent]

PGMEA: propylene glycol monomethyl ether acetate

PGME: Propylene glycol monomethyl ether

Examples 1 to 127 and Comparative Example 1

The following raw materials were mixed to prepare a photosensitive composition.

Dispersion liquid of the types shown in the following tables . . . 39.4 parts by mass Resin D1 . . . 0.58 parts by mass Polymerizable compound E1 (KAYARAD DPHA, manufactured by Nippon Kayaku Co., Ltd.) . . . 0.54 parts by mass Photopolymerization initiator F3 . . . 0.33 parts by mass Surfactant H1 . . . 4.17 parts by mass p-methoxyphenol . . . 0.0006 parts by mass PGMEA . . . 7.66 parts by mass Details of the materials indicated by the above abbreviations are as follows.

Resin D1: resin having the following structure. The numerical value described together with the main chain indicates a molar ratio. Mw=11000.

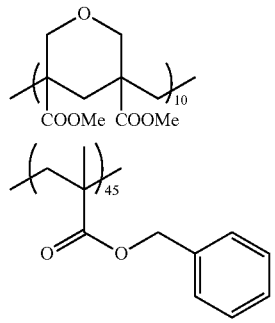

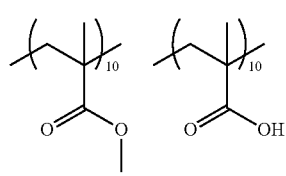

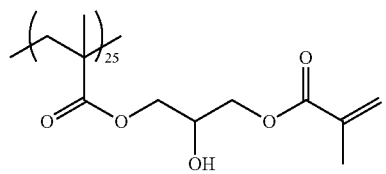

Polymerizable compound E1: KAYARAD DPHA (manufactured by Nippon Kayaku Co., Ltd.)

Photopolymerization initiator F3: compound having the following structure

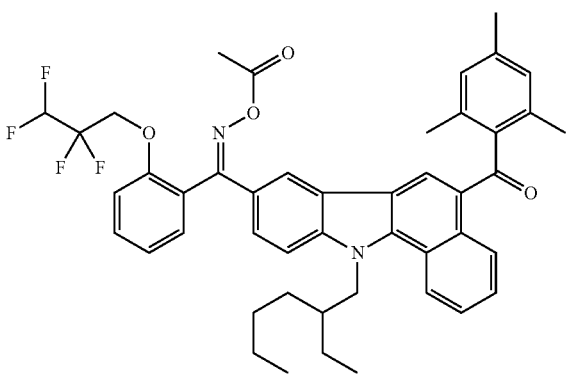 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

Surfactant H1: 1 mass % PGMEA solution of the following mixture (Mw=14000). In the following formula, "%" representing the proportion of a repeating unit is mol %.

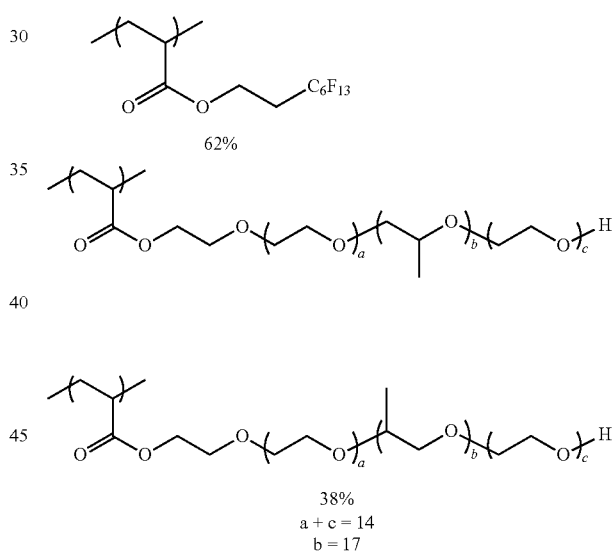

38%
a + c = 14
b = 17

<Evaluation of Storage Stability>

The viscosity of the photosensitive composition obtained as described above was measured by "RE-85L" manufactured by TOKI SANGYO CO., LTD. After that, the photosensitive composition was left to stand under the conditions of 45° C. and 3 days, and then the viscosity thereof was measured again. Storage stability was evaluated according to the following evaluation standard from a viscosity difference (ΔVis) before and after leaving to stand. It can be said that the smaller the numerical value of the viscosity difference (ΔVis), the better the storage stability. The viscosity of the photosensitive composition was measured in a state in which the temperature was adjusted to 25° C. The evaluation standard is as follows, and the evaluation results are shown in the tables below.

[Evaluation Standard]
A: ΔVis was 0.5 mPa·s or less.
B: ΔVis was more than 0.5 mPa·s and 1.0 mPa·s or less.
C: ΔVis was more than 1.0 mPa·s and 2.0 mPa·s or less.
D: ΔVis was more than 2.0 mPa·s.

<Evaluation of Adhesiveness>

An 8-inch (20.32 cm) silicon wafer was coated with CT-4000L (manufactured by FUJIFILM Electronic Materials Co., Ltd.) by using a spin coater so that the thickness after post-baking was 0.1 μm, and then an undercoat layer was formed by heating the silicon wafer at 220° C. for 300 seconds using a hot plate to obtain a silicon wafer (support) with an undercoat layer.

Next, the silicon wafer with an undercoat layer was coated with each photosensitive composition so that the film thickness after post-baking was 0.5 μm. Next, the silicon wafer was post-backed using a hot plate at 100° C. for 2 minutes.

Next, using an i-ray stepper exposure device FPA-3000 i5+ (manufactured by Canon Corporation), exposure was performed with an exposure dose of 200 mJ/cm$^2$ through a mask having a Bayer pattern in which a predetermined pixel (pattern) size was formed. As the mask, a mask having a Bayer pattern in which a pixel pattern is formed in a shape of 0.7 μm square, 0.8 μm square, 0.9 μm square, 1.0 μm square, 1.1 μm square, 1.2 μm square, 1.3 μm square, 1.4 μm square, 1.5 μm square, 1.7 μm square, 2.0 μm square, 3.0 μm square, 5.0 μm square, or 10.0 μm square was used.

Next, puddle development was performed at 23° C. for 60 seconds using a 0.3% by mass of tetramethylammonium hydroxide (TMAH) aqueous solution. Thereafter, rinsing was performed by a spin shower using pure water. Next, a pattern (pixel) was formed by heating at 200° C. for 5 minutes using a hot plate.

Using a high-resolution FEB measuring device (HITACHI CD-SEM) S93801 (manufactured by Hitachi HighTech Corporation.), a pattern of 0.7 μm square, 0.8 μm square, 0.9 μm square, 1.0 μm square, 1.1 μm square, 1.2 μm square, 1.3 μm square, 1.4 μm square, 1.5 μm square, 1.7 μm square, 2.0 μm square, 3.0 μm square, 5.0 μm square, or 10.0 μm square was observed, and the minimum pattern size in which the pattern was formed without peeling was defined as a minimum contact line width. It means that the smaller the minimum contact line width, the better the adhesiveness is.

[Evaluation Standard]
A: minimum contact line width was 1.2 μm square or less.
B: minimum contact line width was more than 1.2 μm square and 1.4 μm square or less.
C: minimum contact line width was more than 1.4 μm square and 1.6 μm square or less.
D: minimum contact line width was more than 1.6 μm square.

<Evaluation of Color Mixing>

A glass wafer with an undercoat layer was coated with the photosensitive compositions of Examples 1 to 127 and Comparative Example 1 so that the film thickness after post-baking was 1.0 μm. Next, the glass wafer with an undercoat layer was heated using a hot plate at 100° C. for 2 minutes. Next, using an i-ray stepper exposure device FPA-3000 i5+(manufactured by Canon Corporation), exposure was performed with light having a wavelength of 365 nm and an exposure dose of 1000 mJ/cm$^2$ through a mask having a dot pattern of 2 μm square. Next, the glass wafer on which the exposed coating film was formed was placed on a horizontal rotary table of a spin-shower developing machine (DW-30 Type, manufactured by Chemitronics Co., Ltd.), and was subjected to a puddle development at 23° C. for 60 seconds using a 60% diluted solution of CD-2000 (manufactured by FUJIFILM Electronic Materials Co., Ltd.) to form a colored pattern on the glass wafer. The glass wafer on which the colored pattern was formed was fixed on the horizontal rotary table by a vacuum chuck method, a rinse treatment was performed by supplying pure water from above a rotation center in shower-like while rotating the glass wafer at a rotation speed of 50 rpm by a rotating device, and then the glass wafer was spray-dried. Furthermore, a heating treatment (post-baking) was performed for 480 seconds using a hot plate at 200° C. to obtain a monochromatic color filter in which a colored pattern (colored pixel) of first layer was formed. The obtained monochromatic color filter having the colored pixel of first layer was coated with a photosensitive composition of Example 144 described later using a spin coater so that the film thickness after post-baking was 1.0 μm, and a heating treatment (pre-baking) was performed for 120 seconds using a hot plate at 100° C. to obtain a laminated color filter in which a second-color photosensitive composition layer (second layer) was formed on the first-layer monochromatic color filter. Next, the obtained laminated color filter was subjected to a development, rinsing, and drying treatment in the same manner as in the formation of the colored pixel of first-layer, and an uncured area of the photosensitive composition layer was removed by development. Using MCPD-3000 (manufactured by OTSUKA ELECTRONICS Co., LTD.), spectral variation (ΔT%max) of the maximum transmittance between a case after the production of the monochromatic color filter in which the colored pixel of first layer was formed, and a case after the removal of the second layer by development was measured, thereby evaluating the residual color mixing of the photosensitive composition of the second layer remaining on the colored pixel formed as the first layer. As the variation is smaller, the residual color mixing hardly occurs, which is more desirable.

[Evaluation Standard]
A: ΔT%max was 1.5% or less.
B: ΔT%max was more than 1.5% and 2.0% or less.
C: ΔT%max was more than 2.0% and 2.5% or less.
D: ΔT%max was more than 2.5%.

TABLE 7

| | Type of dispersion liquid used for composition | Storage stability | Adhesiveness | Color mixing |
|---|---|---|---|---|
| Example 1 | Dispersion liquid-1 | C | A | B |
| Example 2 | Dispersion liquid-2 | C | B | A |
| Example 3 | Dispersion liquid-3 | C | A | B |
| Example 4 | Dispersion liquid-4 | C | A | B |
| Example 5 | Dispersion liquid-5 | C | A | B |
| Example 6 | Dispersion liquid-6 | C | B | A |
| Example 7 | Dispersion liquid-7 | C | A | B |
| Example 8 | Dispersion liquid-8 | C | A | B |
| Example 9 | Dispersion liquid-9 | C | A | B |
| Example 10 | Dispersion liquid-10 | C | A | B |
| Example 11 | Dispersion liquid-11 | C | A | B |
| Example 12 | Dispersion liquid-12 | C | A | B |
| Example 13 | Dispersion liquid-13 | C | B | A |
| Example 14 | Dispersion liquid-14 | C | B | A |
| Example 15 | Dispersion liquid-15 | C | B | A |
| Example 16 | Dispersion liquid-16 | B | B | B |
| Example 17 | Dispersion liquid-17 | C | A | B |
| Example 18 | Dispersion liquid-18 | C | A | B |
| Example 19 | Dispersion liquid-19 | C | A | B |
| Example 20 | Dispersion liquid-20 | B | C | B |
| Example 21 | Dispersion liquid-21 | C | A | B |
| Example 22 | Dispersion liquid-22 | C | A | B |
| Example 23 | Dispersion liquid-23 | C | B | A |
| Example 24 | Dispersion liquid-24 | C | B | A |

TABLE 7-continued

| | Type of dispersion liquid used for composition | Storage stability | Adhesiveness | Color mixing |
|---|---|---|---|---|
| Example 25 | Dispersion liquid-25 | B | B | B |
| Example 26 | Dispersion liquid-26 | B | B | B |
| Example 27 | Dispersion liquid-27 | C | A | B |
| Example 28 | Dispersion liquid-28 | C | A | B |
| Example 29 | Dispersion liquid-29 | A | B | A |
| Example 30 | Dispersion liquid-30 | A | C | A |
| Example 31 | Dispersion liquid-31 | A | C | A |
| Example 32 | Dispersion liquid-32 | A | A | A |
| Example 33 | Dispersion liquid-33 | A | A | A |
| Example 34 | Dispersion liquid-34 | A | A | A |
| Example 35 | Dispersion liquid-35 | A | A | A |
| Example 36 | Dispersion liquid-36 | A | A | A |
| Example 37 | Dispersion liquid-37 | A | A | A |
| Example 38 | Dispersion liquid-38 | A | A | A |
| Example 39 | Dispersion liquid-39 | A | A | A |
| Example 40 | Dispersion liquid-40 | A | A | A |

TABLE 8

| | Type of dispersion liquid used for composition | Storage stability | Adhesiveness | Color mixing |
|---|---|---|---|---|
| Example 41 | Dispersion liquid-41 | A | A | A |
| Example 42 | Dispersion liquid-42 | A | A | A |
| Example 43 | Dispersion liquid-43 | A | A | A |
| Example 44 | Dispersion liquid-44 | A | A | A |
| Example 45 | Dispersion liquid-45 | A | A | A |
| Example 46 | Dispersion liquid-46 | A | C | A |
| Example 47 | Dispersion liquid-47 | A | B | A |
| Example 48 | Dispersion liquid-48 | A | A | A |
| Example 49 | Dispersion liquid-49 | A | A | A |
| Example 50 | Dispersion liquid-50 | A | A | A |
| Example 51 | Dispersion liquid-51 | A | A | A |
| Example 52 | Dispersion liquid-52 | A | B | A |
| Example 53 | Dispersion liquid-53 | A | B | A |
| Example 54 | Dispersion liquid-54 | A | B | A |
| Example 55 | Dispersion liquid-55 | A | B | A |
| Example 56 | Dispersion liquid-56 | A | A | A |
| Example 57 | Dispersion liquid-57 | A | A | A |
| Example 58 | Dispersion liquid-58 | A | A | A |
| Example 59 | Dispersion liquid-59 | A | A | A |
| Example 60 | Dispersion liquid-60 | A | A | A |
| Example 61 | Dispersion liquid-61 | A | A | A |
| Example 62 | Dispersion liquid-62 | A | A | A |
| Example 63 | Dispersion liquid-63 | A | A | A |
| Example 64 | Dispersion liquid-64 | A | A | A |
| Example 65 | Dispersion liquid-65 | A | A | A |
| Example 66 | Dispersion liquid-66 | A | A | A |
| Example 67 | Dispersion liquid-67 | A | A | A |
| Example 68 | Dispersion liquid-68 | A | A | A |
| Example 69 | Dispersion liquid-69 | A | A | A |
| Example 70 | Dispersion liquid-70 | A | A | A |
| Example 71 | Dispersion liquid-71 | A | A | A |
| Example 72 | Dispersion liquid-72 | A | A | A |
| Example 73 | Dispersion liquid-73 | A | A | A |
| Example 74 | Dispersion liquid-74 | A | A | A |
| Example 75 | Dispersion liquid-75 | A | A | A |
| Example 76 | Dispersion liquid-76 | A | A | A |
| Example 77 | Dispersion liquid-77 | A | A | A |
| Example 78 | Dispersion liquid-78 | A | A | A |
| Example 79 | Dispersion liquid-79 | A | A | A |
| Example 80 | Dispersion liquid-80 | A | A | A |

TABLE 9

| | Type of dispersion liquid used for composition | Storage stability | Adhesiveness | Color mixing |
|---|---|---|---|---|
| Example 81 | Dispersion liquid-81 | C | A | C |
| Example 82 | Dispersion liquid-82 | C | A | C |
| Example 83 | Dispersion liquid-83 | C | A | C |
| Example 84 | Dispersion liquid-84 | C | A | C |

TABLE 9-continued

| | Type of dispersion liquid used for composition | Storage stability | Adhesiveness | Color mixing |
|---|---|---|---|---|
| Example 85 | Dispersion liquid-85 | C | B | C |
| Example 86 | Dispersion liquid-86 | C | B | C |
| Example 87 | Dispersion liquid-87 | A | A | A |
| Example 88 | Dispersion liquid-88 | A | A | A |
| Example 89 | Dispersion liquid-89 | A | A | A |
| Example 90 | Dispersion liquid-90 | A | A | A |
| Example 91 | Dispersion liquid-91 | A | A | A |
| Example 92 | Dispersion liquid-92 | A | A | A |
| Example 93 | Dispersion liquid-93 | A | A | A |
| Example 94 | Dispersion liquid-94 | C | A | B |
| Example 95 | Dispersion liquid-95 | C | A | B |
| Example 96 | Dispersion liquid-96 | C | A | B |
| Example 97 | Dispersion liquid-97 | C | A | B |
| Example 98 | Dispersion liquid-98 | A | A | B |
| Example 99 | Dispersion liquid-99 | A | A | B |
| Example 100 | Dispersion liquid-100 | A | A | B |
| Example 101 | Dispersion liquid-101 | A | A | B |
| Example 102 | Dispersion liquid-102 | A | A | A |
| Example 103 | Dispersion liquid-103 | A | A | A |
| Example 104 | Dispersion liquid-104 | A | A | A |
| Example 105 | Dispersion liquid-105 | A | A | A |
| Example 106 | Dispersion liquid-106 | A | A | A |
| Example 107 | Dispersion liquid-107 | A | A | A |
| Example 108 | Dispersion liquid-108 | A | A | A |
| Example 109 | Dispersion liquid-109 | A | A | A |
| Example 110 | Dispersion liquid-110 | A | B | A |
| Example 111 | Dispersion liquid-111 | A | B | A |
| Example 112 | Dispersion liquid-112 | A | B | A |
| Example 113 | Dispersion liquid-113 | A | B | A |
| Example 114 | Dispersion liquid-114 | A | A | B |
| Example 115 | Dispersion liquid-115 | A | A | B |
| Example 116 | Dispersion liquid-116 | A | A | B |
| Example 117 | Dispersion liquid-117 | A | A | A |
| Example 118 | Dispersion liquid-118 | A | A | A |
| Example 119 | Dispersion liquid-119 | A | A | A |
| Example 120 | Dispersion liquid-120 | A | A | A |

TABLE 10

| | Type of dispersion liquid used for composition | Storage stability | Adhesiveness | Color mixing |
|---|---|---|---|---|
| Example 121 | Dispersion liquid-121 | A | A | A |
| Example 122 | Dispersion liquid-122 | A | A | A |
| Example 123 | Dispersion liquid-123 | A | A | B |
| Example 124 | Dispersion liquid-124 | A | A | A |
| Example 125 | Dispersion liquid-125 | A | A | A |
| Example 126 | Dispersion liquid-126 | A | C | C |
| Example 127 | Dispersion liquid-127 | A | A | A |
| Comparative Example 1 | Dispersion liquid-128 | B | D | D |

As shown in the above tables, the photosensitive compositions of Examples were excellent in evaluation of adhesiveness. In addition, in each Example, even in a case where a glass substrate was used as the support, excellent adhesiveness equivalent to that of each Example was obtained.

In addition, a 5 cm×5 cm glass substrate was coated with the photosensitive composition of Example 20, 30, 31, or 46 using a spin coater so that the film thickness after drying was 0.6 μm, and pre-baking was performed at 100° C. for 120 seconds to obtain a monochromatic color filter for evaluation of light resistance. A $SiO_2$ layer having a thickness of 100 nm was formed on this color filter by a chemical vapor deposition method. For the purpose of cutting off light of 380 nm or less, a sharp cut filter L38 manufactured by HOYA Corporation was placed on the obtained monochromatic color filter for evaluation of light resistance, and the obtained monochromatic color filter for evaluation of light resistance was irradiated with light of a xenon lamp at 100000 for 20 hours (equivalent to 2000000 lux h). The color difference (ΔE*ab value) of the monochromatic color filter before and after irradiation with xenon lamp was measured. The ΔE*ab value was 2.0, and this color filter was excellent in light resistance.

Regarding the dispersion liquids used in each Example, the same effects can be obtained even in a case of using two kinds of dispersants in combination within the range described in the present specification. Regarding the dispersion liquids used in each Example, the same effects can be obtained even in a case where the blending amount of the compound (1) and the blending amount of the dispersant are respectively changed within the ranges described in the present specification.

In addition, a 5 cm×5 cm glass substrate was coated with the photosensitive composition of Example 29, 32, 39, 52, 53, 54, 55, 56, 58, 87, 88, or 89 using a spin coater so that the film thickness after drying was 0.6 μm, and pre-baking was performed at 100° C. for 120 seconds to obtain a color filter for evaluation of color unevenness. The brightness distribution of the obtained color filter was analyzed by the following method, and the color unevenness was evaluated based on the number of pixels having deviation from the average of 8% or more. A method of measuring the brightness distribution will be described. The color filter for evaluation of color unevenness was installed between an observation lens and a light source of an optical microscope, and the light source irradiated light toward the observation lens. The transmitted light state was observed with an optical microscope MX-50 (manufactured by Olympus Corporation) equipped with a digital camera. The capturing of the surface of the color filter was performed for five arbitrarily selected regions. The brightness of the captured image (total number of pixels: 636416) was digitized and stored as a density distribution of 256 gradations from 0 to 255. The brightness distribution was analyzed from this image, and the color unevenness was evaluated based on the number of pixels (value of the roughness) having deviation from the average of more than 8%.

The evaluation standard is as follows.
A: value of the roughness was 3000 or less.
B: value of the roughness was more than 3000 and 6000 or less.

TABLE 11

| | Type of dispersion liquid used for composition | Color unevenness |
|---|---|---|
| Example 29 | Dispersion liquid-29 | A |
| Example 32 | Dispersion liquid-32 | B |
| Example 39 | Dispersion liquid-39 | B |
| Example 52 | Dispersion liquid-52 | A |
| Example 58 | Dispersion liquid-58 | B |
| Example 53 | Dispersion liquid-53 | A |
| Example 54 | Dispersion liquid-54 | A |
| Example 55 | Dispersion liquid-55 | A |
| Example 56 | Dispersion liquid-56 | A |
| Example 87 | Dispersion liquid-87 | A |
| Example 88 | Dispersion liquid-88 | A |
| Example 89 | Dispersion liquid-89 | A |

As shown in the above tables, Examples 29, 52, 53, 54, 55, 56, 87, 88, and 89 were excellent in evaluation of color unevenness.

Examples 128 to 143 and Comparative Example 2

The following raw materials were mixed to prepare a photosensitive composition.
Dispersion liquid . . . parts by mass described in the following table
Resin . . . parts by mass described in the following table
Polymerizable compound . . . parts by mass described in the following table
Photopolymerization initiator . . . parts by mass described in the following table
Surfactant H1 . . . 4.17 parts by mass
p-methoxyphenol . . . 0.0006 parts by mass
Solvent . . . parts by mass described in the following table

TABLE 12

| | | Dispersion liquid | | Resin | | Polymerizable compound | | Photopolymerization initiator | | Solvent | |
|---|---|---|---|---|---|---|---|---|---|---|---|
| | | Type | Parts by mass | Type | Parts by mass | Type | Parts by mass | Type | Parts by mass | Type | Parts by mass |
| Example | 128 | Dispersion liquid-32 | 19.7 | D1 | 0.58 | E1 | 0.54 | F3 | 0.33 | PGMEA | 7.66 |
| | | Dispersion liquid-102 | 19.7 | | | | | | | | |
| | 129 | Dispersion liquid-32 | 19.7 | D1 | 0.58 | E1 | 0.54 | F3 | 0.33 | PGMEA | 7.66 |
| | | Dispersion liquid-104 | 19.7 | | | | | | | | |
| | 130 | Dispersion liquid-32 | 19.7 | D1 | 0.58 | E1 | 0.54 | F3 | 0.33 | PGMEA | 7.66 |
| | | Dispersion liquid-105 | 19.7 | | | | | | | | |
| | 131 | Dispersion liquid-32 | 39.4 | D2 | 0.58 | E1 | 0.54 | F3 | 0.33 | PGMEA | 7.66 |
| | 132 | Dispersion liquid-32 | 39.4 | D1 | 0.29 | E1 | 0.54 | F3 | 0.33 | PGMEA | 7.66 |
| | | | | D2 | 0.29 | | | | | | |
| | 133 | Dispersion liquid-32 | 39.4 | D1 | 0.58 | E2 | 0.54 | F3 | 0.33 | PGMEA | 7.66 |
| | 134 | Dispersion liquid-32 | 39.4 | D1 | 0.58 | E3 | 0.54 | F3 | 0.33 | PGMEA | 7.66 |

TABLE 12-continued

| | | Dispersion liquid | | Resin | | Polymerizable compound | | Photopolymerization initiator | | Solvent | |
|---|---|---|---|---|---|---|---|---|---|---|---|
| | | Type | Parts by mass | Type | Parts by mass | Type | Parts by mass | Type | Parts by mass | Type | Parts by mass |
| | 135 | Dispersion liquid-32 | 39.4 | D1 | 0.58 | E4 | 0.54 | F3 | 0.33 | PGMEA | 7.66 |
| | 136 | Dispersion liquid-32 | 39.4 | D1 | 0.58 | E5 | 0.54 | F3 | 0.33 | PGMEA | 7.66 |
| | 137 | Dispersion liquid-32 | 39.4 | D1 | 0.58 | E1 E2 | 0.27 0.27 | F3 | 0.33 | PGMEA | 7.66 |
| | 138 | Dispersion liquid-32 | 39.4 | D1 | 0.58 | E1 | 0.54 | F1 | 0.33 | PGMEA | 7.66 |
| | 139 | Dispersion liquid-32 | 39.4 | D1 | 0.58 | E1 | 0.54 | F2 | 0.33 | PGMEA | 7.66 |
| | 140 | Dispersion liquid-32 | 39.4 | D1 | 0.58 | E1 | 0.54 | F5 | 0.33 | PGMEA | 7.66 |
| | 141 | Dispersion liquid-32 | 39.4 | D1 | 0.58 | E1 | 0.54 | F1 F3 | 0.1 0.23 | PGMEA | 7.66 |
| | 142 | Dispersion liquid-32 | 39.4 | D1 | 0.58 | E1 | 0.54 | F3 F4 | 0.23 0.1 | PGMEA | 7.66 |
| | 143 | Dispersion liquid-32 | 39.4 | D1 | 0.58 | E1 | 0.54 | F3 | 0.33 | PGMEA Cyclohexanone | 3.83 3.83 |
| Comparative Example | 2 | Dispersion liquid-32 | 39.4 | D1 | 0.58 | E1 | 0.54 | F4 | 0.33 | PGMEA | 7.66 |

Among the materials described by the abbreviations in the above table, details other than the above-described materials are as follows.

[Resin]

D2: resin having the following structure. The numerical value described together with the main chain indicates a molar ratio. Mw=14000.

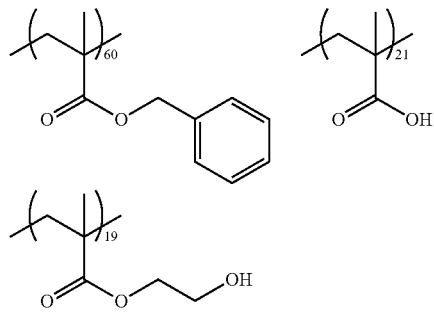

[Polymerizable Compound]

E2: ARONIX M-305 (manufactured by TOAGOSEI CO., LTD.)

E3: NK ESTER A-TMMT (manufactured by Shin-Nakamura Chemical Co., Ltd.)

E4: KAYARAD RP-1040 (manufactured by Nippon Kayaku Co., Ltd.)

E5: ARONIX TO-2349 (manufactured by TOAGOSEI CO., LTD.)

[Photopolymerization Initiator]

F1: compound having the following structure (oxime-based photopolymerization initiator)

F2: compound having the following structure (oxime-based photopolymerization initiator)

F4: compound having the following structure (alkylphenone-based photopolymerization initiator)

F5: compound having the following structure (oxime-based photopolymerization initiator)

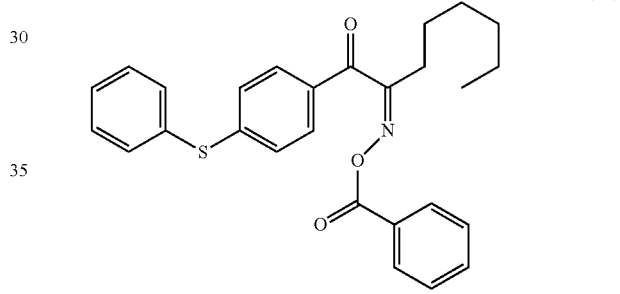

(F1)

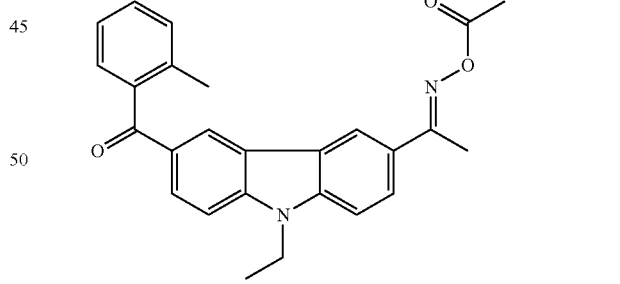

(F2)

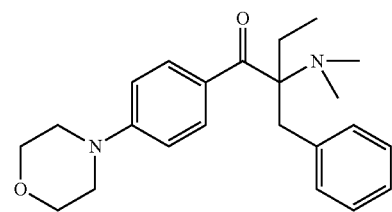

(F4)

(F5)

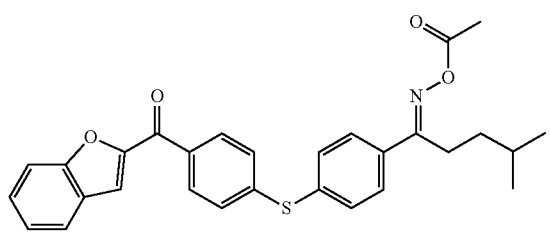

Regarding the obtained photosensitive compositions, the storage stability, adhesiveness, and color mixing were evaluated in the same manner as in Example 1. In the evaluation of color mixing, the colored pixel of first layer was formed using the photosensitive composition of Examples 128 to 143, or Comparative Example 2, and the colored pixel of second layer was formed using the photosensitive composition of Example 144.

TABLE 13

|  |  | Storage stability | Adhesiveness | Color mixing |
|---|---|---|---|---|
| Example | 128 | A | A | A |
|  | 129 | A | A | A |
|  | 130 | A | A | A |
|  | 131 | A | A | A |
|  | 132 | A | A | A |
|  | 133 | A | A | A |
|  | 134 | A | A | A |
|  | 135 | A | A | A |
|  | 136 | A | A | A |
|  | 137 | A | A | A |
|  | 138 | A | A | A |
|  | 139 | A | A | A |
|  | 140 | A | A | A |
|  | 141 | A | A | A |
|  | 142 | A | B | A |
|  | 143 | A | A | A |
| Comparative Example | 2 | A | C | C |

As shown in the above tables, the photosensitive compositions of Examples were excellent in evaluation of adhesiveness. Regarding the dispersion liquids used in each Example, the same effects can be obtained even in a case of using two kinds of dispersants in combination within the range described in the present specification. Regarding the dispersion liquids used in each Example, the same effects can be obtained even in a case where the blending amount of the compound (1) and the blending amount of the dispersant are respectively changed within the ranges described in the present specification.

Example 144

A photosensitive composition was prepared in the same manner as in Example 32, except that the following dispersion liquid 144 was used. Regarding the obtained photosensitive compositions, the storage stability, adhesiveness, and color mixing were evaluated in the same manner as in Example 32. In each evaluation, the same results as in Example 32 were obtained. In the evaluation of color mixing, the colored pixel of first layer was formed using the photosensitive composition of Example 144, and the colored pixel of second layer was formed using the photosensitive composition of Example 145.

Dispersion liquid 144: dispersion liquid prepared by the following method 230 parts by mass of zirconia beads having a diameter of 0.3 mm were added to a mixed solution obtained by mixing 10.5 parts by mass of C. I. Pigment Red 254, 4.5 parts by mass of C. I. Pigment Yellow 139, 2.0 parts by mass of the compound C-36 as a derivative, 5.5 parts by mass of the dispersant P-1, and 77.5 parts by mass of PGMEA, the mixture was subjected to a dispersion treatment for 3 hours using a paint shaker, and the beads were separated by filtration to prepare a dispersion liquid.

Example 145

A photosensitive composition was prepared in the same manner as in Example 32, except that the following dispersion liquid 145 was used. Regarding the obtained photosensitive compositions, the storage stability, adhesiveness, and color mixing were evaluated in the same manner as in Example 32. In each evaluation, the same results as in Example 32 were obtained.

In the evaluation of color mixing, the colored pixel of first layer was formed using the photosensitive composition of Example 145, and the colored pixel of second layer was formed using the photosensitive composition of Example 144.

Dispersion liquid 145: pigment dispersion liquid prepared by the following method 230 parts by mass of zirconia beads having a diameter of 0.3 mm were added to a mixed solution obtained by mixing 12 parts by mass of C. I. Pigment Blue 15:6, 3 parts by mass of V dye 2 (acid value=7.4 mgKOH/g) described in paragraph No. 0292 of JP2015-041058A, 2.7 parts by mass of the compound C-36 as a derivative, 4.8 parts by mass of the dispersant P-1, and 77.5 parts by mass of PGMEA, the mixture was subjected to a dispersion treatment for 3 hours using a paint shaker, and the beads were separated by filtration to prepare a dispersion liquid.

Example 301

A silicon wafer was coated with a Green composition using a spin coating method so that the film thickness after post-baking was 1.0 μm. Next, the silicon wafer was heated using a hot plate at 100° C. for 2 minutes. Next, using an i-ray stepper exposure device FPA-3000 i5+(manufactured by Canon Corporation), exposure was performed with light having a wavelength of 365 nm and an exposure dose of 1000 mJ/cm$^2$ through a mask having a dot pattern of 2 μm square. Next, puddle development was performed at 23° C. for 60 seconds using a 0.3% by mass of tetramethylammonium hydroxide (TMAH) aqueous solution. Next, the coating film was rinsed by spin showering and was cleaned with pure water. Next, the Green composition was patterned by heating (post-baking) at 200° C. for 5 minutes using a hot plate. Likewise, a Red composition and a Blue composition were sequentially patterned to form red, green, and blue colored patterns (Bayer pattern).

As the Green composition, the photosensitive composition of Example 32 was used.

The Red composition and the Blue composition will be described later.

The Bayer pattern refers to a pattern, as disclosed in the specification of U.S. Pat. No. 3,971,065A, in which a 2×2 array of color filter element having one Red element, two Green elements, and one Blue element is repeated.

The obtained color filter was incorporated into a solid-state imaging element according to a known method. The solid-state imaging element had a suitable image recognition ability.

—Red Composition—

The following components were mixed and stirred, and the obtained mixture was filtered through a nylon filter (manufactured by Pall Corporation) having a pore size of 0.45 μm to prepare a Red composition.

Red pigment dispersion liquid: 51.7 parts by mass
40% by mass PGMEA solution of resin DL: 0.6 parts by mass
Polymerizable compound E6: 0.6 parts by mass
Photopolymerization initiator FL: 0.3 parts by mass

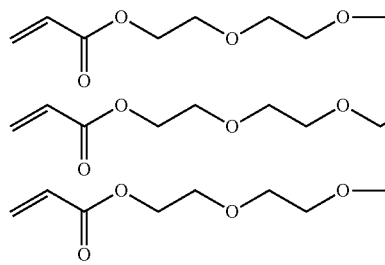
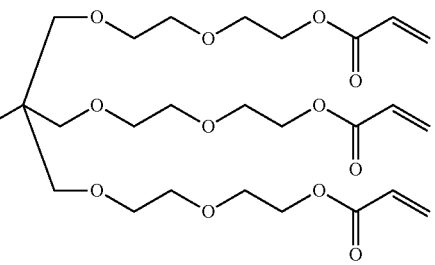

Surfactant H: 4.2 parts by mass
PGMEA: 42.6 parts by mass

—Blue Composition—

The following components were mixed and stirred, and the obtained mixture was filtered through a nylon filter (manufactured by Pall Corporation) having a pore size of 0.45 μm to prepare a Blue composition.

Blue pigment dispersion liquid: 44.9 parts by mass
40% by mass PGMEA solution of resin DL: 2.1 parts by mass
Polymerizable compound E1: 1.5 parts by mass
Polymerizable compound E6: 0.7 parts by mass
Photopolymerization initiator FL: 0.8 parts by mass
Surfactant HL: 4.2 parts by mass
PGMEA: 45.8 parts by mass The raw materials used for the Red composition and the Blue composition are as follows.

Red Pigment Dispersion Liquid

A mixed solution consisting of 9.6 parts by mass of C. I. Pigment Red 254, 4.3 parts by mass of C. I. Pigment Yellow 139, 6.8 parts by mass of a dispersant (Disperbyk-161, manufactured by BYK Chemie), and 79.3 parts by mass of PGMEA was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersion treatment was repeated 10 times, thereby obtaining a Red pigment dispersion liquid.

Blue Pigment Dispersion Liquid 9.7 parts by mass of C. I. Pigment Blue 15:6, 2.4 parts by mass of C. I. Pigment Violet 23, 5.5 parts by mass of a dispersant (Disperbyk-161, manufactured by BYK Chemie), 82.4 parts by mass of PGMEA were mixed with each other to obtain a mixed solution, and the mixed solution was mixed and dispersed using a beads mill (zirconia beads; diameter: 0.3 mm) for 3 hours. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm³ at a flow rate of 500 g/min. This dispersion treatment was repeated 10 times, thereby obtaining a Blue pigment dispersion liquid.

Resin D1, polymerizable compound E1, photopolymerization initiator F1, and surfactant H1: above-described materials Polymerizable compound E6: compound having the following structure

What is claimed is:

1. A photosensitive composition comprising:
   a pigment;
   a compound which is a compound represented by Formula (1) and has 3000 L·mol$^{-1}$·cm$^{-1}$ or less of a maximum value of a molar light absorption coefficient in a wavelength range of 400 to 700 nm;
   a polymerizable compound; and
   an oxime-based photopolymerization initiator, $$A^1\text{-}L^1\text{-}Z^1 \quad (1)$$

in Formula (1), $A^1$ represents a group represented by Formula (A1),
$L^1$ represents a group represented by Formula (L1), and
$Z^1$ represents a group represented by Formula (Z1),

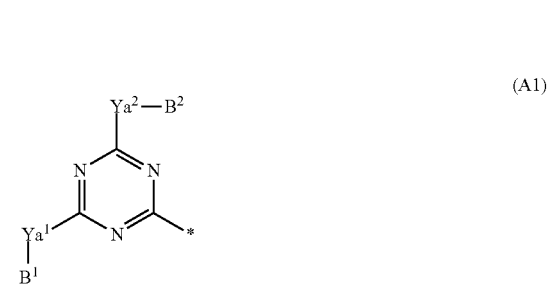

(A1)

in Formula (A1), * represents a bonding hand,
$Ya^1$ and $Ya^2$ each independently represent —N(Ra$^1$)— or —O—, in which Ra$^1$ represents a hydrogen atom, an alkyl group, an alkenyl group, an alkynyl group, or an aryl group, and $B^1$ and $B^2$ each independently represent a hydrogen atom or a substituent;

$$-L^{1A}-L^{1B}-L^{1C}- \tag{L1}$$

in Formula (L1), $L^{1A}$ and $L^{1C}$ each independently represent —O—, —N($R^{L1}$)—, —NHCO—, —CONH—, —OCO—, —COO—, —CO—, —SO$_2$NH—, or —SO$_2$—, $R^{L1}$ represents hydrogen, an alkyl group, an alkenyl group, an alkynyl group, or an aryl group, and $L^{1B}$ represents divalent linking group;

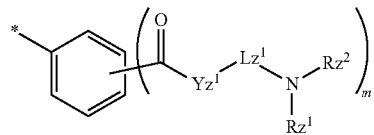
(Z1)

in Formula (Z1), * represents a bonding hand, $Yz^1$ represents —N($Ry^1$)— or —O—, in which $Ry^1$ represents a hydrogen atom, an alkyl group, an alkenyl group, an alkynyl group, or an aryl group, $Lz^1$ represents a divalent linking group, $Rz^1$ and $Rz^2$ each independently represent a hydrogen atom, an alkyl group, an alkenyl group, an alkynyl group, or an aryl group, in which $Rz^1$ and $Rz^2$ may be bonded to each other through a divalent group to form a ring, and m represents an integer of 1 to 5.

2. The photosensitive composition according to claim 1, wherein the compound represented by Formula (1) has 1000 L·mol$^{-1}$ cm$^{-1}$ or less of a maximum value of the molar light absorption coefficient in the wavelength range of 400 to 700 nm.

3. The photosensitive composition according to claim 1, wherein the group represented by Formula (Z1) is a group represented by Formula (Z2),

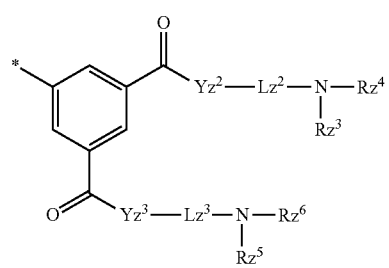
(Z2)

in the formula, * represents a bonding hand, $Yz^2$ and $Yz^3$ each independently represent —N($Ry^2$)— or —O—, in which $Ry^2$ represents a hydrogen atom, an alkyl group, an alkenyl group, an alkynyl group, or an aryl group, $Lz^2$ and $Lz^3$ each independently represent a divalent linking group, and $Rz^3$ to $Rz^6$ each independently represent a hydrogen atom, an alkyl group, an alkenyl group, an alkynyl group, or an aryl group, and $Rz^3$ and $Rz^4$, and $Rz^5$ and $Rz^6$ may be respectively bonded to each other through a divalent group to form a ring.

4. The photosensitive composition according to claim 1, wherein the pigment is a chromatic pigment.

5. The photosensitive composition according to claim 1, wherein the pigment is at least one selected from a red pigment, a yellow pigment, a green pigment, and a blue pigment.

6. The photosensitive composition according to claim 1, further comprising:
a resin having an acid group.

7. A film obtained from the photosensitive composition according to claim 1.

8. A color filter obtained from the photosensitive composition according to claim 1.

9. A solid-state imaging element comprising the film according to claim 7.

10. An image display device comprising the film according to claim 7.

11. The photosensitive composition according to claim 1, wherein in Formula (A1), $B^1$ and $B^2$ each independently represent an aryl group.

* * * * *